United States Patent
Teggatz et al.

(10) Patent No.: US 12,413,155 B2
(45) Date of Patent: Sep. 9, 2025

(54) CIRCUITS AND METHOD FOR CONTROLLING A SYNCHRONOUS RECTIFIER

(71) Applicant: Retela Leasing, LLC, The Colony, TX (US)

(72) Inventors: Ross Teggatz, The Colony, TX (US); Daniel Ruiz, Addison, TX (US)

(73) Assignee: Retela Leasing, LLC, The Colony, TX (US)

( * ) Notice: Subject to any disclaimer, the term of this patent is extended or adjusted under 35 U.S.C. 154(b) by 0 days.

(21) Appl. No.: 18/812,694

(22) Filed: Aug. 22, 2024

(65) Prior Publication Data

US 2024/0413761 A1 Dec. 12, 2024

Related U.S. Application Data

(63) Continuation-in-part of application No. 17/735,208, filed on May 3, 2022.
(Continued)

(51) Int. Cl.
*H02M 1/08* (2006.01)
*H02M 1/00* (2006.01)
(Continued)

(52) U.S. Cl.
CPC ..... *H02M 3/33592* (2013.01); *H02M 1/0051* (2021.05); *H02M 1/08* (2013.01);
(Continued)

(58) Field of Classification Search
CPC ........ H02M 1/32; H02M 1/08; H02M 1/0051; H02M 3/158
See application file for complete search history.

(56) References Cited

U.S. PATENT DOCUMENTS

| 6,107,844 A | 8/2000 | Berg et al. |
| 10,886,853 B1 * | 1/2021 | Xu .......................... H02M 1/08 |

(Continued)

FOREIGN PATENT DOCUMENTS

| CN | 111404526 A | 7/2020 |
| JP | 2005328668 A | 11/2005 |
| WO | 2006013540 A2 | 2/2006 |

OTHER PUBLICATIONS

R. Elferich and T. Lopez, "Impact of gate voltage bias on reverse recovery losses of power MOSFETs," Twenty-First Annual IEEE Applied Power Electronics Conference and Exposition, 2006. APEC '06., Dallas, TX, USA, 2006, pp. 13890-1395 (Year: 2006).*

(Continued)

*Primary Examiner* — Jue Zhang
*Assistant Examiner* — Jye-June Lee
(74) *Attorney, Agent, or Firm* — Daniel J. Chalker; Edwin S. Flores; Chalker Flores, LLP

(57) ABSTRACT

A method and circuit controls a synchronous rectifier. The synchronous rectifier is turned OFF by driving a gate of the synchronous rectifier to one or more first voltages that are non-zero. One or more values of the drain or the source of the synchronous rectifier are monitored. The gate of the synchronous rectifier is driven to a second voltage that is less than the one or more first voltages whenever the one or more values of the drain or the source of the synchronous rectifier pass above or below one or more threshold values.

28 Claims, 34 Drawing Sheets

Related U.S. Application Data

(60) Provisional application No. 63/183,286, filed on May 3, 2021.

(51) Int. Cl.
*H02M 3/335* (2006.01)
*H03K 17/16* (2006.01)

(52) U.S. Cl.
CPC ... *H03K 17/165* (2013.01); *H03K 2217/0063* (2013.01); *H03K 2217/0072* (2013.01); *H03K 2217/0081* (2013.01)

(56) References Cited

U.S. PATENT DOCUMENTS

| | | |
|---|---|---|
| 2001/0019278 A1 | 9/2001 | Sudo et al. |
| 2008/0084197 A1 | 4/2008 | Williams et al. |
| 2008/0094124 A1 | 4/2008 | Happenstall et al. |
| 2010/0271117 A1 | 10/2010 | Chou |
| 2012/0087167 A1 | 4/2012 | Kuzumaki et al. |
| 2015/0171855 A1 | 6/2015 | Braun |
| 2017/0207782 A1 | 7/2017 | Takazawa |
| 2019/0140630 A1* | 5/2019 | Chen ............... H03K 17/163 |
| 2019/0260368 A1 | 8/2019 | Vytla et al. |
| 2021/0058001 A1* | 2/2021 | Dou ............... H02M 3/1588 |
| 2021/0091668 A1 | 3/2021 | Buhari et al. |
| 2022/0352812 A1 | 11/2022 | Teggatz |

OTHER PUBLICATIONS

Hoang, Ngan K., Sang-Gug Lee and Young-Jin Woo. "A zero current detector with low negative inductor current using forced freewheel switch operation in synchronous DC-DC converter," 2014 IEEE Fifth International Conference on Communications and Electronics (ICCE), 2014, pp. 318-322. (Year: 2014).*

International Search Report and Written Opinion from the USPTO for PCT/US2022/27377 dated Aug. 16, 2022, 18 pp.

Elferich, R., et al., "Impact of gate voltage bias on reverse recovery losses of power MOSFETs," Twenty-First Annual IEEE Applied Power Electronics Conference and Exposition, 2006, APEC 2006, Dallas, TX, USA, pp. 1390-1395.

European Search Report of European Patent Application No. 22799393.8 dated Feb. 28, 2025, 10 pp.

\* cited by examiner

No Qrr:
I2 x Rdson < Vf
Partial Qrr:
I2 x Rdson less than Vf

CIRCUITS AND METHOD FOR CONTROLLING A SYNCHRONOUS RECTIFIER

CROSS-REFERENCE TO RELATED APPLICATIONS

This application is a continuation-in-part application of U.S. patent application Ser. No. 17/735,208 filed on May 3, 2022, which claims priority to U.S. Provisional Application No. 63/183,286 filed on May 3, 2021, the contents of each of which are incorporated by reference herein.

STATEMENT OF FEDERALLY FUNDED RESEARCH

Not applicable.

TECHNICAL FIELD OF THE INVENTION

The present invention relates in general to power switching applications. In particular, the present invention relates to reducing or eliminating current and voltage transients and the negative effects of current and voltage transients in power switching applications.

BACKGROUND OF THE INVENTION

Reverse recovery charge is a challenge in all power switching applications, for example, motor control, solenoid control, or power management. Reverse recovery charge is stored at the junction of the body diode of a switch in a power switching application when the body diode is being forward biased. This charge increases as the forward bias current increases. Ideally, when a forward biased diode is suddenly put into reverse bias there will be no current flow in the reverse bias. However, with reverse recovery charged stored, when the forward biased diode is suddenly put into the reverse bias there will be a reverse current flow which will be a function of the charge that was stored when operating in the forward bias. The current and voltage transients caused by this reverse recovery charge cause a number of problems in power switching applications.

SUMMARY OF THE INVENTION

The following embodiments reduce or eliminate current or voltage transients in the switching circuit by actively monitoring the SW pin located between the switching transistor and the synchronous rectifier. The circuits use closed loop feedback to control level transistion(s) for the synchronous rectifier gate. The active feedback may include a voltage, a rate of change of voltage, a current, a rate of change of current or a combination thereof, all at the SW pin. The circuit does not require, but may use, signals from or monitoring of the switching transistor. Moreover, the circuit does not require, but may include, a time delay circuit. As a result, the circuits and methods described herein reduce current losses from break before make, gate to drain capacitance, reverse recovery charge (Qrr) and gate bounce. The methods and circuits also help prevent ringing.

In one embodiment of the present disclosure, a method for controlling a synchronous rectifier is provided. The synchronous rectifier is turned OFF by driving a gate of the synchronous rectifier to one or more first voltages that are non-zero. One or more values of a drain or a source of the synchronous rectifier are monitored. The gate of the synchronous rectifier is driven to a second voltage that is less than the one or more first voltages whenever the one or more values of the drain or the source of the synchronous rectifier pass above or below one or more threshold values. In one aspect, a switching circuit includes the synchronous rectifier connected to a switching transistor, and the method further includes reducing or eliminating current or voltage transients in the switching circuit. In another aspect, the method further includes selecting the one or more first voltages or the second voltage. In another aspect, the one or more first voltages are less than a threshold voltage of the synchronous rectifier. In another aspect, the one or more first voltages include a set of descending stair-step values, or a set of descending values forming a ramp or a curve. In another aspect, the one or more values can be a voltage, a change in the voltage, a current, a change in the current, or a combination of the voltage, the change in the voltage, the current or the change in the current of the drain or the source of the synchronous rectifier. In another aspect, the method further includes adjusting the one or more threshold values or a delay in driving the gate of the synchronous rectifier to the second voltage using a predictive feedback process. In another aspect, the predictive feedback process samples and stores the one or more values of the gate, the drain or the source of the synchronous rectifier, and uses the stored values of the gate, the drain or the source of the synchronous rectifier to adjust the one or more threshold values. In another aspect, the predictive feedback process samples and stores the one or more values of the gate, the drain or the source of the synchronous rectifier and a switching transistor connected to the synchronous rectifier, and uses the stored values of the gate, the drain or the source of the synchronous rectifier and the switching transistor to adjust the one or more threshold values. In another aspect, the predictive feedback process samples and stores the one or more values of the gate, the drain or the source of the synchronous rectifier, and uses the stored values of the gate, the drain or the source of the synchronous rectifier to adjust the delay in driving the gate of the synchronous rectifier to the second voltage. In another aspect, the predictive feedback process samples and stores the one or more values of the gate, the drain or the source of the synchronous rectifier and a switching transistor connected to the synchronous rectifier, and uses the stored values of the gate, the drain or the source of the synchronous rectifier and the switching transistor to adjust the delay in driving the gate of the synchronous rectifier to the second voltage. In another aspect, the second voltage is equal to zero volts. In another aspect, the second voltage is less than zero volts. In another aspect, a gate of a switching transistor connected to the synchronous rectifier is not monitored or used to control the gate of the synchronous rectifier.

In another aspect, the synchronous rectifier is controlled using a synchronous rectifier driver circuit including: a driver circuit connected to the gate of the synchronous rectifier; a parallel clamping circuit connected to the gate of the synchronous rectifier; a monitoring circuit connected to the drain or the source of the synchronous rectifier and the parallel clamping circuit; and a control circuit connected to the driver circuit and the monitoring circuit. In another aspect, the synchronous rectifier driver circuit includes or does not include a time delay circuit. In another aspect, the driver circuit includes: a first transistor having a gate connected to the control circuit and a drain connected to the gate of the synchronous rectifier; a second transistor having a drain connected to the gate of the synchronous rectifier and a gate connected to the control circuit; a one-way current switch connected to a source of the second transistor. In another aspect, the parallel clamping circuit includes a third transistor having a drain connected to the gate of the synchronous rectifier, a gate connected to the monitoring circuit and a source connected to a reference ground. In another aspect, the monitoring circuit includes: a fourth transistor having a drain connected to the drain or the source of the synchronous rectifier, a gate connected to the control circuit, and a source connected to the parallel clamping circuit; and a fifth transistor having a drain connected to the parallel clamping circuit and a gate connected to the control circuit. In another aspect, the control circuit is further connected to a modulation signal. In another aspect, the driver circuit, the parallel clamping circuit, the monitoring circuit and the control circuit are formed in or on silicon, silicon carbide, gallium nitride, gallium oxide, or gallium arsenide.

In another aspect, the synchronous rectifier is controlled using a synchronous rectifier driver circuit including: a first transistor having a drain connected to the gate of the synchronous rectifier; a second transistor having a drain connected to the gate of the synchronous rectifier; a one-way current switch connected between a source of the second transistor and a reference ground; a third transistor having a drain connected to the gate of the synchronous rectifier and a source connected to the reference ground; a fourth transistor having a drain connected to the drain or the source of the synchronous rectifier and a source connected to a gate of the third transistor; a fifth transistor having a drain connected to the gate of the third transistor and a source connected to the reference ground; and a control circuit connected to a gate of the first transistor, a gate of the second transistor, a gate of the fourth transistor and a gate of the fifth transistor. In another aspect, the synchronous rectifier driver circuit drives the gate of the synchronous rectifier to the one or more first voltages by: turning the first transistor from ON to OFF; turning the second transistor from OFF to ON; turning the fourth transistor from OFF to ON; and turning the fifth transistor from ON to OFF. In another aspect, the synchronous rectifier driver circuit drives the gate of the synchronous rectifier to the second voltage by turning the third transistor from OFF to ON. In another aspect, the synchronous rectifier driver circuit includes or does not include a time delay circuit. In another aspect, the control circuit is further connected to a modulation signal. In another aspect, the first transistor, the second transistor, the one-way current switch, the third transistor, the fourth transistor, the fifth transistor and the control circuit are formed in or on silicon, silicon carbide, gallium nitride, gallium oxide, or gallium arsenide.

In another aspect, the synchronous rectifier is controlled using a synchronous rectifier driver circuit including: a first transistor having a drain connected to the gate of the synchronous rectifier; a second transistor having a drain connected to the gate of the synchronous rectifier and a body connected to a reference ground; a third transistor having a drain connected to a source of the second transistor, and a body and a drain connected to the reference ground; a fourth transistor having a drain connected to the gate of the synchronous rectifier, a gate connected to a source of the second transistor and a source connected to the reference ground; a fifth transistor having a drain connected to the gate of the synchronous rectifier and a source connected to the reference ground; a sixth transistor having a body diode, a drain connected to the drain or the source of the synchronous rectifier and a source connected to the gate of the fifth transistor; a seventh transistor having a drain connected to the gate of the fifth transistor and a source connected to the reference ground; an inverter having an output connected to the gates of the first transistor, the second transistor and the sixth transistor; and a control signal connected to an input of the inverter and the gates of the third transistor and seventh transistor.

In another aspect, the synchronous rectifier is controlled using a synchronous rectifier driver circuit including: a first transistor having a drain connected to the gate of the synchronous rectifier; a second transistor having a drain connected to the gate of the synchronous rectifier; a one-way current switch connecting a source of the second transistor to a reference ground; a third transistor having a drain connected to the gate of the synchronous rectifier and a source connected to the reference ground; a fourth transistor having a body diode and a drain connected to the drain or the source of the synchronous rectifier; an amplifier having a positive terminal connected to the source of the fourth transistor, a negative terminal connected to a voltage, and an output connected to the gate of the third transistor; a fifth transistor having a drain connected to the gate of the third transistor and a source connected to the reference ground; an inverter having an output connected to the gates of the first transistor, the second transistor, an enable terminal of the amplifier and the fourth transistor; and a control signal connected to an input of the inverter and the gate of the fifth transistor.

In another aspect, the synchronous rectifier is controlled using a synchronous rectifier driver circuit including: a first transistor having a drain connected to the gate of the synchronous rectifier; a second transistor having a drain connected to the gate of the synchronous rectifier; a first one-way current switch connected to a source of the second transistor; a fourth transistor having a drain connected to the gate of the synchronous rectifier, a gate connected to the first one-way current switch and a source connected to a reference ground; a second one-way current switch connected between a voltage and the gate of the fourth transistor; a fifth transistor having a drain connected to the gate of the fourth transistor and a source connected to the reference ground; a sixth transistor having a drain connected to the gate of the synchronous rectifier and a source connected to the reference ground; a seventh transistor having a body diode and a drain connected to the drain or the source of the synchronous rectifier; an inverter having an output connected to the gates of the first transistor, the second transistor and the seventh transistor; and a control signal connected to an input of the inverter and the gate of the fifth transistor, the gate of the sixth transistor and the source of the seventh transistor.

In another aspect, the synchronous rectifier is controlled using a synchronous rectifier driver circuit including: a first transistor having a drain connected to the gate of the synchronous rectifier; a second transistor having a drain connected to the gate of the synchronous rectifier; a one-way current switch connecting a source of the second transistor to a reference ground; a third transistor having a drain connected to the gate of the synchronous rectifier and a source connected to the reference ground; a fourth transistor having a body diode and a drain connected to the drain or the source of the synchronous rectifier; a fifth transistor having a drain connected to the gate of the third transistor and a source connected to the reference ground; aسixth transistor having a drain connected to the source of the first transistor, a gate connected to the source of the fourth transistor and a source connected to a gate of the third transistor; an inverter having an output connected to the gates of the first transistor, the second transistor, and the fourth transistor; and a control signal connected to an input of the inverter and the gate of the fifth transistor.

In another aspect, the synchronous rectifier is controlled using a synchronous rectifier driver circuit including: a first transistor having a drain connected to the gate of the synchronous rectifier; a second transistor having a drain connected to the gate of the synchronous rectifier; a one-way current switch connecting a source of the second transistor to a reference ground; a third transistor having a body diode, a drain connected to the gate of the synchronous rectifier and a source connected to the reference ground; a fourth transistor having a drain connected to the drain or the source of the synchronous rectifier and a source connected to the gate of the third transistor; a fifth transistor having a drain connected to the gate of the third transistor and a source connected to the reference ground; an inverter having an output connected to the gates of the first transistor, the second transistor, an enable terminal of the amplifier and the fourth transistor; and a control signal connected to an input of the inverter and the gate of the fifth transistor.

In one embodiment of the present disclosure, a circuit includes a synchronous rectifier driver circuit. The synchronous rectifier driver circuit is configured to: turn a synchronous rectifier OFF by driving a gate of the synchronous rectifier to one or more first voltages that are non-zero, monitor one or more values of a drain or a source of the synchronous rectifier, and drive the gate of the synchronous rectifier to a second voltage that is less than the one or more first voltages whenever the one or more values of the drain or the source of the synchronous rectifier pass above or below one or more threshold values.

In one aspect, the synchronous rectifier driver circuit reduces or eliminates current or voltage transients in a switching circuit including the synchronous rectifier connected to a switching transistor. In another aspect, the one or more first voltages are less than a threshold voltage of the synchronous rectifier. In another aspect, the one or more first voltages include a set of descending stair-step values, or a set of descending values forming a ramp or a curve. In another aspect, the one or more values can be a voltage, a change in the voltage, a current, a change in the current, or a combination of the voltage, the change in the voltage, the current or the change in the current of the drain or the source of the synchronous rectifier. In another aspect, the one or more threshold values or a delay in driving the gate of the synchronous rectifier to the second voltage are adjusted using a predictive feedback process. In another aspect, the predictive feedback process is configured to sample and store the one or more values of the gate, the drain or the source of the synchronous rectifier, and use the stored values of the gate, the drain or the source of the synchronous rectifier to adjust the one or more threshold values. In another aspect, the predictive feedback process is configured to sample and store the one or more values of the gate, the drain or the source of the synchronous rectifier and a switching transistor connected to the synchronous rectifier, and use the stored values of the gate, the drain or the source of the synchronous rectifier and the switching transistor to adjust the one or more threshold values. In another aspect, the predictive feedback process is configured to sample and store the one or more values of the gate, the drain or the source of the synchronous rectifier, and use the stored values of the gate, the drain or the source of the synchronous rectifier to adjust the delay in driving the gate of the synchronous rectifier to the second voltage. In another aspect, the predictive feedback process is configured to sample and store the one or more values of the gate, the drain or the source of the synchronous rectifier and a switching transistor connected to the synchronous rectifier, and use the stored values of the gate, the drain or the source of the synchronous rectifier and the switching transistor to adjust the delay in driving the gate of the synchronous rectifier to the second voltage. In another aspect, the second voltage is equal to zero volts. In another aspect, the second voltage is less than zero volts. In another aspect, a gate of a switching transistor connected to the synchronous rectifier is not monitored or used to control the gate of the synchronous rectifier.

In another aspect, the synchronous rectifier driver circuit includes: a driver circuit connected to the gate of the synchronous rectifier; a parallel clamping circuit connected to the gate of the synchronous rectifier; a monitoring circuit connected to the drain or the source of the synchronous rectifier and the parallel clamping circuit; and a control circuit connected to the driver circuit and the monitoring circuit. In another aspect, the synchronous rectifier driver circuit includes or does not include a time delay circuit. In another aspect, the driver circuit includes: a first transistor having a gate connected to the control circuit and a drain connected to the gate of the synchronous rectifier; a second transistor having a drain connected to the gate of the synchronous rectifier and a gate connected to the control circuit; a one-way current switch connected to a source of the second transistor. In another aspect, the parallel clamping circuit includes a third transistor having a drain connected to the gate of the synchronous rectifier, a gate connected to the monitoring circuit and a source connected to a reference ground. In another aspect, the monitoring circuit includes: a fourth transistor having a drain connected to the drain or the source of the synchronous rectifier, a gate connected to the control circuit, and a source connected to the parallel clamping circuit; and a fifth transistor having a drain connected to the parallel clamping circuit and a gate connected to the control circuit. In another aspect, the control circuit is further connected to a modulation signal. In another aspect, the driver circuit, the parallel clamping circuit, the monitoring circuit and the control circuit are formed in or on silicon, silicon carbide, gallium nitride, gallium oxide, or gallium arsenide.

In another aspect, the synchronous rectifier driver circuit includes: a first transistor having a drain connected to the gate of the synchronous rectifier; a second transistor having a drain connected to the gate of the synchronous rectifier; a one-way current switch connected between a source of the second transistor and a reference ground; a third transistor having a drain connected to the gate of the synchronous rectifier and a source connected to the reference ground; a fourth transistor having a drain connected to the drain or the source of the synchronous rectifier and a source connected to a gate of the third transistor; a fifth transistor having a drain connected to the gate of the third transistor and a source connected to the reference ground; and a control circuit connected to a gate of the first transistor, a gate of the second transistor, a gate of the fourth transistor and a gate of the fifth transistor. In another aspect, the synchronous rectifier driver circuit drives the gate of the synchronous rectifier to the one or more first voltages by: turning the first transistor from ON to OFF; turning the second transistor from OFF to ON; turning the fourth transistor from OFF to ON; and turning the fifth transistor from ON to OFF. In another aspect, the synchronous rectifier driver circuit drives the gate of the synchronous rectifier to the second voltage by turning the third transistor from OFF to ON. In another aspect, the synchronous rectifier driver circuit includes or does not include a time delay circuit. In another aspect, the control circuit is further connected to a modulation signal. In another aspect, the first transistor, the second transistor, the one-way current switch, the third transistor, the fourth transistor, the fifth transistor and the control circuit are formed in or on silicon, silicon carbide, gallium nitride, gallium oxide, or gallium arsenide.

In another aspect, the synchronous rectifier driver circuit includes: a first transistor having a drain connected to the gate of the synchronous rectifier; a second transistor having a drain connected to the gate of the synchronous rectifier and a body connected to a reference ground; a third transistor having a drain connected to a source of the second transistor, and a body and a drain connected to the reference ground; a fourth transistor having a drain connected to the gate of the synchronous rectifier, a gate connected to a source of the second transistor and a source connected to the reference ground; a fifth transistor having a drain connected to the gate of the synchronous rectifier and a source connected to the reference ground; a sixth transistor having a body diode, a drain connected to the drain or the source of the synchronous rectifier and a source connected to the gate of the fifth transistor; a seventh transistor having a drain connected to the gate of the fifth transistor and a source connected to the reference ground; an inverter having an output connected to the gates of the first transistor, the second transistor and the sixth transistor; and a control signal connected to an input of the inverter and the gates of the third transistor and seventh transistor.

In another aspect, the synchronous rectifier driver circuit includes: a first transistor having a drain connected to the gate of the synchronous rectifier; a second transistor having a drain connected to the gate of the synchronous rectifier; a one-way current switch connecting a source of the second transistor to a reference ground; a third transistor having a drain connected to the gate of the synchronous rectifier and a source connected to the reference ground; a fourth transistor having a drain connected to the drain or the source of the synchronous rectifier; a second one-way current switch connected from a source to the drain of the fourth transistor; an amplifier having a positive terminal connected to the source of the fourth transistor, a negative terminal connected to a voltage, and an output connected to the gate of the third transistor; a fifth transistor having a drain connected to the gate of the third transistor and a source connected to the reference ground; an inverter having an output connected to the gates of the first transistor, the second transistor, an enable terminal of the amplifier and the fourth transistor; and a control signal connected to an input of the inverter and the gate of the fifth transistor.

In another aspect, the synchronous rectifier driver circuit includes: a first transistor having a drain connected to the gate of the synchronous rectifier; a second transistor having a body diode and a drain connected to the gate of the synchronous rectifier; a fourth transistor having a body diode, a drain connected to the gate of the synchronous rectifier, a gate connected to the first one-way current switch and a source connected to a reference ground; a fifth transistor having a drain connected to the gate of the fourth transistor and a source connected to the reference ground; a sixth transistor having a drain connected to the gate of the synchronous rectifier and a source connected to the reference ground; a seventh transistor having a drain connected to the drain or the source of the synchronous rectifier; a third one-way current switch connected from a source to the drain of the seventh transistor; an inverter having an output connected to the gates of the first transistor, the second transistor and the seventh transistor; and a control signal connected to an input of the inverter and the gate of the fifth transistor, the gate of the sixth transistor and the source of the seventh transistor.

In another aspect, the synchronous rectifier driver circuit includes: a first transistor having a drain connected to the gate of the synchronous rectifier; a second transistor having a drain connected to the gate of the synchronous rectifier; a first one-way current switch connecting a source of the second transistor to a reference ground; a third transistor having a drain connected to the gate of the synchronous rectifier and a source connected to the reference ground; a fourth transistor having a body diode and a drain connected to the drain or the source of the synchronous rectifier; a fifth transistor having a drain connected to the gate of the third transistor and a source connected to the reference ground; a sixth transistor having a drain connected to the source of the first transistor, a gate connected to the source of the fourth transistor and a source connected to a gate of the third transistor; an inverter having an output connected to the gates of the first transistor, the second transistor, and the fourth transistor; and a control signal connected to an input of the inverter and the gate of the fifth transistor.

In another aspect, the synchronous rectifier is controlled using a synchronous rectifier driver circuit including: a first transistor having a drain connected to the gate of the synchronous rectifier; a second transistor having a drain connected to the gate of the synchronous rectifier; a one-way current switch connecting a source of the second transistor to a reference ground; a third transistor having a body diode, a drain connected to the gate of the synchronous rectifier and a source connected to the reference ground; a fourth transistor having a drain connected to the drain or the source of the synchronous rectifier and a source connected to the gate of the third transistor; a fifth transistor having a drain connected to the gate of the third transistor and a source connected to the reference ground; an inverter having an output connected to the gates of the first transistor, the second transistor, an enable terminal of the amplifier and the fourth transistor; and a control signal connected to an input of the inverter and the gate of the fifth transistor.

In one embodiment of the present disclosure, a power converter includes a switching transistor, a switching transistor driver circuit connected to a gate of the switching transistor, a synchronous rectifier connected the switching transistor, and a synchronous rectifier driver circuit connected to a gate of the synchronous rectifier and a drain or a source of the synchronous rectifier. The synchronous rectifier driver circuit is configured to: turn a synchronous rectifier OFF by driving a gate of the synchronous rectifier to one or more first voltages that are non-zero; monitor one or more values of a drain or a source of the synchronous rectifier; and drive the gate of the synchronous rectifier to a second voltage that is less than the one or more first voltages whenever the one or more values of the drain or the source of the synchronous rectifier pass above or below one or more threshold values.

In one aspect the synchronous rectifier driver circuit reduces or eliminates current or voltage transients in a switching circuit including the synchronous rectifier connected to a switching transistor. In another aspect, the one or more first voltages are less than a threshold voltage of the synchronous rectifier. In another aspect, one or more first voltages comprise a set of descending stair-step values, or a set of descending values forming a ramp or a curve. In another aspect, the one or more values can be a voltage, a change in the voltage, a current, a change in the current, or a combination of the voltage, the change in the voltage, the current or the change in the current of the drain or the source of the synchronous rectifier. In another aspect, the one or more threshold values or a delay in driving the gate of the synchronous rectifier to the second voltage are adjusted using a predictive feedback process. In another aspect, the predictive feedback process is configured to sample and store the one or more values of the gate, the drain or the source of the synchronous rectifier, and use the stored values of the gate, the drain or the source of the synchronous rectifier to adjust the one or more threshold values. In another aspect, the predictive feedback process is configured to sample and store the one or more values of the gate, the drain or the source of the synchronous rectifier and a switching transistor connected to the synchronous rectifier, and use the stored values of the gate, the drain or the source of the synchronous rectifier and the switching transistor to adjust the one or more threshold values. In another aspect, the predictive feedback process is configured to sample and store the one or more values of the gate, the drain or the source of the synchronous rectifier, and use the stored values of the gate, the drain or the source of the synchronous rectifier to adjust the delay in driving the gate of the synchronous rectifier to the second voltage. In another aspect, the predictive feedback process is configured to sample and store the one or more values of the gate, the drain or the source of the synchronous rectifier and a switching transistor connected to the synchronous rectifier, and use the stored values of the gate, the drain or the source of the synchronous rectifier and the switching transistor to adjust the delay in driving the gate of the synchronous rectifier to the second voltage. In another aspect, the second voltage is equal to zero volts. In another aspect, the second voltage is less than zero volts. In another aspect, a gate of a switching transistor connected to the synchronous rectifier is not monitored or used to control the gate of the synchronous rectifier.

In another aspect, the synchronous rectifier driver circuit includes: a driver circuit connected to the gate of the synchronous rectifier; a parallel clamping circuit connected to the gate of the synchronous rectifier; a monitoring circuit connected to the drain or the source of the synchronous rectifier and the parallel clamping circuit; and a control circuit connected to the driver circuit and the monitoring circuit. In another aspect, the synchronous rectifier driver circuit includes or does not include a time delay circuit. In another aspect, the driver circuit includes: a first transistor having a gate connected to the control circuit and a drain connected to the gate of the synchronous rectifier; a second transistor having a drain connected to the gate of the synchronous rectifier and a gate connected to the control circuit; a one-way current switch connected to a source of the second transistor. In another aspect, the parallel clamping circuit includes a third transistor having a drain connected to the gate of the synchronous rectifier, a gate connected to the monitoring circuit and a source connected to a reference ground. In another aspect, the monitoring circuit includes: a fourth transistor having a drain connected to the drain or the source of the synchronous rectifier, a gate connected to the control circuit, and a source connected to the parallel clamping circuit; and a fifth transistor having a drain connected to the parallel clamping circuit and a gate connected to the control circuit. In another aspect, the control circuit is further connected to a modulation signal. In another aspect, the driver circuit, the parallel clamping circuit, the monitoring circuit and the control circuit are formed in or on silicon, silicon carbide, gallium nitride, gallium oxide, or gallium arsenide.

In another aspect, the synchronous rectifier driver circuit includes: a first transistor having a drain connected to the gate of the synchronous rectifier; a second transistor having a body diode and a drain connected to the gate of the synchronous rectifier; a third transistor having a drain connected to the gate of the synchronous rectifier and a source connected to the reference ground; a fourth transistor having a drain connected to the drain or the source of the synchronous rectifier and a source connected to a gate of the third transistor; a fifth transistor having a drain connected to the gate of the third transistor and a source connected to the reference ground; and a control circuit connected to a gate of the first transistor, a gate of the second transistor, a gate of the fourth transistor and a gate of the fifth transistor. In another aspect, the synchronous rectifier driver circuit drives the gate of the synchronous rectifier to the one or more first voltages by: turning the first transistor from ON to OFF; turning the second transistor from OFF to ON; turning the fourth transistor from OFF to ON; and turning the fifth transistor from ON to OFF. In another aspect, the synchronous rectifier driver circuit drives the gate of the synchronous rectifier to the second voltage by turning the third transistor from OFF to ON. In another aspect, the synchronous rectifier driver circuit includes or does not include a time delay circuit. In another aspect, the control circuit is further connected to a modulation signal. In another aspect, the first transistor, the second transistor, the one-way current switch, the third transistor, the fourth transistor, the fifth transistor and the control circuit are formed in or on silicon, silicon carbide, gallium nitride, gallium oxide, or gallium arsenide.

In another aspect, the synchronous rectifier driver circuit includes: a first transistor having a drain connected to the gate of the synchronous rectifier; a second transistor having a drain connected to the gate of the synchronous rectifier and a body connected to a reference ground; a third transistor having a drain connected to a source of the second transistor, and a body and a drain connected to the reference ground; a fourth transistor having a drain connected to the gate of the synchronous rectifier, a gate connected to a source of the second transistor and a source connected to the reference ground; a fifth transistor having a drain connected to the gate of the synchronous rectifier and a source connected to the reference ground; a sixth transistor having a body diode, a drain connected to the drain or the source of the synchronous rectifier and a source connected to the gate of the fifth transistor; a seventh transistor having a drain connected to the gate of the fifth transistor and a source connected to the reference ground; an inverter having an output connected to the gates of the first transistor, the second transistor and the sixth transistor; and a control signal connected to an input of the inverter and the gates of the third transistor and seventh transistor.

In another aspect, the synchronous rectifier driver circuit includes: a first transistor having a drain connected to the gate of the synchronous rectifier; a second transistor having a body diode and a drain connected to the gate of the synchronous rectifier; a third transistor having a drain connected to the gate of the synchronous rectifier and a source connected to the reference ground; a fourth transistor having a body diode and a drain connected to the drain or the source of the synchronous rectifier; an amplifier having a positive terminal connected to the source of the fourth transistor, a negative terminal connected to a voltage, and an output connected to the gate of the third transistor; a fifth transistor having a drain connected to the gate of the third transistor and a source connected to the reference ground; an inverter having an output connected to the gates of the first transistor, the second transistor, an enable terminal of the amplifier and the fourth transistor; and a control signal connected to an input of the inverter and the gate of the fifth transistor.

In another aspect, the synchronous rectifier driver circuit includes: a first transistor having a drain connected to the gate of the synchronous rectifier; a second transistor having a body diode and a drain connected to the gate of the synchronous rectifier; a fourth transistor having a body diode, a drain connected to the gate of the synchronous rectifier, a gate connected to the first one-way current switch and a source connected to a reference ground; a fifth transistor having a drain connected to the gate of the fourth transistor and a source connected to the reference ground; a sixth transistor having a drain connected to the gate of the synchronous rectifier and a source connected to the reference ground; a seventh transistor having a body diode and a drain connected to the drain or the source of the synchronous rectifier; an inverter having an output connected to the gates of the first transistor, the second transistor and the seventh transistor; and a control signal connected to an input of the inverter and the gate of the fifth transistor, the gate of the sixth transistor and the source of the seventh transistor.

In another aspect, the synchronous rectifier driver circuit include: a first transistor having a drain connected to the gate of the synchronous rectifier; a second transistor having a body diode and a drain connected to the gate of the synchronous rectifier; a third transistor having a drain connected to the gate of the synchronous rectifier and a source connected to the reference ground; a fourth transistor having a body diode and a drain connected to the drain or the source of the synchronous rectifier; a fifth transistor having a drain connected to the gate of the third transistor and a source connected to the reference ground; a sixth transistor having a drain connected to the source of the first transistor, a gate connected to the source of the fourth transistor and a source connected to a gate of the third transistor; an inverter having an output connected to the gates of the first transistor, the second transistor, and the fourth transistor; and a control signal connected to an input of the inverter and the gate of the fifth transistor.

In another aspect, the synchronous rectifier is controlled using a synchronous rectifier driver circuit including: a first transistor having a drain connected to the gate of the synchronous rectifier; a second transistor having a drain connected to the gate of the synchronous rectifier; a one-way current switch connecting a source of the second transistor to a reference ground; a third transistor having a body diode, a drain connected to the gate of the synchronous rectifier and a source connected to the reference ground; a fourth transistor having a drain connected to the drain or the source of the synchronous rectifier and a source connected to the gate of the third transistor; a fifth transistor having a drain connected to the gate of the third transistor and a source connected to the reference ground; an inverter having an output connected to the gates of the first transistor, the second transistor, an enable terminal of the amplifier and the fourth transistor; and a control signal connected to an input of the inverter and the gate of the fifth transistor.

BRIEF DESCRIPTION OF THE DRAWINGS

For a more complete understanding of the features and advantages of the present invention, reference is now made to the detailed description of the invention along with the accompanying figures, in which.

DETAILED DESCRIPTION OF THE INVENTION

Illustrative embodiments of the system of the present application are described below. In the interest of clarity, not all features of an actual implementation are described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

In the specification, reference may be made to the spatial relationships between various components and to the spatial orientation of various aspects of components as the devices are depicted in the attached drawings. However, as will be recognized by those skilled in the art after a complete reading of the present application, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

Figure 1A:
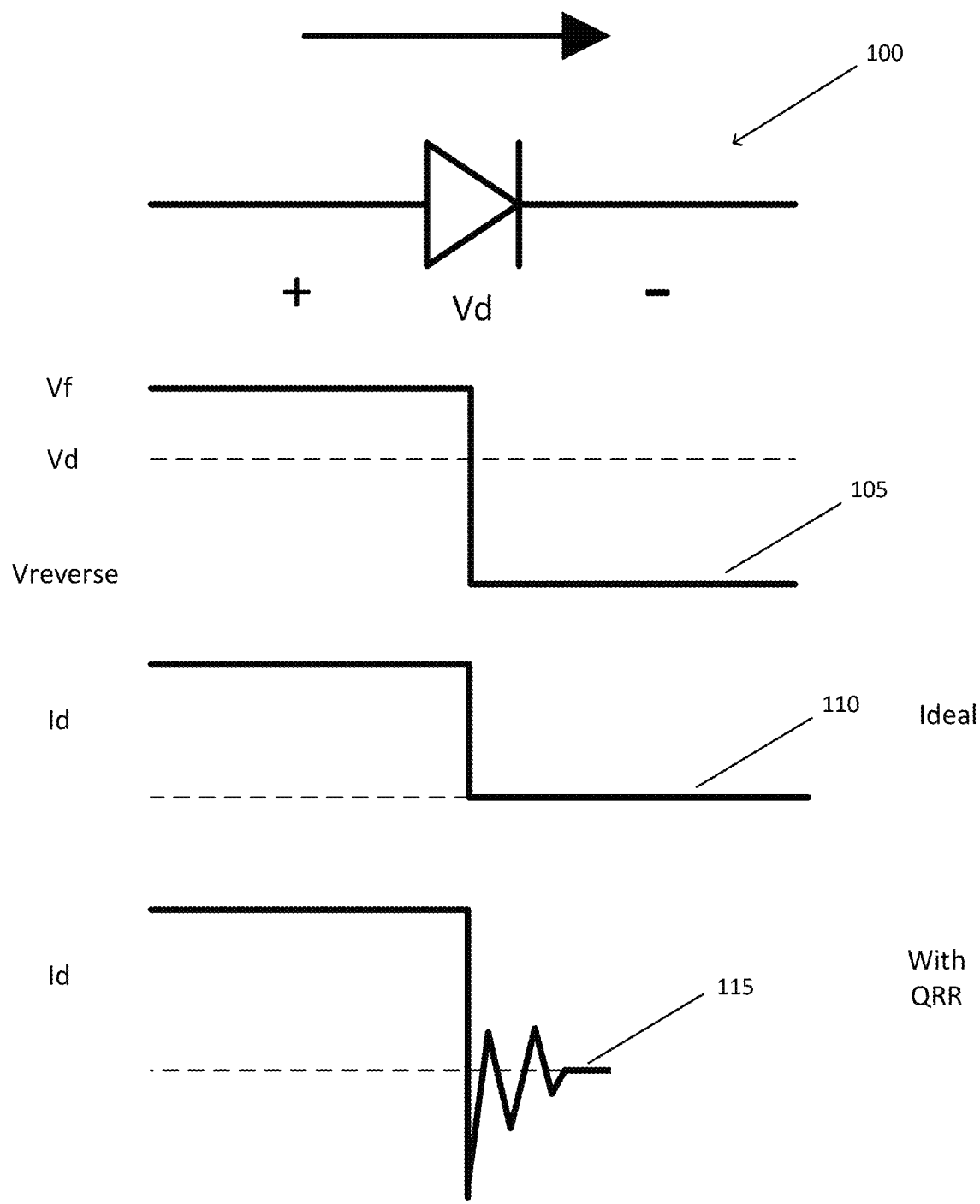
FIG. 1A shows a diode and the behavior over time of voltage and current in the diode.
Figure 1B:
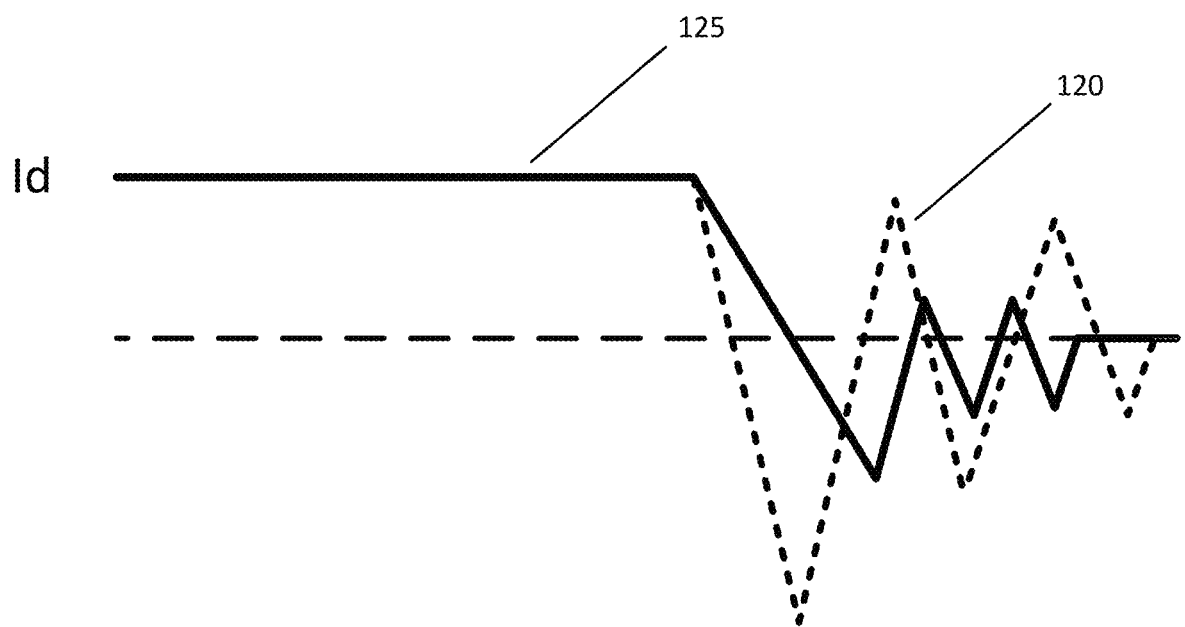
FIG. 1B shows the behavior over time of current in the diode of FIG. 1B at different transition times.

Reverse recovery time is a challenge in all power switching applications, whether it is motor control, solenoid control, or power management. Reverse recovery charge is stored at the junction of the diode when it is being forward biased. (FIG. 1A). The level of charge increases as the forward bias current increases. Ideally, when a forward biased diode is suddenly put into reverse bias there will be no current flow in the reverse bias. However, with reverse recovery charged stored, when the forward biased diode is suddenly put into the reverse bias there will be a reverse current flow, which will be a function of the charge that was stored when operating in the forward bias. If the transition time from forward bias to reverse bias is decreased the current peak from reverse recovery will increase. (FIG. 1B).

FIG. 1A shows a diode 100 with a threshold voltage of $V_d$ and a forward current flowing through it (as denoted by the arrow above the diode 100). Voltage 105 is the behavior of a voltage across the diode 100 over time as the voltage 105 is switched from a forward bias voltage $V_f$ to a reverse bias voltage $V_{reverse}$. Ideal current $I_d$ 110 is the behavior of a current through the diode 100 as an ideal diode over time as the voltage 105 is switched from the forward bias voltage $V_f$ to the reverse bias voltage $V_{reverse}$, with the ideal current $I_d$ 110 flowing while the voltage 105 is at $V_f$ and with the ideal current $I_d$ 100 not flowing while the voltage 105 is at $V_{reverse}$. Practical current $I_d$ 115 is the behavior of a current through a realistic, practical diode 100 over time as the voltage 105 is switched from the forward bias voltage $V_f$ to the reverse bias voltage $V_{reverse}$, with the practical current $I_d$ 115 flowing while the voltage 105 is at $V_f$ and oscillating and diminishing to zero current when the diode 105 is switched to the reverse bias voltage $V_{reverse}$ because a reverse recovery charge $Q_{rr}$ is stored at the junction of the diode 100 while the practical current $I_d$ 115 is flowing while the voltage 105 is at the forward bias voltage $V_f$ and flows as a diminishing, oscillating transient current $I_d$ 115 for a short period after the switch from $V_f$ to $V_{reverse}$. As shown in FIG. 1B, the peak of the transient practical current $I_d$ increases as a transition time from $V_f$ to $V_{reverse}$ is decreased, with the practical current $I_d$ 120, shown as a dashed line, having a relatively higher peak at a relatively short transition time and the practical current $I_d$ 125, shown as a solid line, having a relatively lower peak at a relatively longer transition time.

Figure 2A:
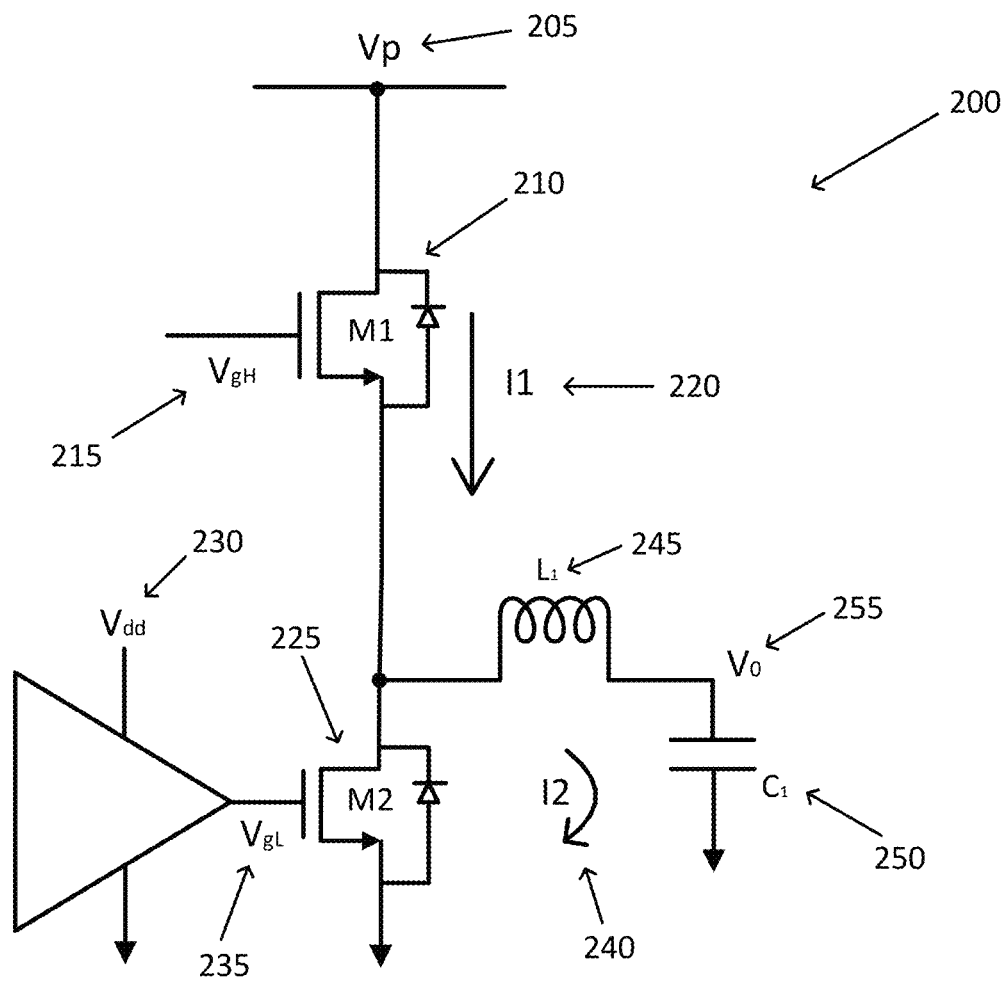
FIG. 2A shows a prior art power switching circuit.

FIG. 2A shows a prior art power switching circuit 200 such as that in a buck-switching regulator application, with a totem pole switch configuration including the high switch M1 210 and the low switch M2 225. The high switch M1 220 and the low switch M2 225 are each shown as an exemplary metal-oxide semiconducting field-effect transistor (MOSFET) with a body diode, the parasitic diode that is intrinsic to the MOSFETs of the high switch M1 220 and of the low switch M2 225 as shown in FIG. 2A. More particularly, the power switching circuit 200 includes the input for input power supply voltage $V_p$ 205, the high switch M1 210, the input for the high gate voltage $V_{gH}$ 215, the forward current $I_1$ 220, the low switch M2 225, the voltage source $V_{dd}$ 230 for the low gate voltage $V_{gL}$ 235, the reverse current $I_2$ 240, the load inductor $L_1$ 245, the load capacitor $C_1$ 250, and the output for the output voltage $V_0$ 255.

In the representative prior art power switching circuit 200, to improve efficiency, the low switch $M_2$ 225 is on the ON state when the current $I_2$ is freewheeling through the load inductor $L_1$ 245 and the load capacitor $C_1$ 250. When the output voltage $V_0$ 255 decreases, more energy must be provided from the input power supply by inputting the input power supply voltage $V_p$ 205, by switching the high switch M1 210 to the ON state. To prevent a shoot-through current from the high switch M1 210 to the low switch $M_2$ 225, the low switch M2 225 must be switched to the OFF state before the high switch M1 210 is switched to the ON state. The time period during which both the high switch M1 210 and the low switch M2 225 are in the OFF state is the deadtime. To switch the low switch M2 225 to the OFF state, the voltage source $V_{dd}$ 230 is transitioned to 0 volts. During the deadtime that starts when the low switch M2 225 is switched to the OFF state, a reverse recovery charge $Q_{rr}$ accumulates at the forward bias junction of the body diode of the low switch M2 225. When the high switch M1 210 is switched to the ON state, ending the deadtime, the reverse recovery charge $Q_{rr}$ and the forward current $I_1$ 220 flow through the high switch M1 210. To minimize the peak and the $dI_{rr}/dt$ of the reverse recovery charge $Q_{rr}$ that was accumulated in the body diode of the low switch M2 225, the transition time from the OFF state to the ON state can be increased as shown for the practical current $I_d$ 125 in FIG. 1B, but at the cost of increased switching losses and a reduction in power efficiency.

Figure 2B:
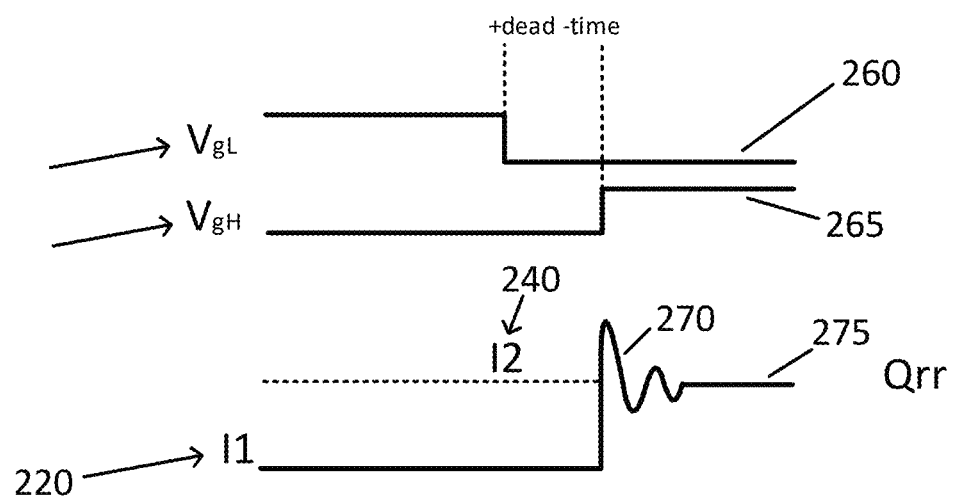
FIG. 2B shows the behavior over time of behavior over time of voltage and current in the prior art power switching application shown in FIG. 2A.

FIG. 2B shows the behavior over time of the low gate voltage $V_{gL}$ 235, shown as the low gate voltage $V_{gL}$ curve 260; the high gate voltage $V_{gH}$ 215, shown as the high gate voltage $V_{gH}$ curve 265; and the current $I_1$ 220 and the current $I_2$ 240, shown together as the current curve 275. The current $I_1$ flows as the low gate voltage is set to 0 V, beginning the deadtime. When the high gate voltage $V_{gH}$ 215 is set to switch the high switch M1 210 to the ON state, the deadtime ends and the reverse recovery charge $Q_{rr}$ flows as the transient portion 270 of the current curve 275.

Figure 3A:
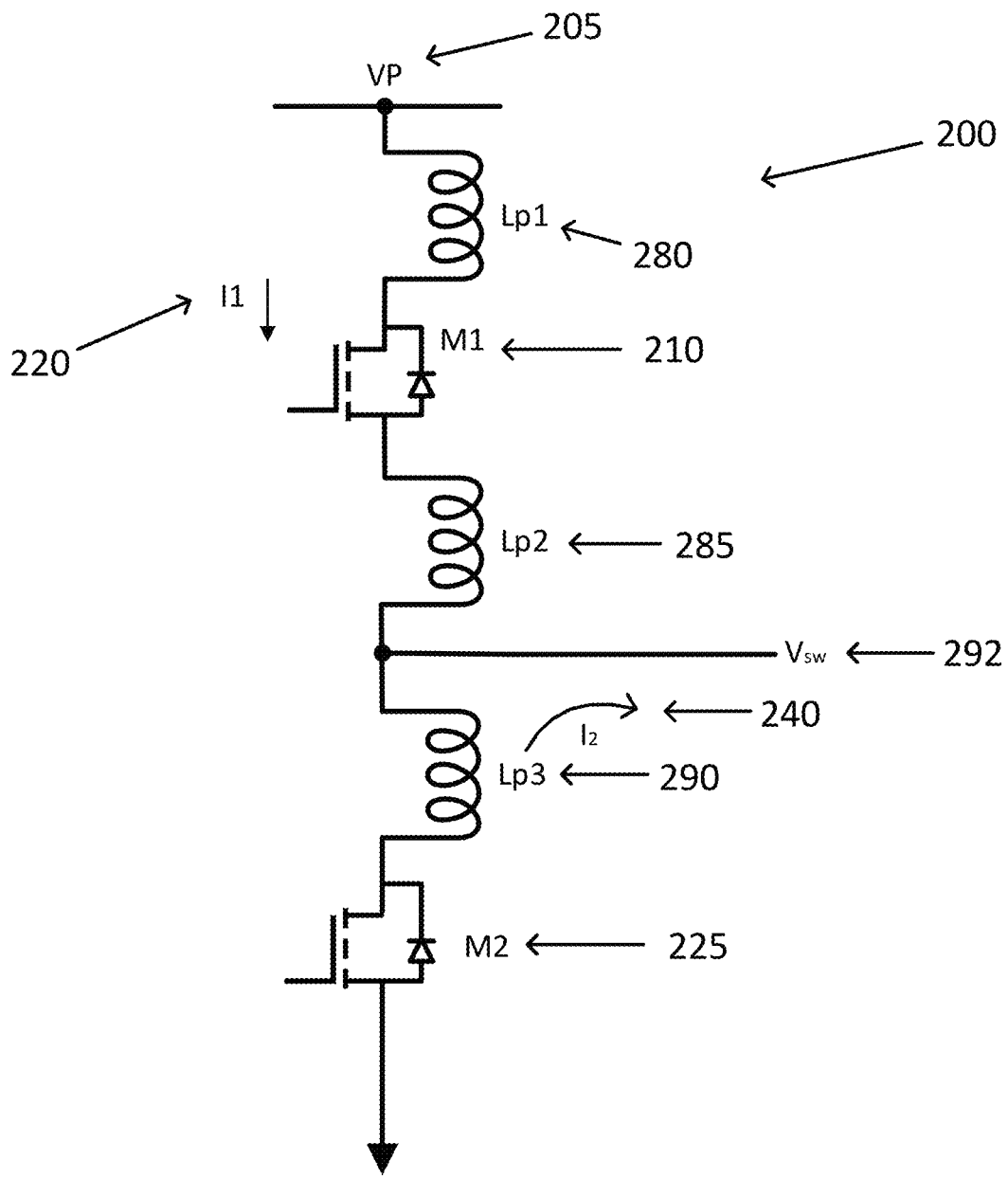
FIG. 3A shows the prior art power switching circuit of FIG. 2A with parasitic inductances.

FIG. 3A shows the representative prior art power switching circuit 200 with the high switch M1 210, the low switch M2 225, the current $I_1$ 220, the current $I_2$ 240, the parasitic inductance $L_{p1}$ 280, the parasitic inductance $L_{p2}$ 285, the parasitic inductance $L_{p3}$ 290, and the output switch pin voltage $V_{sw}$ 292 between the parasitic inductance $L_{p2}$ 285 and the parasitic inductance $L_{p3}$ 290. The product of (1) the sum $L_{psum}$ of the parasitic inductances $L_{p1}$ 280, $L_{p2}$ 285, and $L_{p3}$ 290 and (2) the $dI_{rr}/dt$ of the reverse recovery charge $Q_{rr}$ that was accumulated in the body diode of the low switch M2 225 translates to a parasitic inductance voltage transient. The high switch M1 210 must be able to withstand the peak of this parasite inductance voltage transient, but as the breakdown voltage of the high switch M1 210 is increased, the overall product of (1) the drain-to-source resistance $R_{dsON}$ of the high switch M1 210 in the ON state and (2) the area of the high switch M1 210 increases, and to keep efficiency lower, the size of the high switch M1 210 must be increased. These considerations require trade-offs to be made in the types and sizes of the high switch M1 210 and the low switch M2 225, management of board layout to minimize parasitics, and switching characteristics of the output of the representative prior art power switching circuit 200.

Figure 3B:
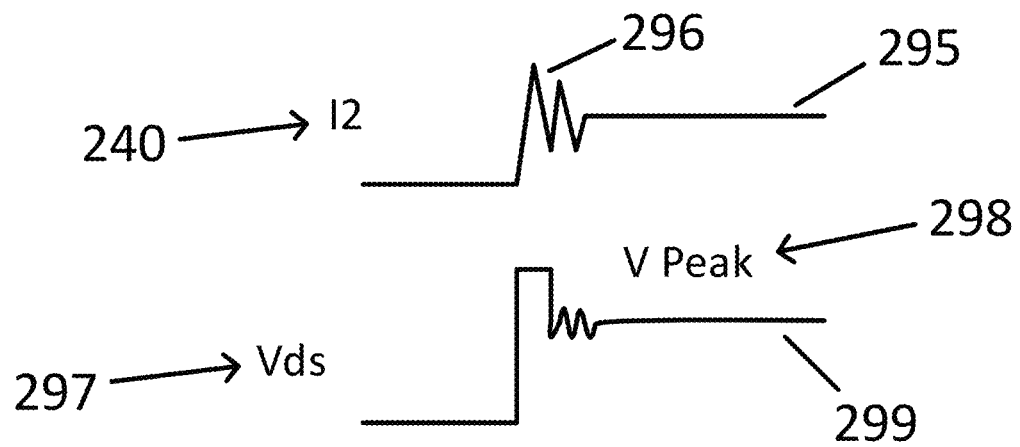
FIG. 3B shows the behavior over time of behavior over time of voltage and current in the prior art power switching application as shown in FIG. 3A.

FIG. 3B shows the behavior over time of the current $I_2$ 240, shown as the current $I_2$ curve 295, and the drain-to-source voltage of the high switch M1 210 $V_{ds}$ 297, shown as the voltage $V_{ds}$ curve 299. When the high switch M1 210 is switched to the ON state, the deadtime ends, the reverse recovery charge $Q_{rr}$ flows as the transient portion 296 of the current $I_2$ curve 295, and the drain-to source voltage of the high switch M1 210 $V_{ds}$ 297 increases, including the parasitic inductance voltage transient peak 298.

Figure 4:
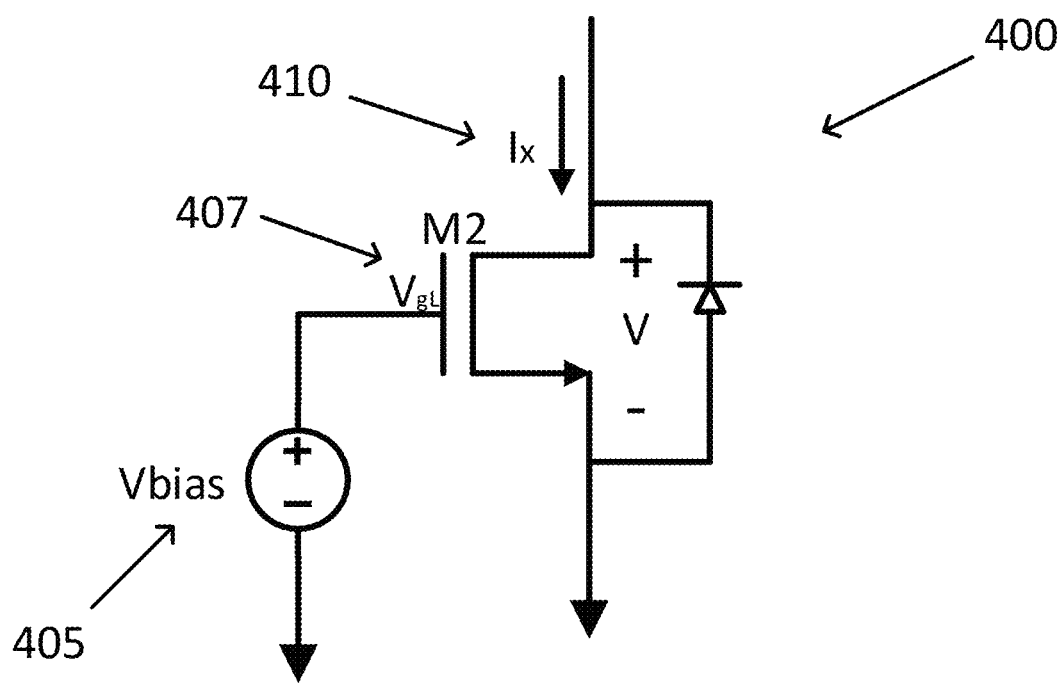
FIG. 4 shows an embodiment of the present invention, a low switch of a power switching application.

The solution to this problem is to eliminate or reduce the reverse recovery charge that can be stored. The elimination of reduction of the reverse recovery charge is achieved by gate controlling the turn-off voltage level of device M2. As shown in FIG. 4, the gate of device M2 is turned-off with a Vbias level. The Vbias is set to a voltage lower than the threshold voltage (Vt) of M2. Therefore, if a positive voltage were placed at the drain, no current, Ix, will flow through M2 from drain to source.

FIG. 4 shows an embodiment of the present invention, the low switch M2 400 of a power switching application. The low switch M2 400 includes a MOSFET with a body diode. The voltage source for the bias voltage $V_{bias}$ 405 is also shown and is connected to the input for the low switch gate voltage $V_{gL}$ 407. The current $I_x$ is also shown. The low switch M2 400 presents a solution to problems associated with the reverse recovery charge $Q_{rr}$ by gate controlling the turn-off voltage level of the low switch M2 400. The gate of the low switch M2 400 is switched to the OFF state with a bias voltage $V_{bias}$ 405 by setting the bias voltage $V_{bias}$ 405 to a voltage lower than the forward threshold voltage $V_t$ of the low switch M2 400. If a positive voltage is placed at the drain of the low switch M2 400, the current $I_x$ 410 will be zero, i.e., no current $I_x$ 410 will flow from the drain to the source of the low switch M2 400.

Figure 5:
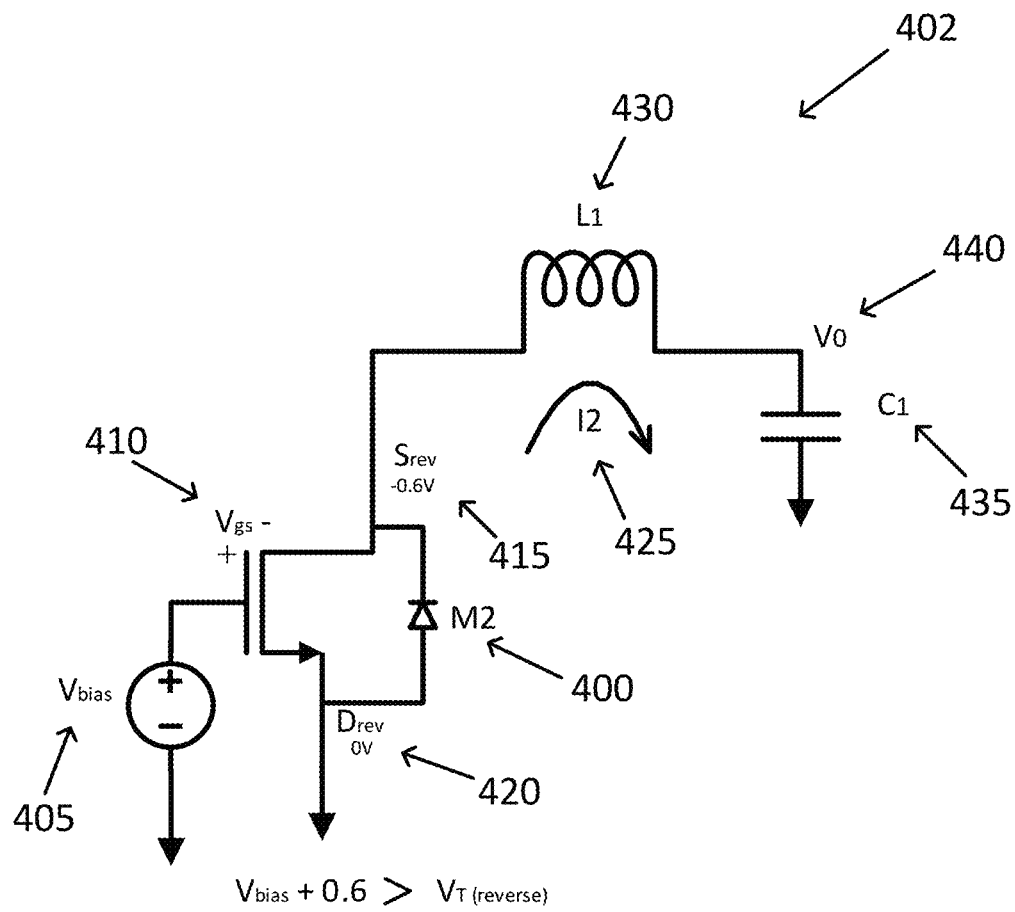
FIG. 5 shows the low switch of FIG. 4 in reverse-bias mode.

FIG. 5 shows the low switch M2 400, with the voltage source for the bias voltage $V_{bias}$ 405, the gate-to-source voltage $V_{gs}$ 410 for the low switch M2 400, the reverse source voltage $S_{rev}$ 415, and the reverse drain voltage $D_{rev}$ 420, and the current $I_2$ 425. FIG. 5 also shows connected to the load inductor $L_1$ 430, the load capacitor $C_1$ 435, and the output for the output voltage $V_O$ 440. In the recirculation mode of a power switching device of which the low switch M2 400 is a component, the current $I_2$ will flow as shown, and in the low switch M2 400, the source and the drain reverse to become the reverse drain and the reverse source, respectively. The reverse drain voltage $D_{rev}$ 420 is shown grounded at 0 volts. The reverse threshold voltage of the low switch M2 400 $V_{t-reverse}$ will be less than the forward threshold voltage $V_t$ because the backgate biasing, i.e., the bias voltage applied to the body diode, for the forward and reverse modes of the low switch M2 400 are at different voltages with respect to the source voltage in the forward mode and the reverse source voltage $S_{rev}$ 415 for the reverse mode. With the reverse drain voltage $D_{rev}$ 420 grounded at 0 volts, the reverse source voltage $S_{rev}$ 415 will be a negative voltage. To eliminate the accumulation of the reverse recovery charge $Q_{rr}$ as described herein, the reverse-drain-to-reverse-source voltage should not be greater than the forward bias voltage of the body diode. The forward bias voltage of the body diode may typically be +0.6 V. To assure that the body diode is not forward biased, the gate-to-source voltage $V_{gs}$ 410 minus the reverse threshold voltage $V_{t-reverse}$ must be large enough to switch the low switch M2 400 to the reverse-biased-ON state. FIG. 5 shows a representative value for the reverse source voltage $S_{rev}=-0.6$ V and for the grounded reverse drain voltage $D_{rev}=0$ V when the forward bias voltage of the body diode is a typical +0.6 V. Thus, the reverse-drain-to-reverse-source voltage $D_{rev}-S_{rev}=0$ V$-(-0.6$ V$)=+0.6$ V. When the overall gate-to-reverse-source voltage $V_{bias}-S_{rev}=V_{bias}-(-0.6$ V$)=V_{bias}+0.6$ V is greater than the reverse threshold voltage $V_{t-reverse}$, the low switch M2 400 is switched to the reverse-bias-ON state and the accumulation of the reverse recovery charge $Q_{rr}$ is eliminated.

Figure 6:
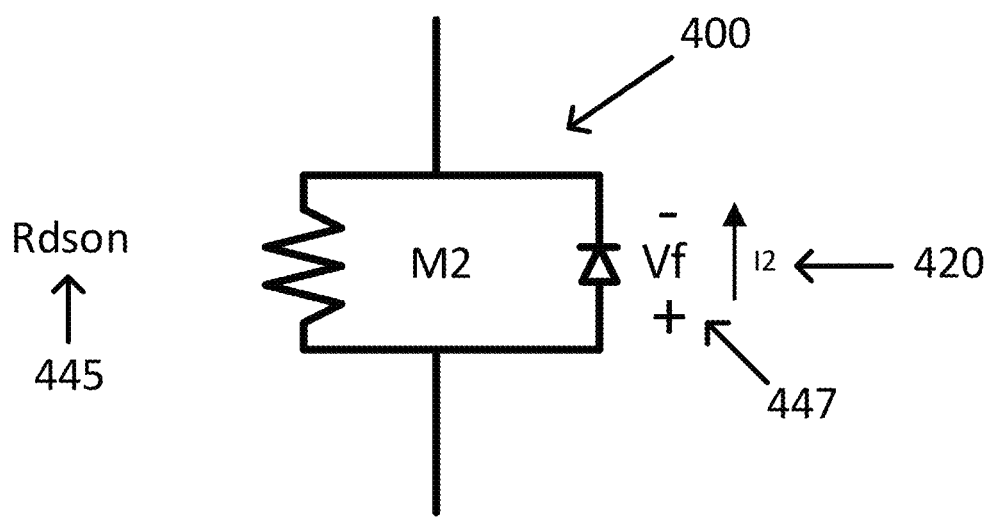
FIG. 6 shows a resistance drive of the low switch of FIG. 5.

FIG. 6 shows that the gate-to-source voltage $V_{gs}$ 410 creates a resistance drive $R_{dson}$ 445 for the low switch M2 400 in the reverse-bias-ON state. The product of (1) the resistance $R_{dson}$ 445 and (2) the current $I_2$ 425 must be less than the forward bias voltage $V_f$ 447 of the body diode of the low switch M2 400 to eliminate the accumulation of the reverse recovery charge $Q_{rr}$. However, even if the body diode does forward bias, only a fractional portion of the current $I_2$ will be contributed to the reverse recovery charge $Q_{rr}$, reducing the reverse recovery charge $Q_{rr}$ for the low switch M2 400 as compared to the accumulation of the reverse recovery charge $Q_{rr}$ for a low switch M2 in which the turn-off voltage level is not gate controlled, such as the low switch M2 225 of the representative prior art power switching circuit 200.

Figure 7A:
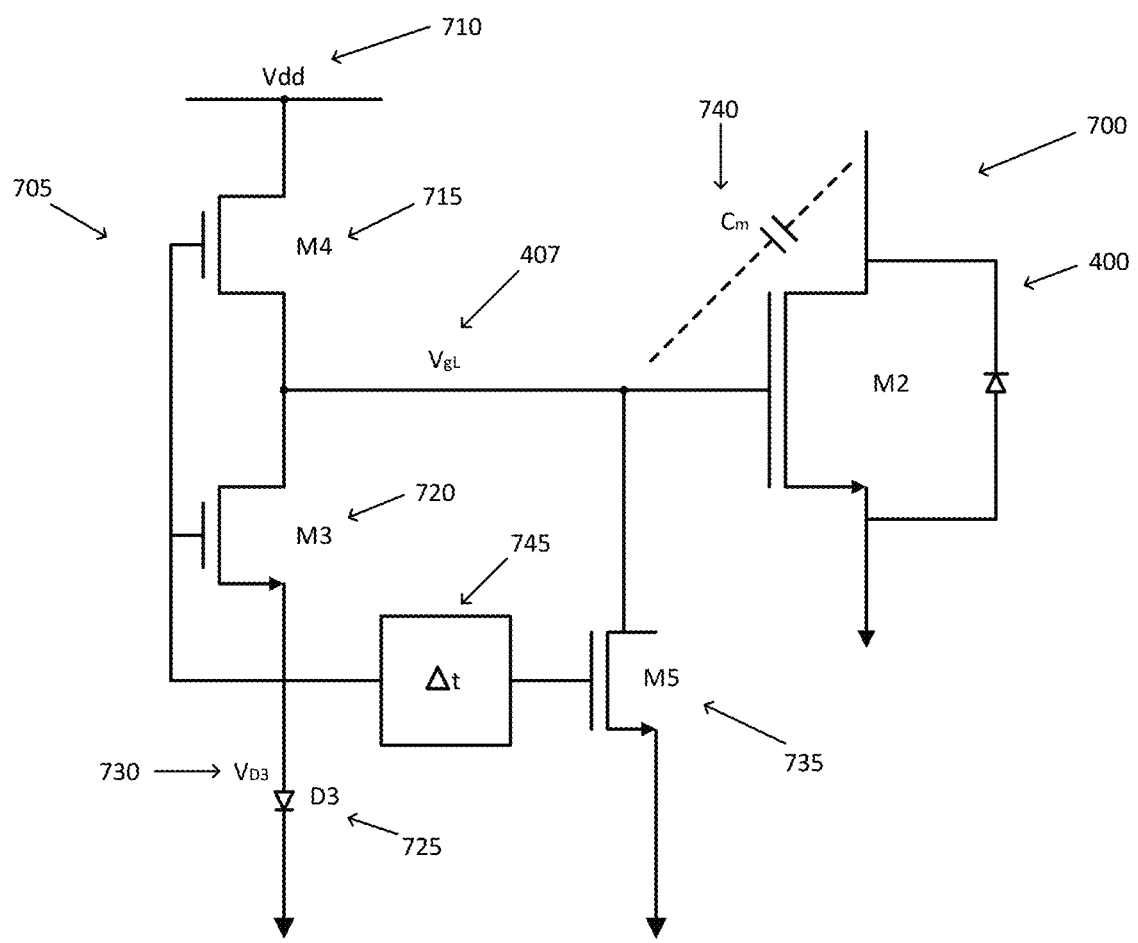
FIG. 7A shows an embodiment of the present invention, a power switching circuit with a driver stage and a parallel clamping device with a time delay circuit.
Figure 7B:
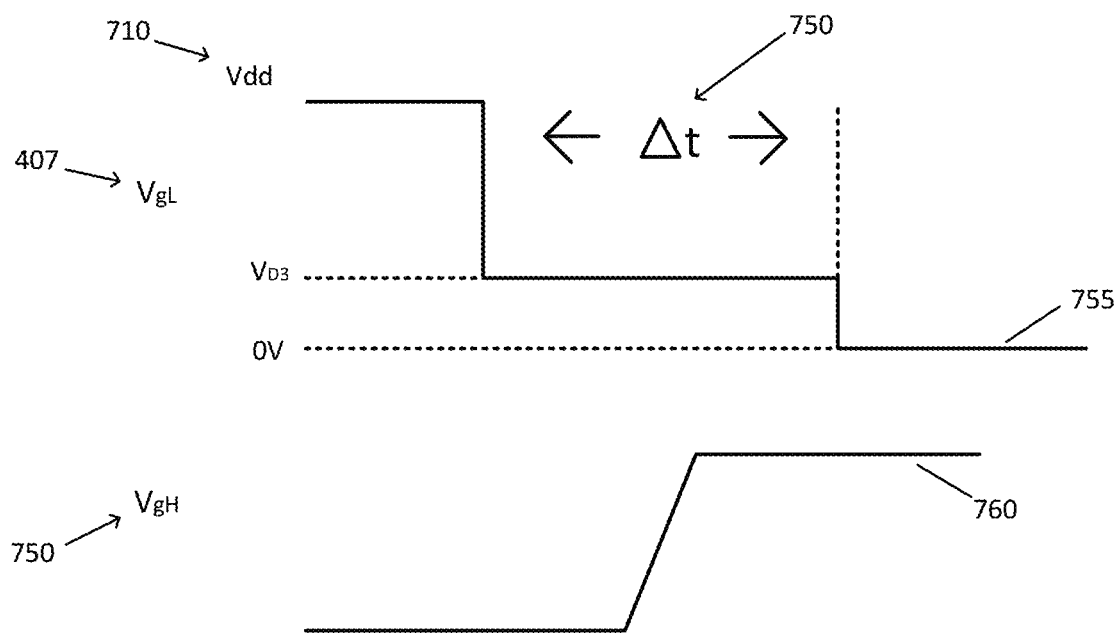
FIG. 7B shows the behavior over time of voltages in the power switching circuit of FIG. 7A.

There are several ways that this technique can be implemented into a design. FIGS. 7A and 7B show a Driver Stage M3 and M4 in series with diode D3 which sets the $V_{bias}$ voltage. In addition, a parallel clamping device, M5 can be placed to pull the gate to source voltage to zero when the drain voltage begins to rise. This also helps to mitigate the M2 device from turning back on when the miller capacitance (Cm) from the drain to gate injects charge onto the gate during this voltage transient on the drain.

FIG. 7A shows an embodiment of the present invention, the power switching circuit 700, including the low switch M2 400. In the power switching circuit 700, a driver stage 705 that includes the input for the driver stage input voltage $V_{dd}$ 710, the driver switch M4 715, the driver switch M4 720, and the driver diode D3 725, and the driver diode voltage $V_{D3}$ 730 at the connection of the driver switch M3 720 and driver diode D3 725. The driver stage 705 is used to set the bias voltage $V_{bias}$ for the low switch gate voltage $V_{gL}$ 407.

In the embodiment shown in FIG. 7A, the parallel clamping device M5 735 is shown. The parallel clamping device M5 735 is used to pull the gate-to-source voltage $V_{gL}$ 407 to 0 V when the drain voltage of the low switch M2 400 begins to rise. This action helps to prevent the low switch M2 400 from switching to the ON state when the parasitic capacitance known as the Miller capacitance $C_m$ 740 from the drain to the gate of the low switch M2 400 injects charge onto the gate of the low switch M2 400 during the rise of the voltage at the drain. The parallel clamping device M5 735 may be controlled from the driver stage 705 by a delay circuit 745.

FIG. 7B shows the behavior over time of the low switch gate voltage $V_{gL}$ 407 as the voltage curve 755 and of the high switch gate voltage $V_{gH}$ 450 as the voltage curve 760 for the embodiment shown in FIG. 7A. The low switch gate voltage $V_{gL}$ 407 begins as the driver stage input voltage $V_{dd}$ 710, and then the low switch gate voltage $V_{gL}$ 407 is changed to the driver diode voltage $V_{D3}$ 730. After a time delay Δt introduced by the delay circuit 745, the low switch gate voltage $V_{gL}$ 407 is changed to 0 V. During the time delay Δt, the high switch gate voltage $V_{gH}$ 450 is changed to switch the high switch M1 (not shown in FIG. 7A) to the ON state. The parallel clamping device M5 735 may also be controlled by a combination of the driver stage 705 and feedback monitoring of the drain voltage of the low switch M2 400.

Figure 8A:
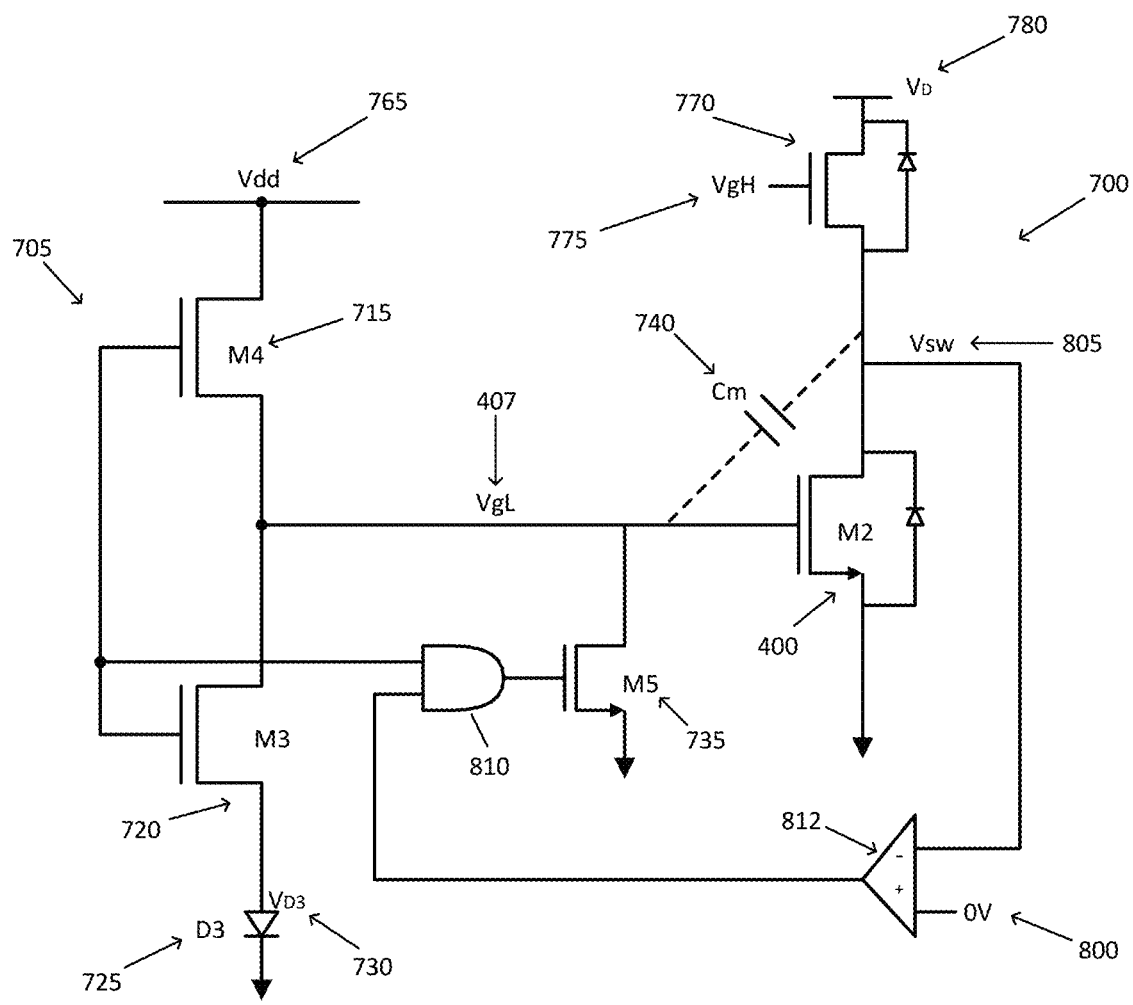
FIG. 8A shows an embodiment of the present invention, a power switching application with driver stage, a parallel clamping circuit, and feedback monitoring.
Figure 8B:
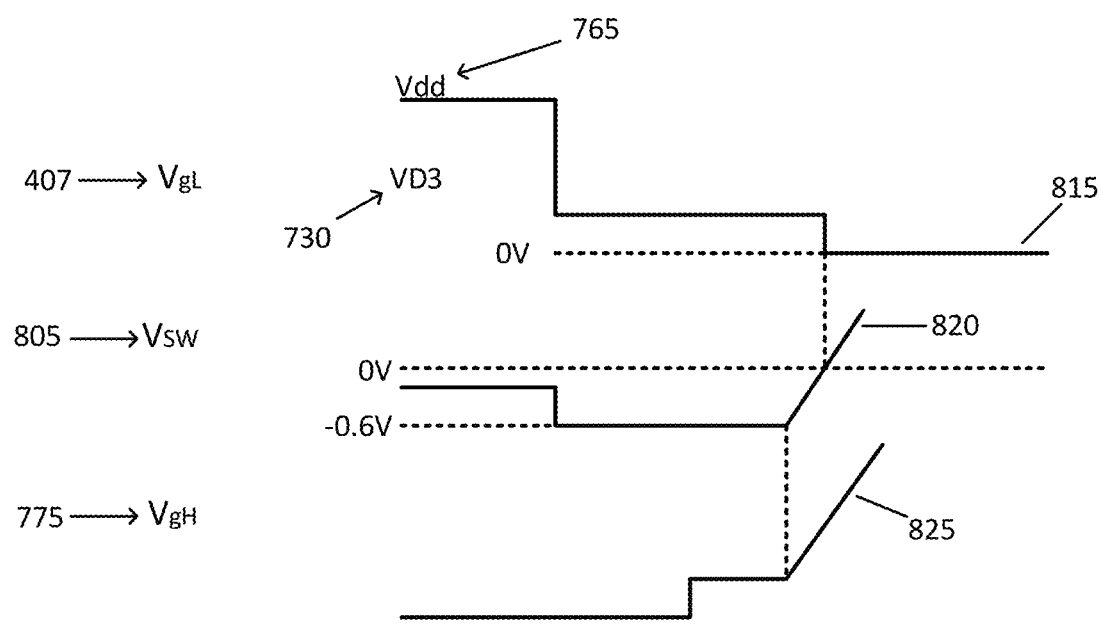
FIG. 8B shows the behavior over time of voltages in the power switching circuit of FIG. 8A.

FIGS. 8A and 8B show a latter technique which provides immediate feedback when the drain voltage of M2 begins to rise, which prevents inadvertent turn-off of M2 from the $C_m$ capacitor. FIG. 8A shows an embodiment in which the logic gate 810 controls the gate of the parallel clamping device M5 735, where the logic gate 810 uses as input (1) the voltage at the gates of the driver switches M3 and M4 and (2) the output of the device 812. When the drain voltage of the low switch M2 400, $V_{sw}$ 805, begins to rise, the parallel clamping device M5 is switched to the ON state, and the low switch M2 400 is prevented from switching to the ON state when the Miller capacitance $C_m$ 740 injects charge onto the gate of the low switch M2 400. FIG. 8A also shows the driver stage input voltage $V_{dd}$ 765, the high switch 770, the input for the high switch gate voltage $V_{gh}$ 775, and the high switch drain voltage $V_D$ 780.

FIG. 8B shows the behavior over time of the low switch gate voltage $V_{gL}$ 407 as the voltage curve 815, of the drain voltage of the low switch M2 400, $V_{sw}$ 805, as voltage curve 820, and of the high switch gate voltage $V_{gH}$ 775 as voltage curve 825. The low switch gate voltage $V_L$ 407 begins at the driver stage input voltage $V_{dd}$ 765, then is changed to the driver diode voltage $V_{D3}$ 730. The drain voltage of the low switch M2 400, $V_{sw}$ 805, begins at a voltage between 0 V and the representative voltage of –0.6 V and is changed to the representative voltage of –0.6 V when the low switch gate voltage $V_{gL}$ 407 is changed to the driver diode voltage $V_{D3}$ 730. Then the high switch gate voltage $V_{gH}$ 775 is changed to switch the high switch 770 to the ON state and as the high switch gate voltage $V_{gH}$ 775 rises, drain voltage of the low switch M2 400, $V_{sw}$ 805, rises. When drain voltage of the low switch M2 400, $V_{sw}$ 805, reaches 0 V, and the parallel clamping device M5 is switched to the ON state. Thus, the low switch M2 400 is prevented from switching to the ON state when the Miller capacitance $C_m$ 740 injects charge onto the gate of the low switch M2 400.

Additionally, for the embodiments shown in FIGS. 7A and 8A, other techniques can be used where the bias voltage $V_{bias}$ for the low switch gate voltage $V_{gL}$ 407 is a dynamically adjusted value that is compensated by feedback from a current sense amplifier from the low switch M2 400. This allows for greatest gate-to-reverse-source voltage drive in the reverse direction.

In addition, a feedback loop can be achieved from a tap-off FET from the low switch M2 400 where a low-current diode voltage is monitored and the bias voltage $V_{bias}$ for the low switch gate voltage $V_{gL}$ 407 can be adjusted. In addition, improvements can be made to the technique of optimizing the threshold voltage $V_t$ of the low switch M2 400. By making the threshold voltage $V_t$ of the low switch M2 400, the low switch M2 400 can have more drive strength per unit area in the reverse-bias mode.

Figure 9A:
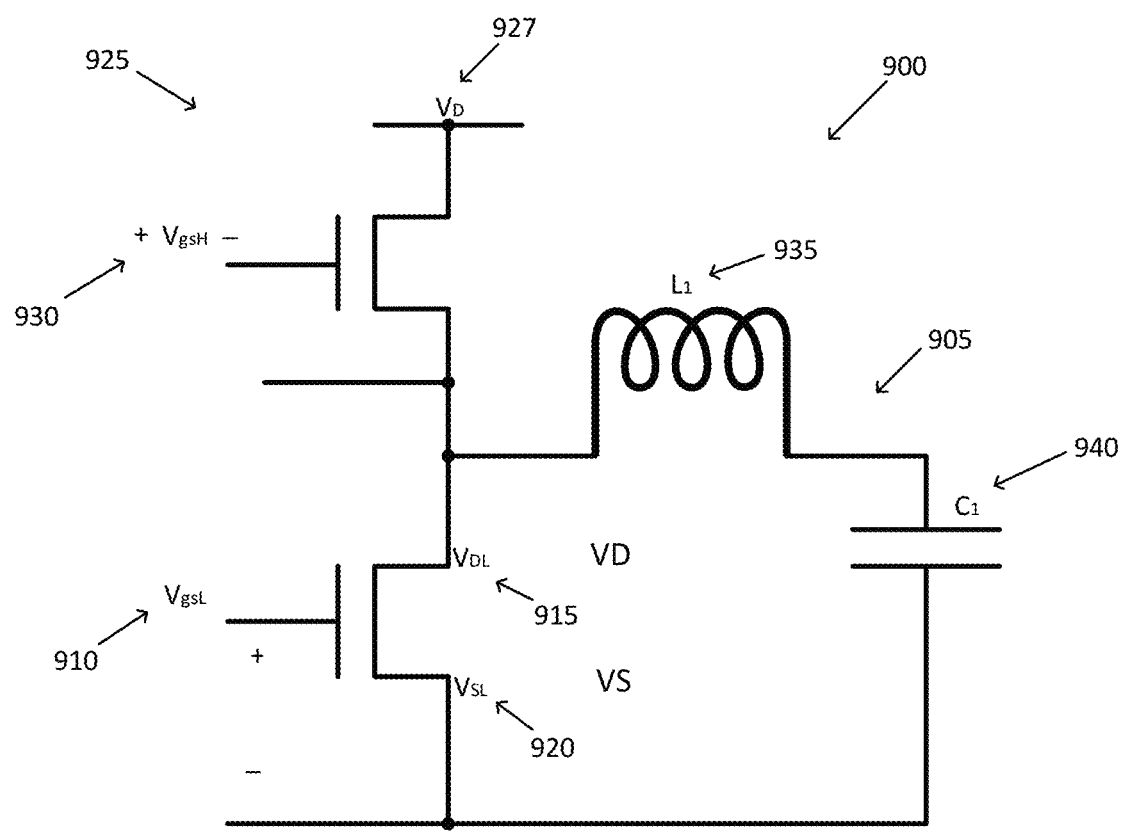
FIG. 9A shows an embodiment of the present invention, a wide-bandgap low switch.

FIG. 9A shows an embodiment of the present invention in which a wide-bandgap low switch, such as a low switch that includes gallium nitride (Ga N), is used in a power switching circuit 900, such as a low switch that includes gallium nitride (Ga N). FIG. 9A shows a wide-bandgap low switch with a low switch gate voltage $V_{gL}$ 910, a low switch drain voltage $V_{dL}$ 915, and a low switch source voltage $V_{sL}$ 920, and a high switch 925 with a high switch drain voltage $V_D$ 927 and a high switch gate voltage $V_{gH}$ 930. Also shown is a load 905 including the load inductor $L_1$ 935 and the load capacitor $C_1$ 940. During operation, when current flows from the low switch source 920 to the low switch drain 915 at the time during make-before-break 955, the gate-to-source voltage $V_{gsA}$ is placed at a mid-level voltage Vmid 955. By using this embodiment, the drain-to-source voltage $V_{dsA}$ maximum negative voltage can be minimized. Use of this embodiment aids in the reduction of noise generated.

Figure 9B:
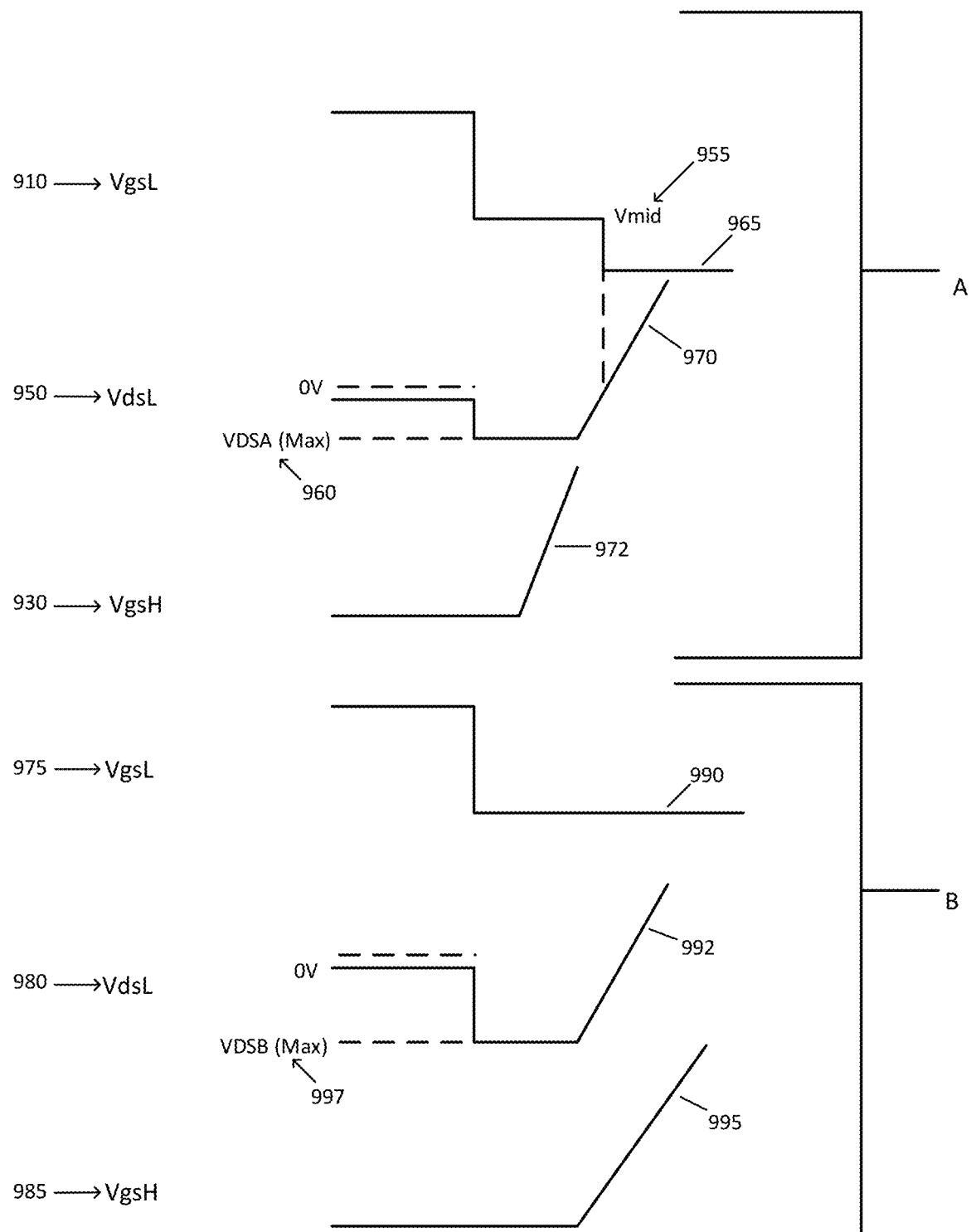
FIG. 9B shows a comparison of the behaviors over time of voltages in the switch of FIG. 9A and in a prior art switch.

FIG. 9B compares the behaviors over time of voltages in a power switching circuit including the wide-bandgap low switch of FIG. 9A (part "A" of FIG. 9B) and in a prior art power switching circuit (part "B" of FIG. 9B). Because the maximum drain-to-source voltage of the prior switch of part "B" is greater than the maximum drain-to-source voltage of the wide-bandgap switch of FIG. 9A, the power loss in the prior art switch of part "B" is greater than power loss of the wide-bandgap switch of FIG. 9A, an improvement over the prior art.

Figure 10:
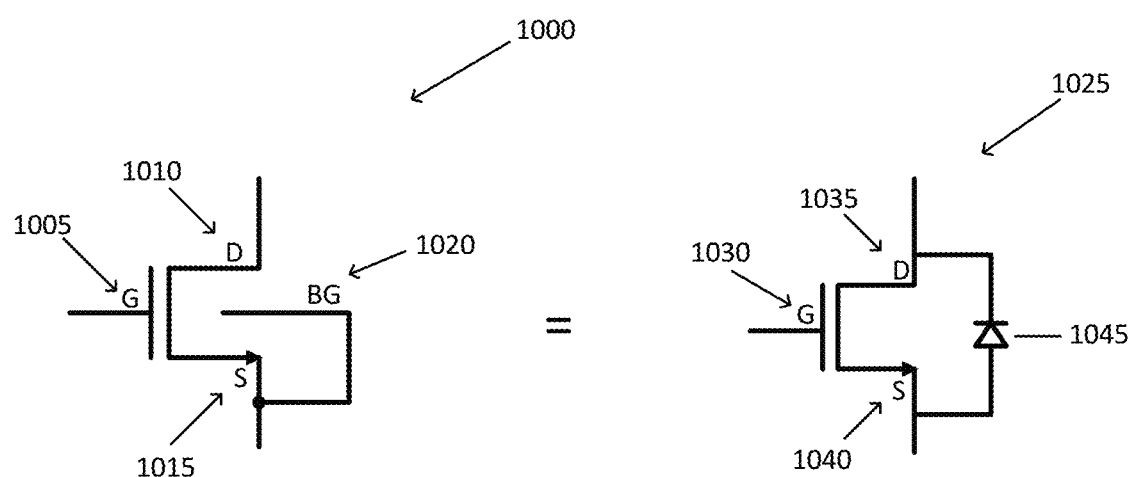
FIG. 10 shows the equivalence of a four-terminal switch and a three-terminal switch with a body diode.

FIG. 10 shows that the typical silicon or silicon carbide switch is actually a four-terminal device. In the switch 1000, having the gate G 1005, the drain D 1010, the source S 1015, and the backgate BG 1020, the backgate 1020 is tied to the source S 1015. The switch 1000 is equivalent to the switch 1025, having the gate G 1030, the drain D 1035, the source S 1040, and the body diode 1045.

Figure 11A:
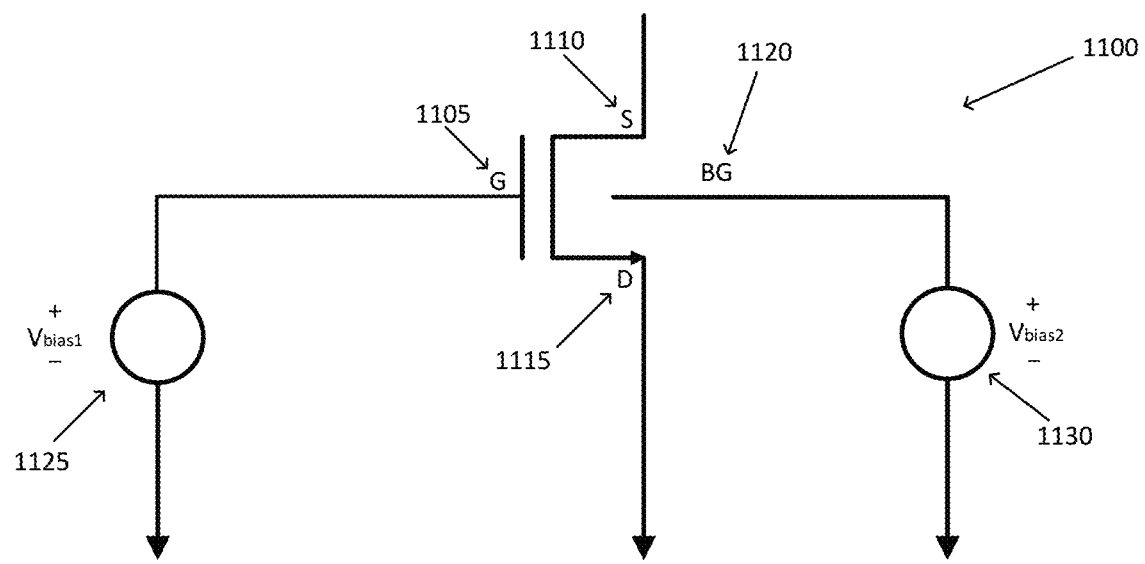
FIG. 11A shows an embodiment of the present invention, a four-terminal switch.

FIG. 11A shows an embodiment of the present invention, a four-terminal switch 1100 including silicon or silicon carbide and having the gate G 1105, the source S 1110, the drain D 1115, the backgate BG 1120, a voltage source for the gate bias voltage $V_{bias1}$ 1125, and a voltage source for the backgate bias voltage $V_{bias2}$ 1130. Both the gate bias voltage $V_{bias1}$ 1125 and the backgate bias voltage $V_{bias2}$ 1130 can be adjusted to further reduce the ON-state resistance of the switch 1100 when current flows from the source S 1110 to the drain D 1115 when the switch is in the reverse-bias mode. To achieve this, the gate-to-source voltage can be placed at a mid-level voltage and the backgate bias voltage $V_{bias2}$ 1130 can also be placed at a mid-level voltage, which reduces the threshold voltage, increasing the drive and reducing the current of the switch 1100 with the current flowing from the source S 1110 to the drain D 1115 when the switch is in the reverse-bias mode. Any combination of the gate bias voltage $V_{bias1}$ 1125 and the backgate bias voltage $V_{bias2}$ 1130 can be used.

Figure 11B:
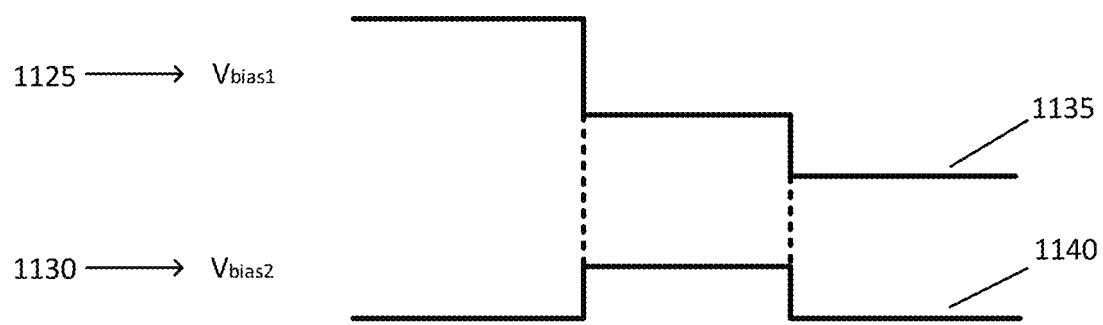
FIG. 11B shows the one type of behavior over time of voltages in the four-terminal switch of FIG. 11A.

FIG. 11B shows the behavior over time of the gate bias voltage $V_{bias1}$ 1125, shown as voltage curve 1135, and the backgate bias voltage $V_{bias2}$ 1130, shown as voltage curve 1140, for the switch 1100 when the gate bias voltage $V_{bias1}$ 1125 and the backgate bias voltage $V_{bias2}$ 1130 are changed at the same times.

Figure 11C:
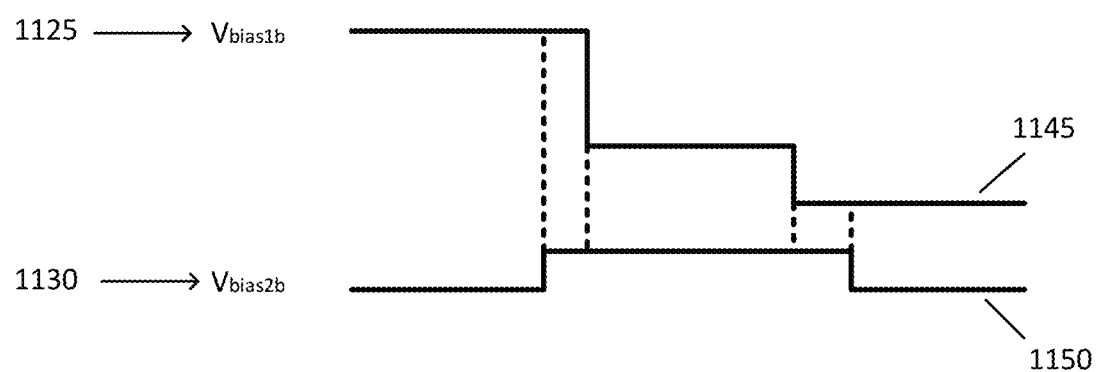
FIG. 11C shows another type of behavior over time of voltages in the four-terminal switch of FIG. 11A.

FIG. 11C shows the behavior over time of the gate bias voltage $V_{bias1}$ 1125, shown as voltage curve 1145, and the backgate bias voltage $V_{bias2}$ 1130, shown as voltage curve 1150, for the switch 1100. This is another timing embodiment of FIG. 11B, in which the backgate bias voltage $V_{bias2}$ 1130 is activated to a voltage backgate bias voltage $V_{bias2}$ 1130 prior to gate bias voltage $V_{bias1}$ 1125 transitioning from a high state to a mid state. Additionally, the backgate bias voltage $V_{bias2}$ 1130 transitions from a mid state to a low state after gate bias voltage $V_{bias1}$ 1125 transitions from a mid state to a low state. By controlling the voltage of gate bias voltage $V_{bias1}$ 1125 and backgate bias voltage $V_{bias2}$ 1130 in this condition provides a stable shift in threshold voltage for the gate bias voltage $V_{bias1}$ 1125 when it transitions from a high state to a mid state and from mid state to low state, including zero (0V). It is also possible to maintain backgate bias voltage $V_{bias2}$ 1130 in a non-zero state, thus it does not have to dynamically switch.

The approach taught herein can also be used with Silicon Carbide applications (SiC), Gallium Nitride, Gallium Oxide, or Gallium Arsenide. Any combination of bias voltage and threshold voltage can be set either positive or negative in value that meets the requirements of off-state in the forward direction and on-state in the negative direction.

Figure 12:
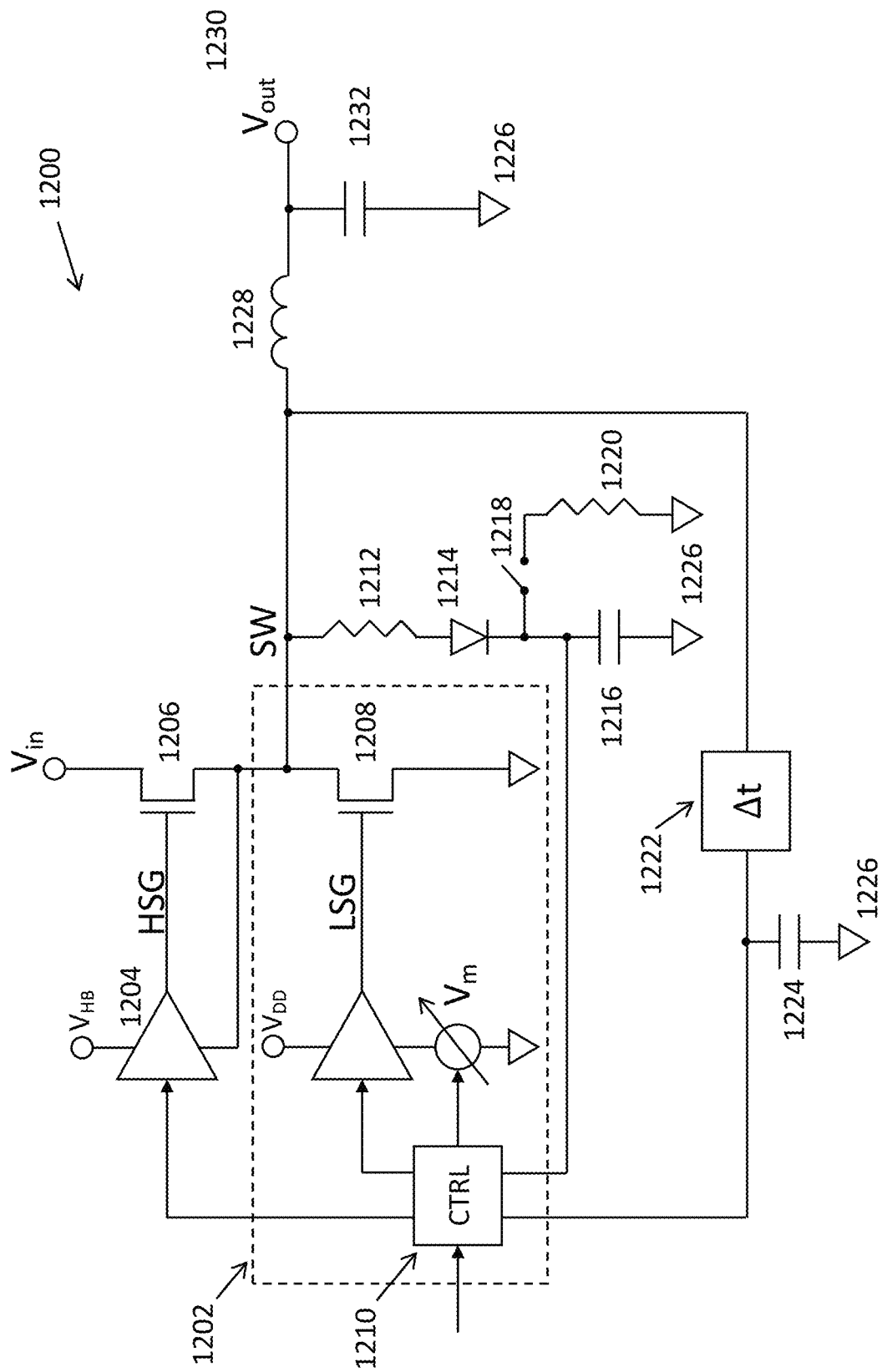
FIG. 12 shows an embodiment of the present invention, a power supply having a dynamic low side driver.

FIG. 12 shows an embodiment of the present invention, a power supply 1200 having a dynamic synchronous rectifier driver circuit 1202. The power supply 1200 includes a switching transistor driver circuit 1204 connected to a switching transistor 1206, and the synchronous rectifier driver circuit 1202 connected to a synchronous rectifier 1208. The synchronous rectifier driver circuit 1202 and the switching transistor driver circuit 1204 are controlled by control circuit CTRL 1210. The synchronous rectifier driver circuit 1202 will be described below in reference to FIG. 13. The source of the switching transistor 1206 is connected to a drain of the synchronous rectifier 1208. The drain of the switching transistor 1206 is connected to point SW. A first resister 1212 is connected to SW and in series with a diode 1214, which is connected in series with a first capacitor 1216 connected to reference ground 1226. The first capacitor 1216 is also connected in parallel with a switch 1218 that is series connected to a second resistor 1220, which is connected to reference ground 1226. The control circuit CTRL 1210 is also connected between the diode 1214 and the first capacitor 1216. A time delay circuit 1222 is connected between the point SW and a second capacitor 1224, which is connected to reference ground 1226. The second capacitor 1224 is connected to the control circuit CTRL 1210. An inductor 1228 is connected between point SW and a voltage output Vout 1230. A third capacitor 1232, which is connected to the reference ground 1226, is connected between the inductor 1228 and the voltage output Vout 1230.

Figure 13:
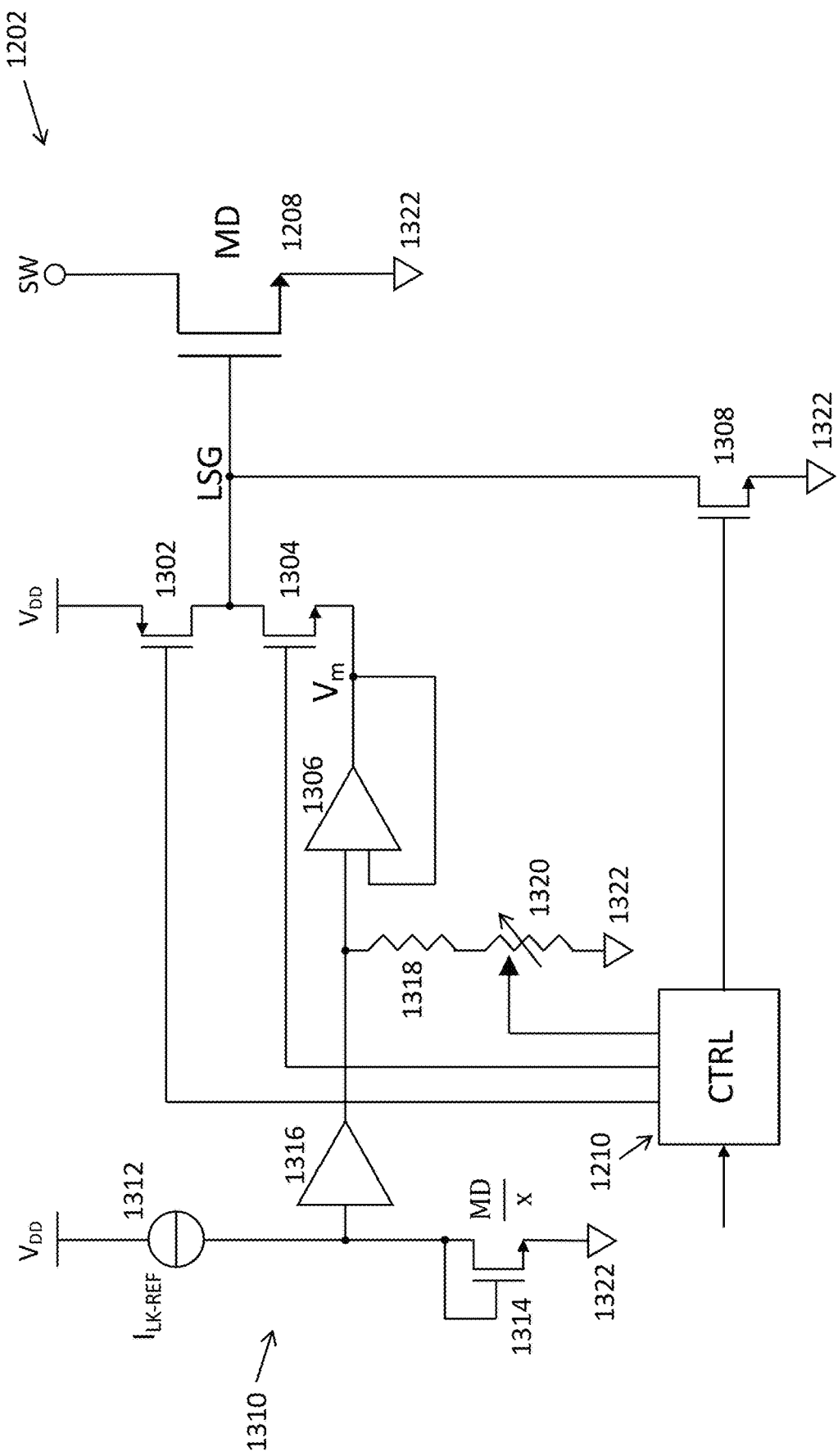
FIG. 13 shows an embodiment of the present invention, the dynamic low side driver of FIG. 12.

FIG. 13 shows an embodiment of the present invention, the dynamic synchronous rectifier driver circuit 1202 of FIG. 12. A first transistor 1302 has a gate connected to the control circuit CTRL 1210 and a drain connected to the gate LSG of the synchronous rectifier MD 1208. A second transistor 1304 has a drain connected to the gate LSG of the synchronous rectifier MD 1208, a gate connected to the control circuit CTRL 1210, and a source connected to the output Vm of a first amplifier 1306. A third transistor 1308 has a drain connected to the gate LSG of the synchronous rectifier 1208, a gate connected to the control circuit CTRL 1210 and a source connected to reference ground 1322. A voltage divider 1310 includes a current source ILK-REF 1312 and a fourth transistor MD/x 1314 with an output into an input of a second amplifier 1316. The fourth transistor MD/x 1314 has a gate connected to its drain and a source connected to the reference ground 1322. The fourth transistor MD/x the same type, but proportionally smaller than, the synchronous rectifier MD 1208. The output of the second amplifier 1316 is connected an input of the first amplifier 1306 and a first resistor 1318 that is series connected to a variable resistor 1320 and the reference ground 1322. The control circuit CTRL 1210 controls the variable resistor 1320 to set the synchronous rectifier voltage driving level.

Figure 14:
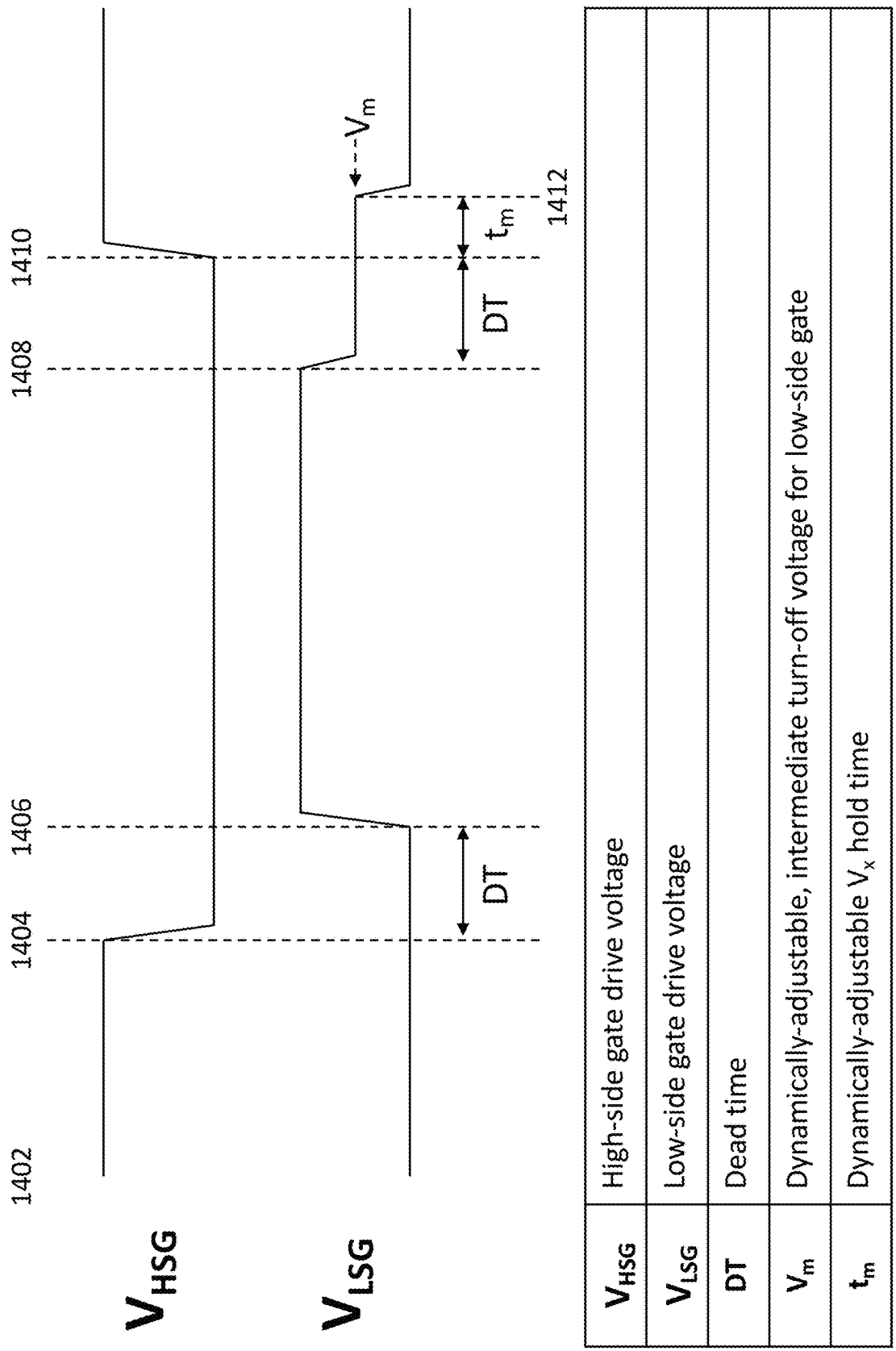
FIG. 14 shows an embodiment of the present invention, signal timing diagrams for the power supply of FIG. 12.

FIG. 14 shows an embodiment of the present invention, signal timing diagrams for the power supply of FIG. 12. The switching transistor gate drive voltage $V_{HSG}$ is high and the synchronous rectifier gate voltage $V_{LSG}$ is low at time 1402. At time 1404, switching transistor gate drive voltage $V_{HSG}$ goes low. After a dead time DT, the synchronous rectifier gate voltage $V_{LSG}$ goes high. At time 1408, the synchronous rectifier gate voltage $V_{LSG}$ drops to a dynamically adjustable, intermediate turn off voltage $V_m$ and remains at that level for the drop time DT. At time 1410, the synchronous rectifier gate voltage $V_{LSG}$ remains at $V_m$ and the switching transistor gate drive voltage $V_{HSG}$ goes high. After a dynamically adjustable hold time $t_m$, the synchronous rectifier gate voltage $V_{LSG}$ goes low at time 1412.

The following embodiments reduce or eliminate current or voltage transients in the switching circuit by actively monitoring the SW pin located between the switching transistor and the synchronous rectifier. The circuits use closed loop feedback to control level transistion(s) for the synchronous rectifier gate. The active feedback may include a voltage, a rate of change of voltage, a current, a rate of change of current or a combination thereof, all at the SW pin. The circuit does not require, but may use, signals from or monitoring of the switching transistor. Moreover, the circuit does not require, but may include, a time delay circuit. As a result, the circuits described herein reduce current losses from break before make, gate to drain capacitance, reverse recovery charge ($Q_{rr}$) and gate bounce. The circuits also help prevent ringing.

Figure 15:
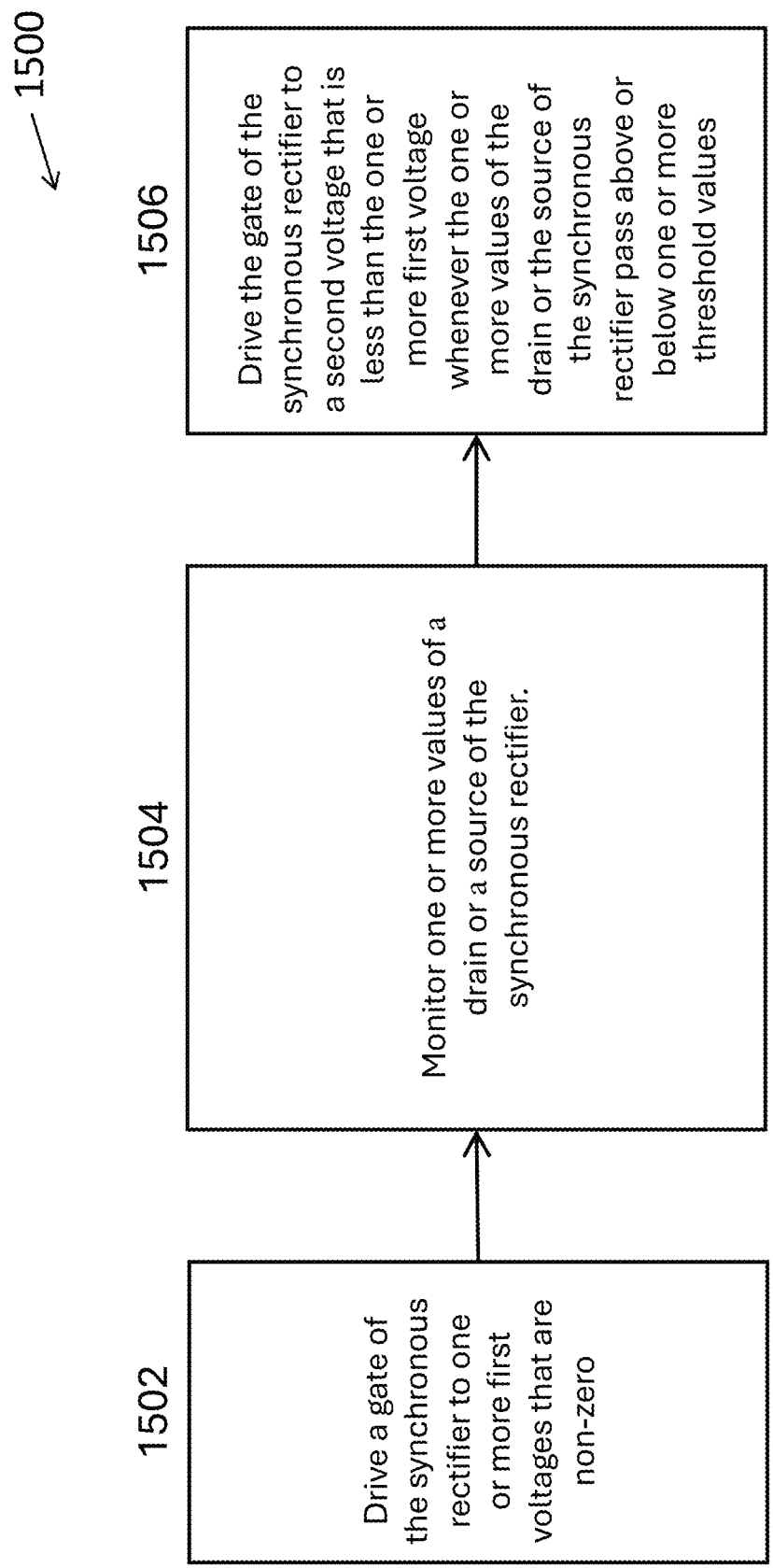
FIG. 15 shows an embodiment of the present invention, flow chart of a method for controlling a synchronous rectifier.

FIG. 15 shows an embodiment of the present invention, a flow chart of a method 1500 for controlling a synchronous rectifier. The synchronous rectifier is turned OFF in block 1502 by driving a gate of the synchronous rectifier to one or more first voltages that are non-zero. One or more values of a drain or a source of the synchronous rectifier are monitored in block 1504. The gate of the synchronous rectifier is driving to a second voltage that is less than the one or more first voltages in block 1506 whenever the one or more values of the drain or the source of the synchronous rectifier pass above or below one or more threshold values.

In one aspect, a switching circuit includes the synchronous rectifier connected to a switching transistor, and the method further includes reducing or eliminating current or voltage transients in the switching circuit. In another aspect, the method further includes selecting the one or more first voltages or the second voltage. In another aspect, the one or more first voltages are less than a threshold voltage of the synchronous rectifier. In some embodiments, the one or more first voltages can be greater than or equal to the threshold voltage of the synchronous rectifier. In another aspect, the one or more first voltages comprise a set of descending stair-step values, or a set of descending values forming a ramp or a curve. In another aspect, the one or more values can be a voltage, a change in the voltage, a current, a change in the current, or a combination of the voltage, the change in the voltage, the current or the change in the current of the drain or the source of the synchronous rectifier. In another aspect, the method further includes adjusting the one or more threshold values or a delay in driving the gate of the synchronous rectifier to the second voltage using a predictive feedback process. In another aspect, the predictive feedback process: samples and stores the one or more values of the gate, drain or the source of the synchronous rectifier; and uses the stored values of the gate, the drain or the source of the synchronous rectifier to adjust the one or more threshold values. In another aspect, the predictive feedback process: samples and stores the one or more values of the gate, the drain or the source of the synchronous rectifier and a switching transistor connected to the synchronous rectifier; and uses the stored values of the gate, the drain or the source of the synchronous rectifier and the switching transistor to adjust the one or more threshold values. In another aspect, the predictive feedback process: samples and stores the one or more values of the gate, the drain or the source of the synchronous rectifier; and uses the stored values of the gate, the drain or the source of the synchronous rectifier to adjust the delay in driving the gate of the synchronous rectifier to the second voltage. In another aspect, the predictive feedback process: samples and stores the one or more values of the gate, the drain or the source of the synchronous rectifier and a switching transistor connected to the synchronous rectifier; and uses the stored values of the gate, the drain or the source of the synchronous rectifier and the switching transistor to adjust the delay in driving the gate of the synchronous rectifier to the second voltage.

In another aspect, the second voltage is equal to zero volts. In another aspect, the second voltage is less than zero volts, e.g., −1 volts, −2 volts or an incremental value between 0 and −2 volts or more. In another aspect, a gate of a switching transistor connected to the synchronous rectifier is not monitored or used to control the gate of the synchronous rectifier. In another aspect, the synchronous rectifier is controlled using a synchronous rectifier driver circuit including: a driver circuit connected to the gate of the synchronous rectifier; a parallel clamping circuit connected to the gate of the synchronous rectifier; a monitoring circuit connected to the drain or the source of the synchronous rectifier and the parallel clamping circuit; and a control circuit connected to the driver circuit and the monitoring circuit. In another aspect, the synchronous rectifier driver circuit includes or does not include a time delay circuit. In another aspect, the driver circuit include: a first transistor having a gate connected to the control circuit and a drain connected to the gate of the synchronous rectifier; a second transistor having a drain connected to the gate of the synchronous rectifier and a gate connected to the control circuit; a one-way current switch connected to a source of the second transistor. In another aspect, the parallel clamping circuit includes a third transistor having a drain connected to the gate of the synchronous rectifier, a gate connected to the monitoring circuit and a source connected to a reference ground. In another aspect, the monitoring circuit include: a fourth transistor having a drain connected to the drain or the source of the synchronous rectifier, a gate connected to the control circuit, and a source connected to the parallel clamping circuit; and a fifth transistor having a drain connected to the parallel clamping circuit and a gate connected to the control circuit. In another aspect, the control circuit is further connected to a modulation signal. In another aspect, the driver circuit, the parallel clamping circuit, the monitoring circuit and the control circuit are formed in or on silicon, silicon carbide, gallium nitride, gallium oxide, or gallium arsenide.

In another aspect, the synchronous rectifier is controlled using a synchronous rectifier driver circuit including: a first transistor having a drain connected to the gate of the synchronous rectifier; a second transistor having a drain connected to the gate of the synchronous rectifier; a one-way current switch connected between a source of the second transistor and a reference ground; a third transistor having a drain connected to the gate of the synchronous rectifier and a source connected to the reference ground; a fourth transistor having a drain connected to the drain or the source of the synchronous rectifier and a source connected to a gate of the third transistor; a fifth transistor having a drain connected to the gate of the third transistor and a source connected to the reference ground; and a control circuit connected to a gate of the first transistor, a gate of the second transistor, a gate of the fourth transistor and a gate of the fifth transistor. In another aspect, the synchronous rectifier driver circuit drives the gate of the synchronous rectifier to the one or more first voltages by: turning the first transistor from ON to OFF; turning the second transistor from OFF to ON; turning the fourth transistor from OFF to ON; and turning the fifth transistor from ON to OFF. In another aspect, the synchronous rectifier driver circuit drives the gate of the synchronous rectifier to the second voltage by turning the third transistor from OFF to ON. In another aspect, the synchronous rectifier driver circuit includes or does not include a time delay circuit. In another aspect, the control circuit is further connected to a modulation signal. In another aspect, the first transistor, the second transistor, the one-way current switch, the third transistor, the fourth transistor, the fifth transistor and the control circuit are formed in or on silicon, silicon carbide, gallium nitride, gallium oxide, or gallium arsenide.

In another aspect, the synchronous rectifier is controlled using a synchronous rectifier driver circuit including: a first transistor having a drain connected to the gate of the synchronous rectifier; a second transistor having a drain connected to the gate of the synchronous rectifier and a body connected to a reference ground; a third transistor having a drain connected to a source of the second transistor, and a body and a drain connected to the reference ground; a fourth transistor having a drain connected to the gate of the synchronous rectifier, a gate connected to a source of the second transistor and a source connected to the reference ground; a fifth transistor having a drain connected to the gate of the synchronous rectifier and a source connected to the reference ground; a sixth transistor having a drain connected to the drain or the source of the synchronous rectifier and a source connected to the gate of the fifth transistor; a one-way current switch connected from a source to the drain of the sixth transistor; a seventh transistor having a drain connected to the gate of the fifth transistor and a source connected to the reference ground; an inverter having an output connected to the gates of the first transistor, the second transistor and the sixth transistor; and a control signal connected to an input of the inverter and the gates of the third transistor and seventh transistor.

In another aspect, the synchronous rectifier is controlled using a synchronous rectifier driver circuit including: a first transistor having a drain connected to the gate of the synchronous rectifier; a second transistor having a drain connected to the gate of the synchronous rectifier; a first one-way current switch connecting a source of the second transistor to a reference ground; a third transistor having a drain connected to the gate of the synchronous rectifier and a source connected to the reference ground; a fourth transistor having a drain connected to the drain or the source of the synchronous rectifier; a second one-way current switch connected from a source to the drain of the fourth transistor; an amplifier having a positive terminal connected to the source of the fourth transistor, a negative terminal connected to a voltage, and an output connected to the gate of the third transistor; a fifth transistor having a drain connected to the gate of the third transistor and a source connected to the reference ground; an inverter having an output connected to the gates of the first transistor, the second transistor, an enable terminal of the amplifier and the fourth transistor; and a control signal connected to an input of the inverter and the gate of the fifth transistor.

In another aspect, the synchronous rectifier is controlled using a synchronous rectifier driver circuit including: a first transistor having a drain connected to the gate of the synchronous rectifier; a second transistor having a drain connected to the gate of the synchronous rectifier; a first one-way current switch connected to a source of the second transistor; a fourth transistor having a drain connected to the gate of the synchronous rectifier, a gate connected to the first one-way current switch and a source connected to a reference ground; a second one-way current switch connected between a voltage and the gate of the fourth transistor; a fifth transistor having a drain connected to the gate of the fourth transistor and a source connected to the reference ground; a sixth transistor having a drain connected to the gate of the synchronous rectifier and a source connected to the reference ground; a seventh transistor having a drain connected to the drain or the source of the synchronous rectifier; a third one-way current switch connected from a source to the drain of the seventh transistor; an inverter having an output connected to the gates of the first transistor, the second transistor and the seventh transistor; and a control signal connected to an input of the inverter and the gate of the fifth transistor, the gate of the sixth transistor and the source of the seventh transistor.

In another aspect, the synchronous rectifier is controlled using a synchronous rectifier driver circuit including: a first transistor having a drain connected to the gate of the synchronous rectifier; a second transistor having a drain connected to the gate of the synchronous rectifier; a first one-way current switch connecting a source of the second transistor to a reference ground; a third transistor having a drain connected to the gate of the synchronous rectifier and a source connected to the reference ground; a fourth transistor having a drain connected to the drain or the source of the synchronous rectifier; a second one-way current switch connected from a source to the drain of the fourth transistor; a fifth transistor having a drain connected to the gate of the third transistor and a source connected to the reference ground; a sixth transistor having a drain connected to the source of the first transistor, a gate connected to the source of the fourth transistor and a source connected to a gate of the third transistor; an inverter having an output connected to the gates of the first transistor, the second transistor, and the fourth transistor; and a control signal connected to an input of the inverter and the gate of the fifth transistor.

In another aspect, the synchronous rectifier is controlled using a synchronous rectifier driver circuit including: a first transistor having a drain connected to the gate of the synchronous rectifier; a second transistor having a drain connected to the gate of the synchronous rectifier; a one-way current switch connecting a source of the second transistor to a reference ground; a third transistor having a body diode, a drain connected to the gate of the synchronous rectifier and a source connected to the reference ground; a fourth transistor having a drain connected to the drain or the source of the synchronous rectifier and a source connected to the gate of the third transistor; a fifth transistor having a drain connected to the gate of the third transistor and a source connected to the reference ground; an inverter having an output connected to the gates of the first transistor, the second transistor, an enable terminal of the amplifier and the fourth transistor; and a control signal connected to an input of the inverter and the gate of the fifth transistor.

Figure 16:
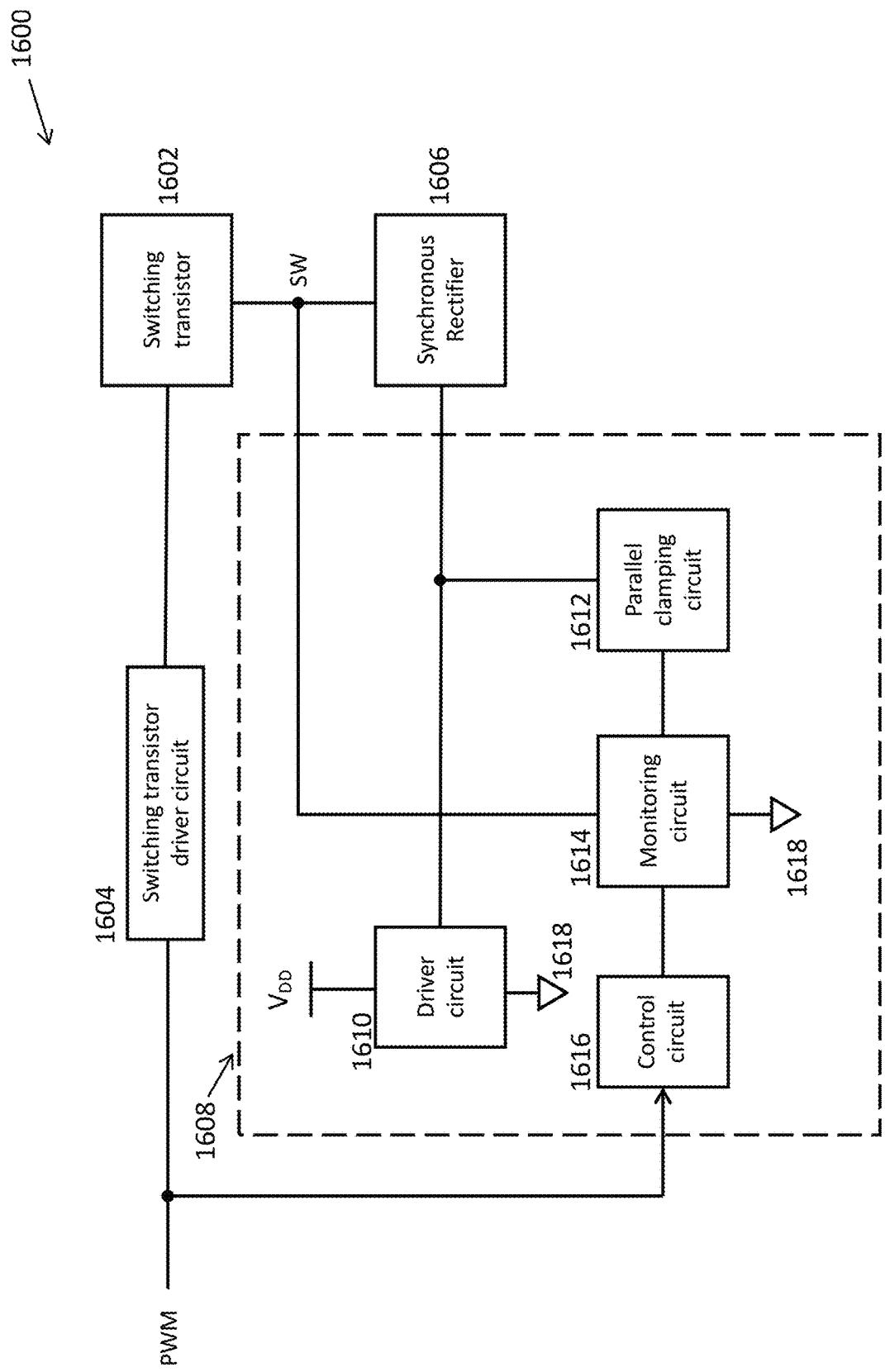
FIG. 16 shows an embodiment of the present invention, a block diagram of a power converter.

FIG. 16 shows an embodiment of the present invention, a power converter 1600. The power converter 1600 includes a switching transistor 1602, a switching transistor driver circuit 1604 connected to a gate of the switching transistor 1602, a synchronous rectifier 1606 connected to the switching transistor 1602. Pin SW is connected to the source or drain of the synchronous rectifier 1606. A synchronous rectifier driver circuit 1608 is connected to a gate of the synchronous rectifier 1606 and the source or drain of the synchronous rectifier 1606. The synchronous rectifier driver circuit 1608 is configured to: (1) turn the synchronous rectifier 1606 OFF by driving the gate of the synchronous rectifier 1606 to one or more first voltages that are non-zero; (2) monitor one or more values of the drain or the source of the synchronous rectifier 1606; and (3) drive the gate of the synchronous rectifier 1606 to a second voltage that is less than the one or more first voltages whenever the one or more values of the drain or the source of the synchronous rectifier 1606 pass above or below one or more threshold values. The synchronous rectifier driver circuit 1608 reduces or eliminates current or voltage transients in the power converter 1600. In some embodiment, the one or more first voltages can be less than a threshold voltage of the synchronous rectifier 1606. In other embodiments, the one or more first voltages can be greater than or equal to the threshold voltage of the synchronous rectifier. The one or more first voltages comprise a set of descending stair-step values, or a set of descending values forming a ramp or a curve. The second voltage can be equal to zero volts, or less than zero volts, e.g., −1 volts, −2 volts or an incremental value between 0 and −2 volts or more. In some embodiments, the gate of the switching transistor 1602 is not monitored or used to control the gate of the synchronous rectifier. In one aspect, the one or more values can be a voltage, a change in the voltage, a current, a change in the current, or a combination of the voltage, the change in the voltage, the current or the change in the current of the drain or the source of the synchronous rectifier.

In other embodiments, the one or more threshold values or a delay in driving the gate of the synchronous rectifier 1606 to the second voltage are adjusted using a predictive feedback process. Since most switching regulators and intelligent motion drivers are periodic, the loop can be adjusted by increasing or decreasing phase delay. The current, voltage, rate of change of the current or voltage, or a combination thereof can be sampled and stored to be used for the next cycle. This can also be used as a running average over several previous cycles. This predictive feedback process can sample and store the one or more values of the gate, the drain or the source of the synchronous rectifier, and use the stored values of the gate, the drain or the source of the synchronous rectifier to adjust the one or more threshold values.

In addition to sensing the drain or source synchronous rectifier 1606, the switching transistor can be sensed as well. This predictive feedback process can sample and store the one or more values of the gate, the drain or the source of the synchronous rectifier and a switching transistor connected to the synchronous rectifier, and use the stored values of the gate, the drain or the source of the synchronous rectifier and the switching transistor to adjust the one or more threshold values.

In another embodiment, the closed loop system can be put on a delay to turn off the synchronous rectifier 1606. This can be increased or decreased in the same manner by sampling the current, voltage or rate of change and adjusting time delay appropriately. This predictive feedback process can sample and store the one or more values of the gate, the drain or the source of the synchronous rectifier, and use the stored values of the gate, the drain or the source of the synchronous rectifier to adjust the delay in driving the gate of the synchronous rectifier to the second voltage. Similarly, this predictive feedback process can sample and store the one or more values of the gate, the drain or the source of the synchronous rectifier and a switching transistor connected to the synchronous rectifier, and use the stored values of the gate, the drain or the source of the synchronous rectifier and the switching transistor to adjust the delay in driving the gate of the synchronous rectifier to the second voltage. Note that combinations of the previously describe predictive feedback processes can be used As shown in FIG. 16, the synchronous rectifier driver circuit 1608 includes a driver circuit 1610 connected to the gate of the synchronous rectifier 1606, a parallel clamping circuit 1612 connected to the gate of the synchronous rectifier 1606, a monitoring or sensing circuit connected to the drain or the source of the synchronous rectifier 1606 and the parallel clamping circuit 1612, and a control circuit 1616 connected to the driver circuit 1610 and the monitoring or sensing circuit 1614. The synchronous rectifier driver circuit 1608 may or may not include a time delay circuit as previously described.

Figure 17:
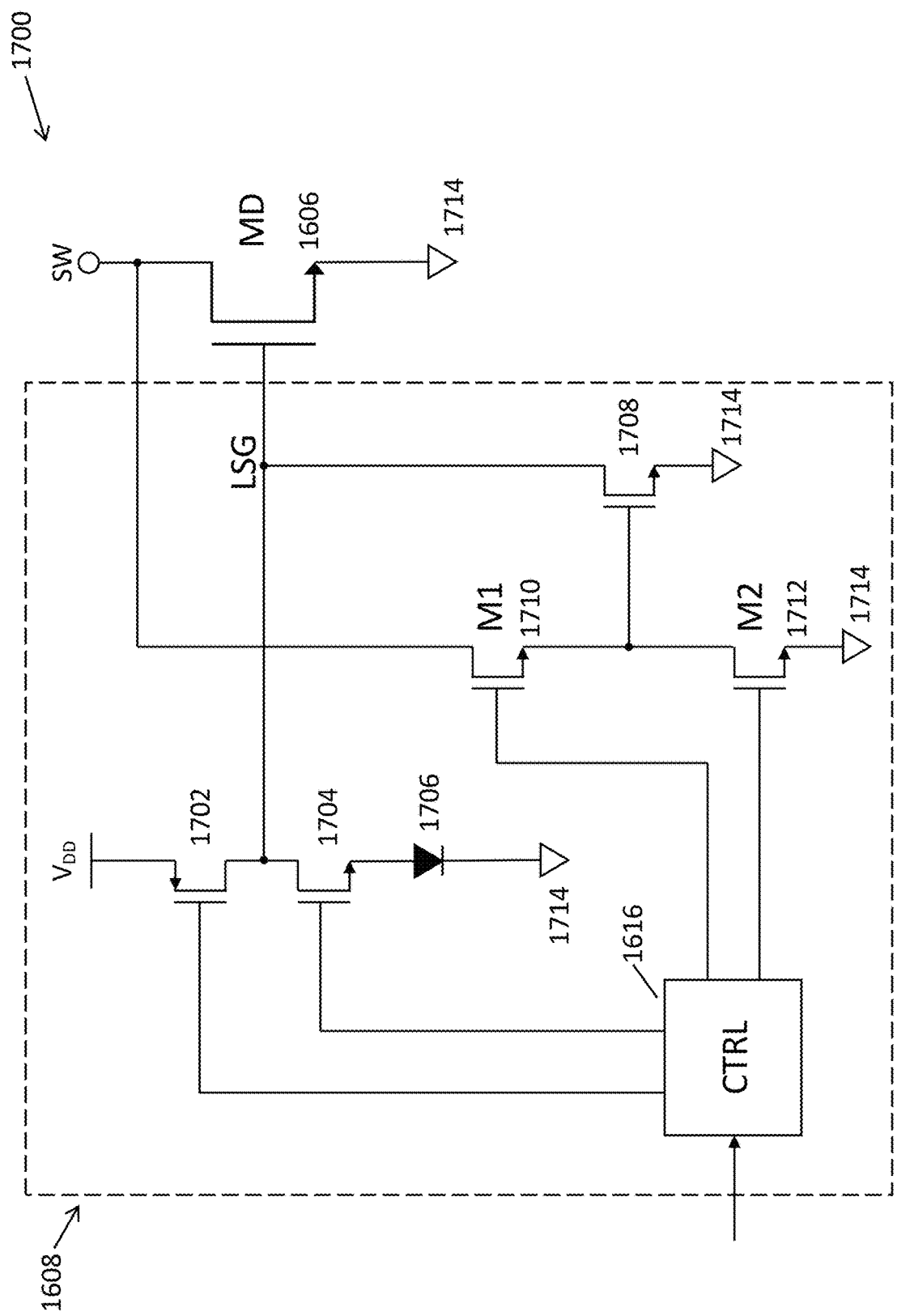
FIG. 17 shows an embodiment of the present invention, a schematic diagram of a synchronous rectifier driver circuit.

In some embodiments, such as FIG. 17, the driver circuit 1610 includes a first transistor 1702 having a gate connected to the control circuit 1616 and a drain connected to the gate of the synchronous rectifier 1606, a second transistor 1704 having a drain connected to the gate of the synchronous rectifier 1606 and a gate connected to the control circuit 1616, and a one-way current switch 1706 connected to a source of the second transistor. The one-way current switch 1706 can be a diode, a MOS connected diode, an attenuated MOS connected diode, a current controlled scaled down power FET with low impedance buffer, made from a power FET, or a low impedance buffered voltage reference, etc. The parallel clamping circuit 1612 includes a third transistor 1708 having a drain connected to the gate of the synchronous rectifier 1606, a gate connected to the monitoring circuit 1614 and a source connected to a reference ground 1618. The monitoring or sensing circuit 1614 includes a fourth transistor M1 1710 having a drain connected to the drain or the source of the synchronous rectifier 1606, a gate connected to the control circuit 1616 and a source connected to the parallel clamping circuit 1612, and a fifth transistor M2 1712 having a drain connected to the parallel clamping circuit 1612 and a gate connected to the control circuit 1616. The control circuit 1616 is further connected to a modulation signal PWM. The driver circuit 1610, the parallel clamping circuit 1612, the monitoring circuit 1614 and the control circuit 1616 can be formed in or on silicon, silicon carbide, gallium nitride, gallium oxide, or gallium arsenide.

FIG. 17 shows an embodiment of the present invention, a schematic diagram of a circuit 1700 for controlling a synchronous rectifier MD 1606 having a source or a drain connected to a switching transistor (see FIG. 16) and pin SW. The synchronous rectifier driver circuit 1608 includes: a first transistor 1705 having a drain connected to the gate LSG of the synchronous rectifier MD 1606; a second transistor 1704 having a drain connected to the gate LSG of the synchronous rectifier MD 1606; a one-way current switch 1706 connected between a source of the second transistor 1704 and a reference ground 1714; a third transistor 1708 having a drain connected to the gate LSG of the synchronous rectifier 1606 and a source connected to the reference ground 1714; a fourth transistor M1 1710 having a drain connected to the drain or the source of the synchronous rectifier MD 1606 and a source connected to a gate of the third transistor 1708; a fifth transistor M2 1712 having a drain connected to the gate of the third transistor 1708 and a source connected to the reference ground 1714; and a control circuit 1616 connected to a gate of the first transistor 1702, a gate of the second transistor 1704, a gate of the fourth transistor M1 1710 and a gate of the fifth transistor M2 1712.

The synchronous rectifier driver circuit 1608 drives the gate of the synchronous rectifier MD 1606 to the one or more first voltages by: turning the first transistor 1702 from ON to OFF; turning the second transistor 1704 from OFF to ON; turning the fourth transistor M1 1710 from OFF to ON; and turning the fifth transistor M2 1712 from ON to OFF. The synchronous rectifier driver circuit 1608 drives the gate of the synchronous rectifier MS 1606 to the second voltage by turning the third transistor 1708 from OFF to ON when a positive voltage is observed on the SW pin. The synchronous rectifier driver circuit 1608 may or may not include a time delay circuit. In addition, the control circuit 1616 is further connected to a modulation signal. The first transistor, the second transistor, the one-way current switch, the third transistor, the fourth transistor, the fifth transistor and the control circuit can be formed in or on silicon, silicon carbide, gallium nitride, gallium oxide, or gallium arsenide.

Figure 18:
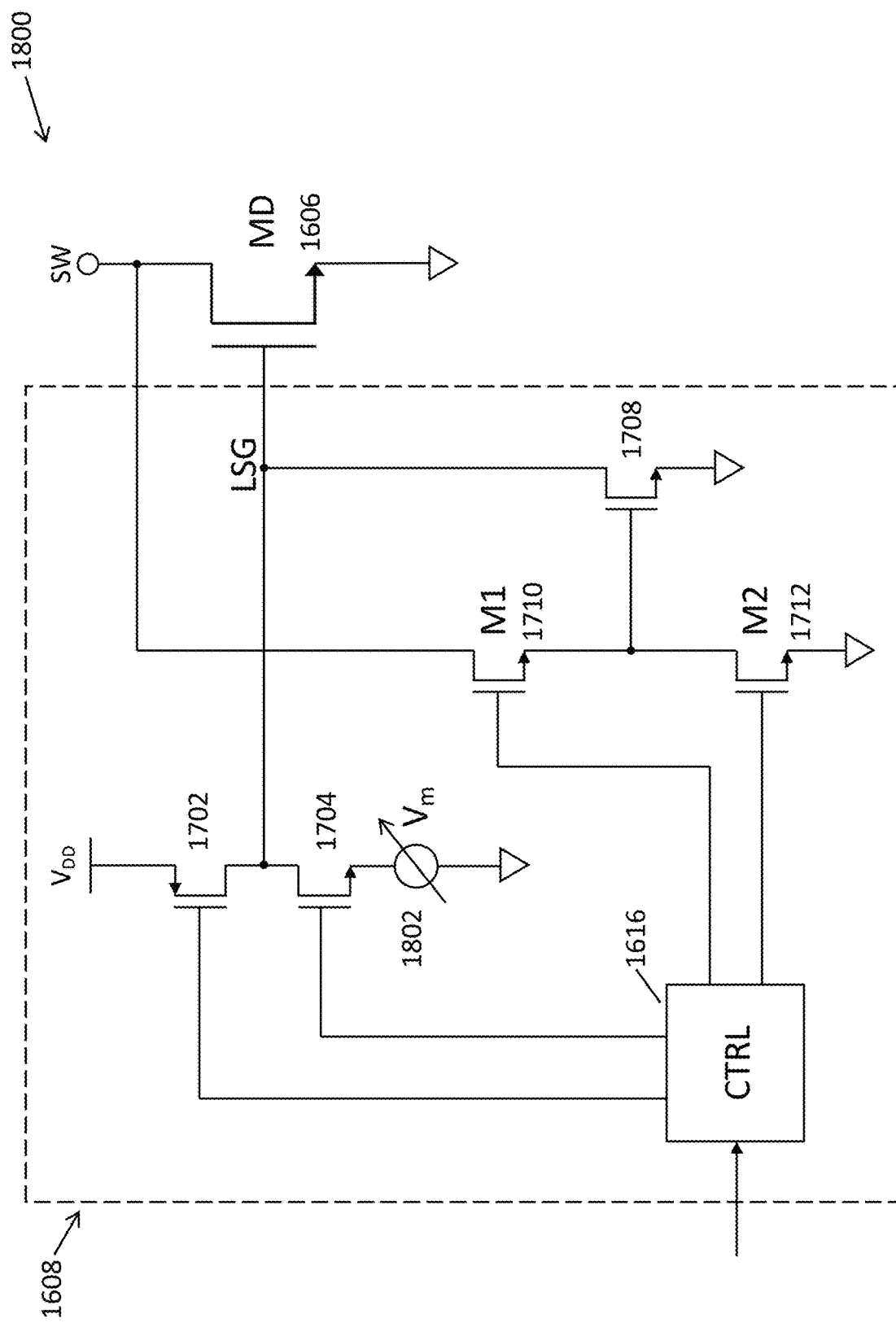
FIG. 18 shows an embodiment of the present invention, a schematic diagram of a synchronous rectifier driver circuit.

FIG. 18 shows an embodiment of the present invention, a schematic diagram of a circuit 1800 for controlling a synchronous rectifier MD 1606 connected to switching transistor (see FIG. 16) and pin SW. The synchronous rectifier driver circuit 1608 includes: a first transistor 1705 having a drain connected to the gate LSG of the synchronous rectifier MD 1606; a second transistor 1704 having a drain connected to the gate LSG of the synchronous rectifier MD 1606; a circuit 1802 for dynamically adjusting a turn off voltage for the synchronous rectifier MD 1606 (see e.g., FIGS. 12-14) is connected between a source of the second transistor 1704 and a reference ground 1714; a third transistor 1708 having a drain connected to the gate LSG of the synchronous rectifier 1606 and a source connected to the reference ground 1714; a fourth transistor M1 1710 having a drain connected to the drain or the source of the synchronous rectifier MD 1606 and a source connected to a gate of the third transistor 1708; a fifth transistor M2 1712 having a drain connected to the gate of the third transistor 1708 and a source connected to the reference ground 1714; and a control circuit 1616 connected to a gate of the first transistor 1702, a gate of the second transistor 1704, a gate of the fourth transistor M1 1710 and a gate of the fifth transistor M2 1712.

Figure 19:
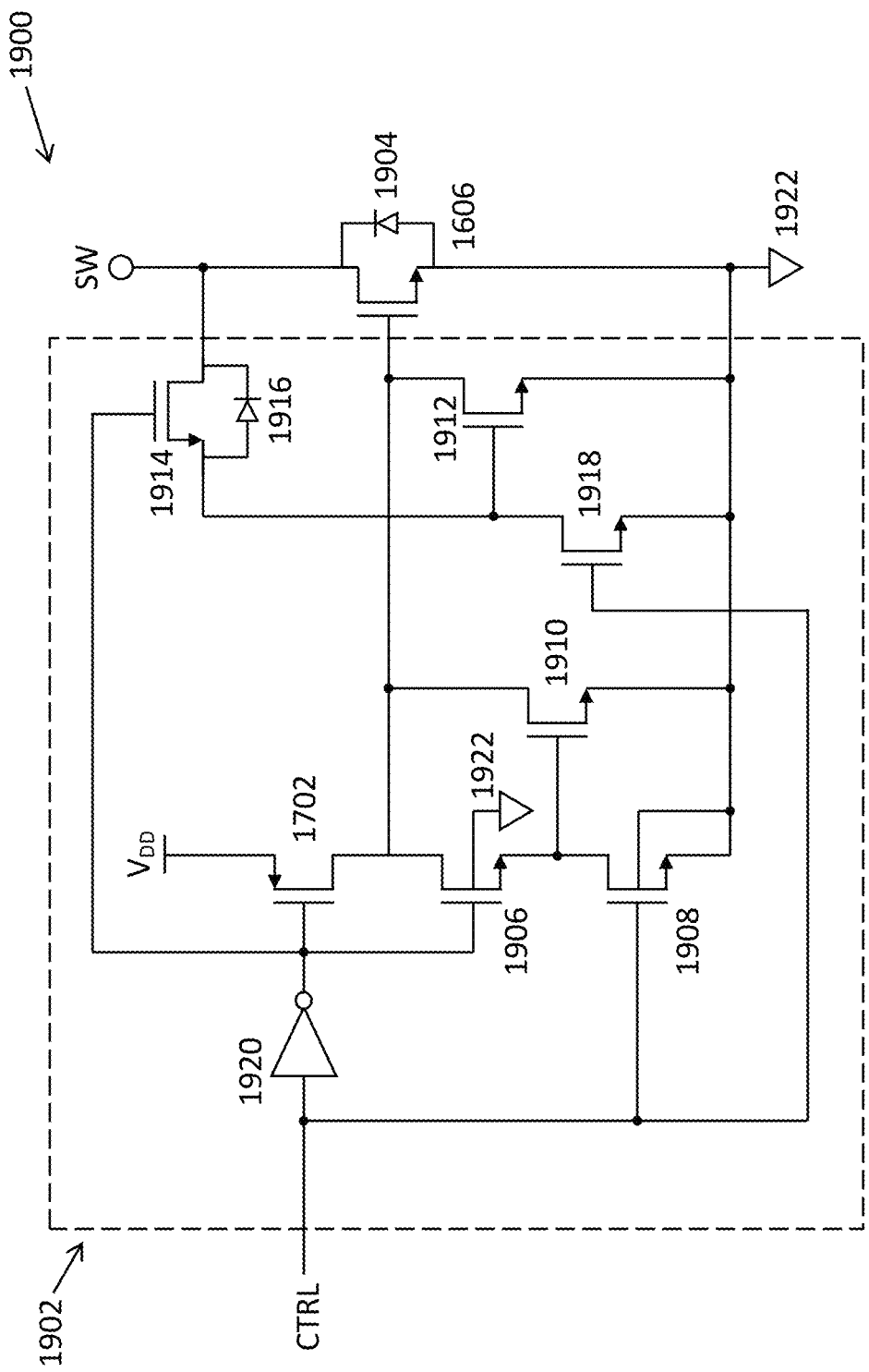
FIG. 19 shows an embodiment of the present invention, a schematic diagram of a synchronous rectifier driver circuit.

FIG. 19 shows an embodiment of the present invention, a schematic diagram 1900 of a synchronous rectifier driver circuit 1902 connected to a synchronous rectifier 1606 having a body diode 1904. The synchronous rectifier driver circuit 1902 includes: a first transistor 1702 having a drain connected to the gate of the synchronous rectifier 1606; a second transistor 1906 having a drain connected to the gate of the synchronous rectifier 1606 and a body connected to a reference ground 1922; a third transistor 1908 having a drain connected to a source of the second transistor 1906, and a body and a drain connected to the reference ground 1922; a fourth transistor 1910 having a drain connected to the gate of the synchronous rectifier 1606, a gate connected to a source of the second transistor 1906 and a source connected to the reference ground 1922; a fifth transistor 1912 having a drain connected to the gate of the synchronous rectifier 1606 and a source connected to the reference ground 1922; a sixth transistor 1914 having a body diode 1916, a drain connected to the drain or the source of the synchronous rectifier 1606 and a source connected to the gate of the fifth transistor 1912; a seventh transistor 1918 having a drain connected to the gate of the fifth transistor 1912 and a source connected to the reference ground 1922; an inverter 1920 having an output connected to the gates of the first transistor 1702, the second transistor 1906 and the sixth transistor 1914; and a control signal CTRL connected to the input of the inverter 1920 and the gates of the third transistor 1908 and seventh transistor 1918.

Figure 20:
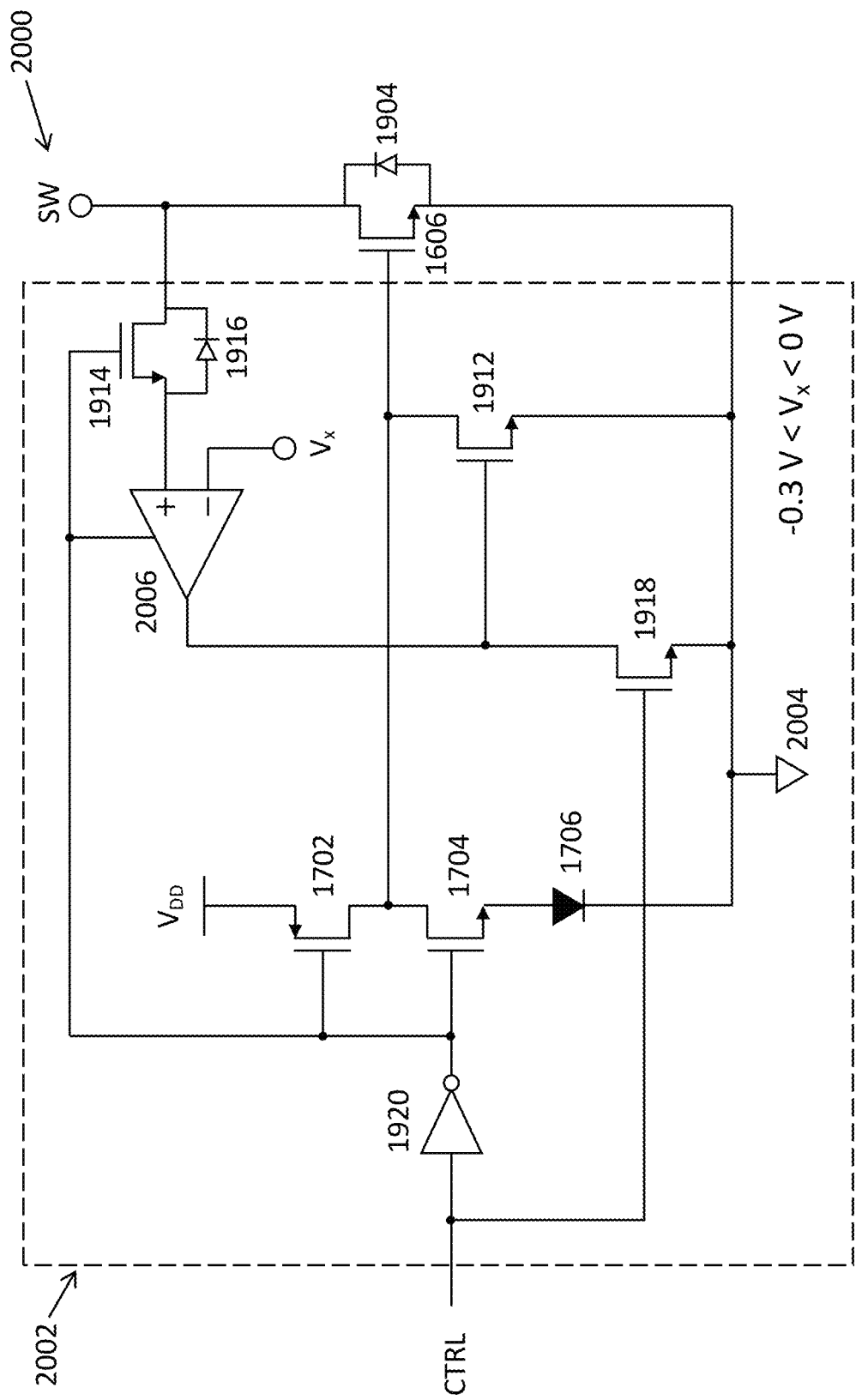
FIG. 20 shows an embodiment of the present invention, a schematic diagram of a synchronous rectifier driver circuit.

FIG. 20 shows an embodiment of the present invention, a schematic diagram 2000 of a synchronous rectifier driver circuit 2002 connected to a synchronous rectifier 1606 having a body diode 1904. The synchronous rectifier driver circuit 2002 includes: a first transistor 1702 having a drain connected to the gate of the synchronous rectifier 1606; a second transistor 1704 having a drain connected to the gate of the synchronous rectifier 1606; a one-way current switch 1706 connecting a source of the second transistor 1704 to a reference ground 2004; a third transistor 1912 having a drain connected to the gate of the synchronous rectifier 1606 and a source connected to the reference ground 2004; a fourth transistor 1914 having a body diode 1916 and a drain connected to the drain or the source of the synchronous rectifier 1606; an amplifier 2006 having a positive terminal (+) connected to the source of the fourth transistor 1914, a negative terminal (−) connected to a voltage $V_x$ ($-0.3$ V$<V_x<0$ V); and an output connected to the gate of the third transistor 1912; a fifth transistor 1918 having a drain connected to the gate of the third transistor 1912 and a source connected to the reference ground 2004; an inverter 1920 having an output connected to the gates of the first transistor 1702, the second transistor 1704, an enable terminal of the amplifier 2006 and the fourth transistor 1914; and a control signal CTRL connected to an input of the inverter 1920 and the gate of the fifth transistor 1918.

Figure 21:
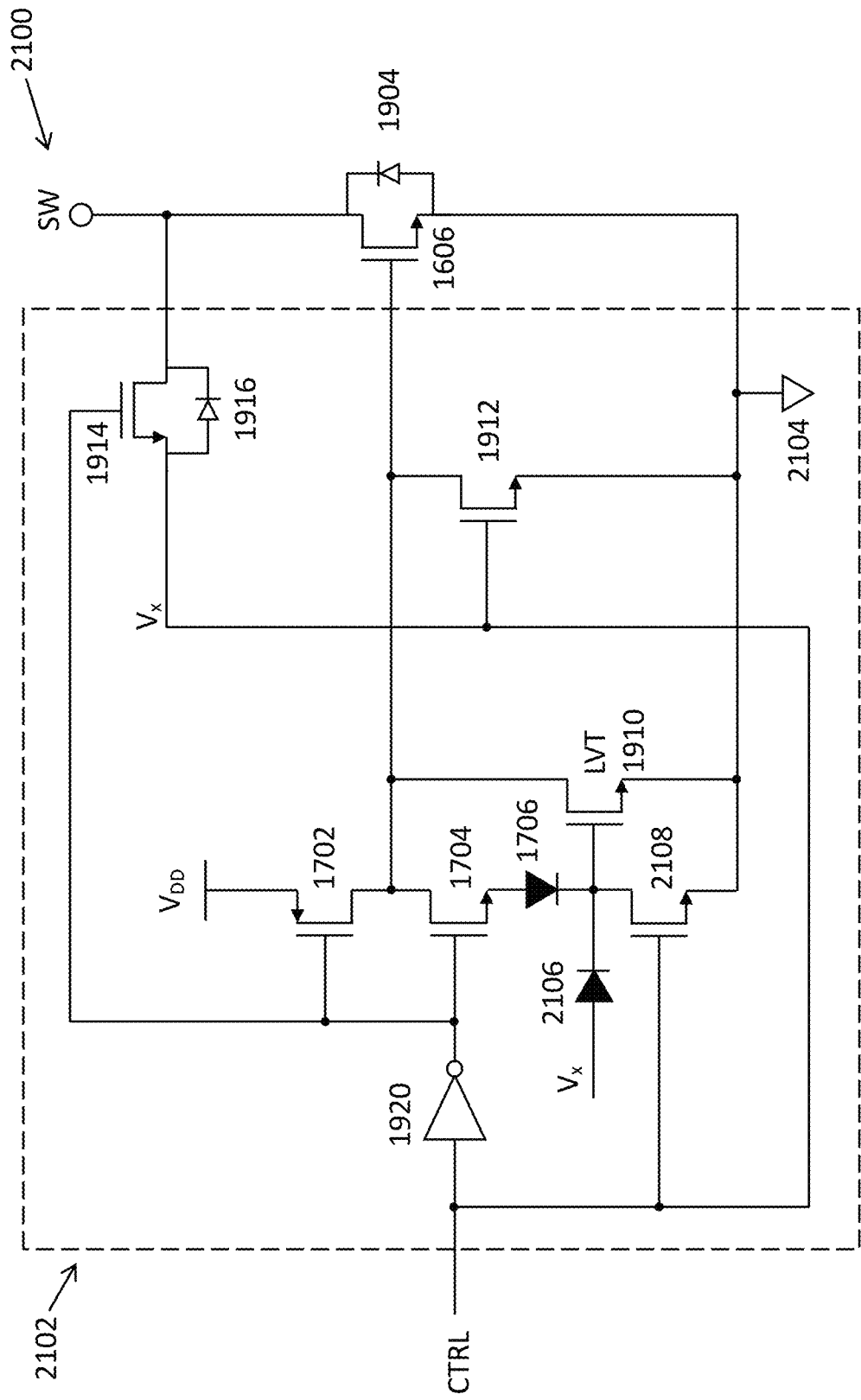
FIG. 21 shows an embodiment of the present invention, a schematic diagram of a synchronous rectifier driver circuit.

FIG. 21 shows an embodiment of the present invention, a schematic diagram 2100 of a synchronous rectifier driver circuit 2102 connected to a synchronous rectifier 1606 having a body diode 1904. The synchronous rectifier driver circuit 2102 includes: a first transistor 1702 having a drain connected to the gate of the synchronous rectifier 1606; a second transistor 1704 having a drain connected to the gate of the synchronous rectifier 1606; a first one-way current switch 1706 connected to a source of the second transistor 1704; a fourth transistor 1910 having a drain connected to the gate of the synchronous rectifier 1606, a gate connected to the first one-way current switch 1706 and a source connected to a reference ground 2104; a second one-way current switch 2106 connected between a voltage $V_x$ and the gate of the fourth transistor 1910; a fifth transistor 2108 having a drain connected to the gate of the fourth transistor 1910 and a source connected to the reference ground 2104; a sixth transistor 1912 having a drain connected to the gate of the synchronous rectifier 1606 and a source connected to the reference ground 2104; a seventh transistor 1914 having a body diode 1916 and a drain connected to the drain or the source of the synchronous rectifier 1606; an inverter 1920 having an output connected to the gates of the first transistor 1702, the second transistor 1704 and the seventh transistor 1914; and a control signal CTRL connected to an input of the inverter 1920 and the gate of the fifth transistor 2108, the gate of the sixth transistor 1912 and the source of the seventh transistor 1914.

Figure 22:
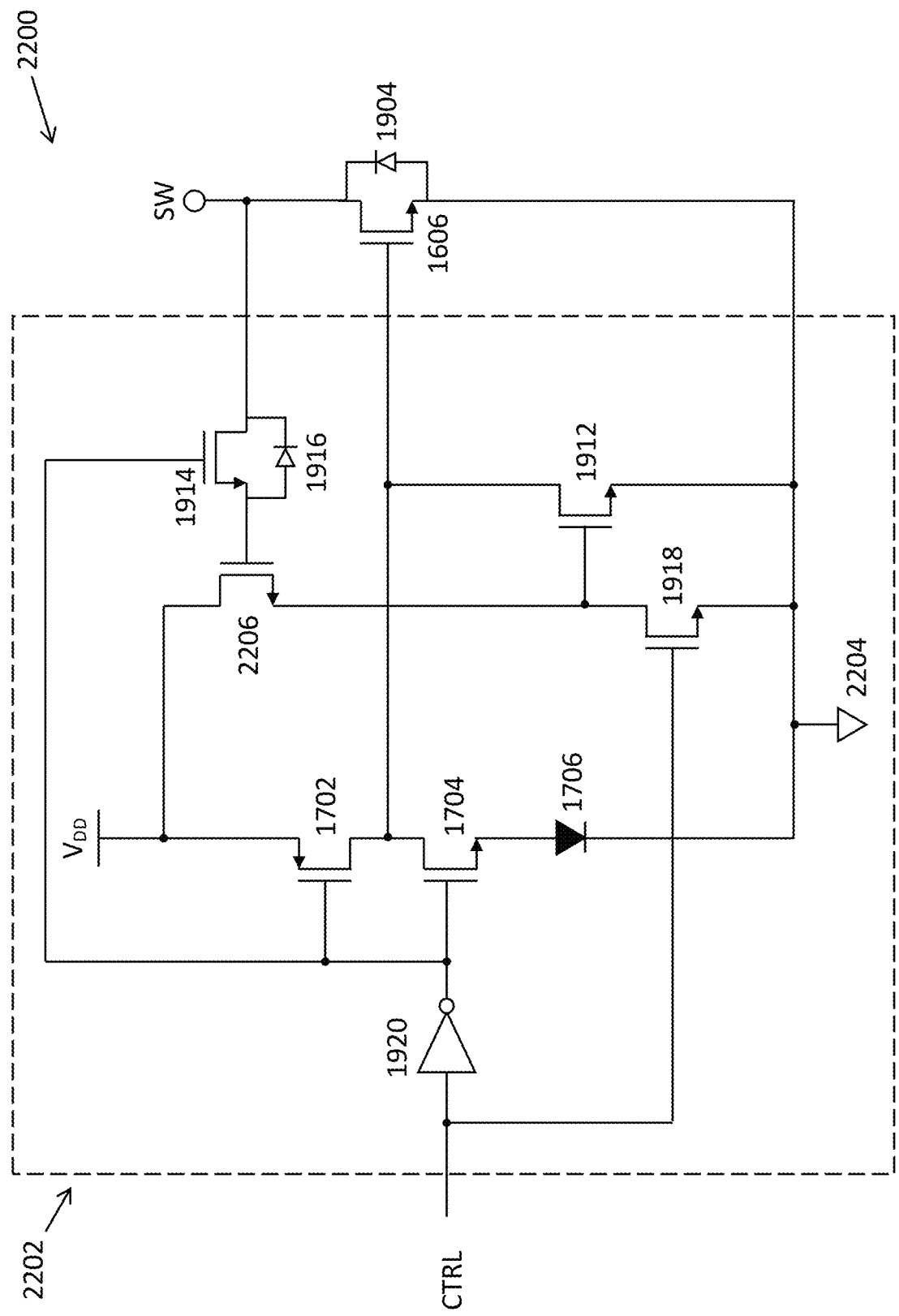
FIG. 22 shows an embodiment of the present invention, a schematic diagram of a synchronous rectifier driver circuit.

FIG. 22 shows an embodiment of the present invention, a schematic diagram 2200 of a synchronous rectifier driver circuit 2202 connected to a synchronous rectifier 1606 having a body diode 1904. The synchronous rectifier driver circuit 2202 includes: a first transistor 1702 having a drain connected to the gate of the synchronous rectifier 1606; a second transistor 1704 having a drain connected to the gate of the synchronous rectifier 1606; a one-way current switch 1706 connecting a source of the second transistor 1704 to a reference ground 2204; a third transistor 1912 having a drain connected to the gate of the synchronous rectifier 1606 and a source connected to the reference ground 2204; a fourth transistor 1914 having a body diode 1916 and a drain connected to the drain or the source of the synchronous rectifier 1606; a fifth transistor 1918 having a drain connected to the gate of the third transistor 1912 and a source connected to the reference ground 2204; a sixth transistor 2206 having a drain connected to the source of the first transistor 1702, a gate connected to the source of the fourth transistor 1914 and a source connected to a gate of the third transistor 1912; an inverter 1920 having an output connected to the gates of the first transistor 1702, the second transistor 1704, and the fourth transistor 1914; and a control signal CTRL connected to an input of the inverter 1920 and the gate of the fifth transistor 1918.

Figure 23:
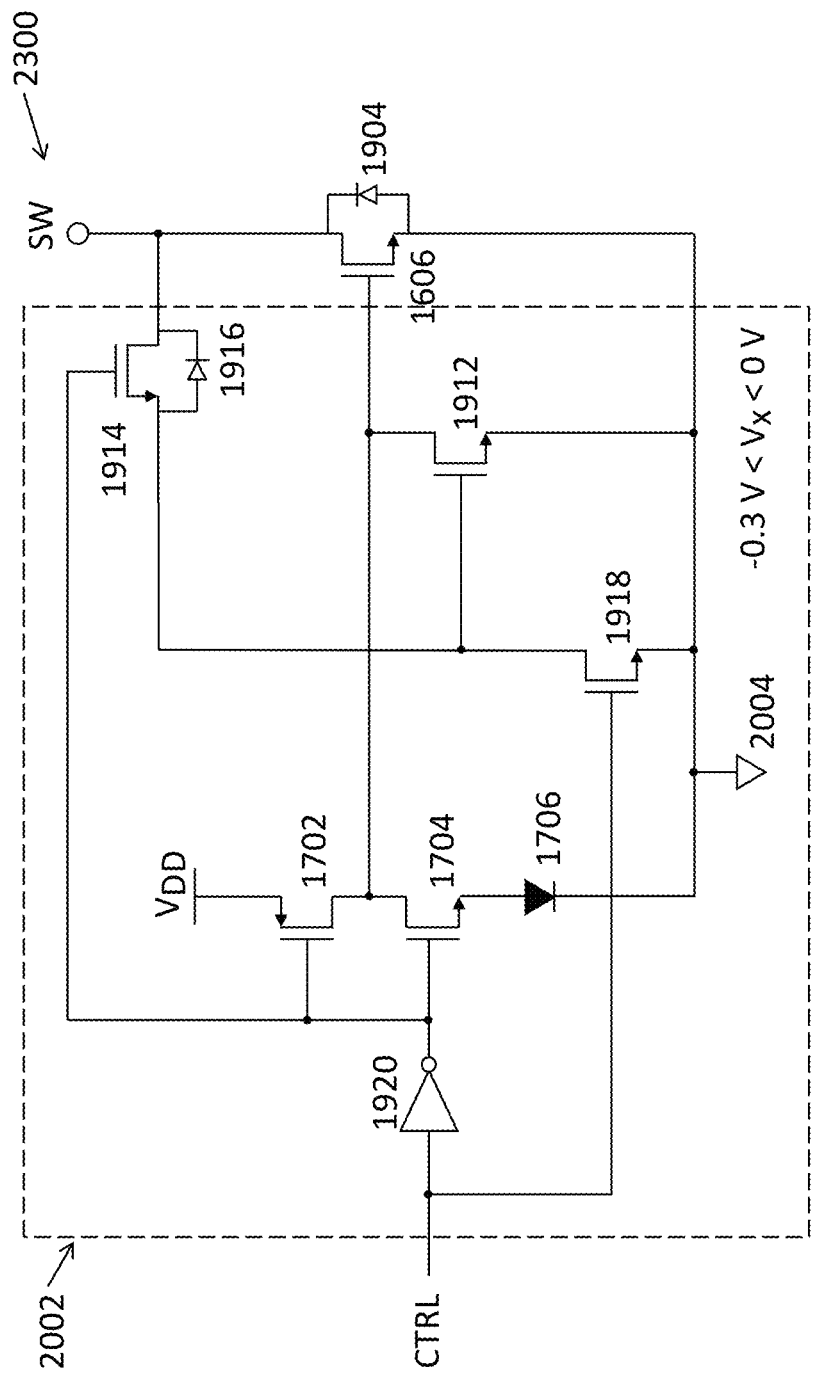
FIG. 23 shows an embodiment of the present invention, a schematic diagram of a synchronous rectifier driver circuit.

FIG. 23 shows an embodiment of the present invention, a schematic diagram 2300 of a synchronous rectifier driver circuit 2002 connected to a synchronous rectifier 1606 having a body diode 1904. The synchronous rectifier driver circuit 2002 includes: a first transistor 1702 having a drain connected to the gate of the synchronous rectifier 1606; a second transistor 1704 having a drain connected to the gate of the synchronous rectifier 1606; a first one-way current switch 1706 connecting a source of the second transistor 1704 to a reference ground 2004; a third transistor 1912 having a drain connected to the gate of the synchronous rectifier 1606 and a source connected to the reference ground 2004; a fourth transistor 1914 having a body diode 1916, a drain connected to the drain or the source of the synchronous rectifier 1606, a source connected to the gate of the third transistor 1912; a fifth transistor 1918 having a drain connected to the gate of the third transistor 1912 and a source connected to the reference ground 2004; an inverter 1920 having an output connected to the gates of the first transistor 1702, the second transistor 1704, an enable terminal of the amplifier 2006 and the fourth transistor 1914; and a control signal CTRL connected to an input of the inverter 1920 and the gate of the fifth transistor 1918.

The synchronous rectifier driver circuits shown FIGS. 16-23 can be operated using the method described in reference to FIG. 15. Note also that the operation of the synchronous rectifier driver circuits shown in FIGS. 18-23 is similar to that described in reference to FIG. 17. In addition, the synchronous rectifier driver circuits shown FIGS. 16-23 can be use to drive synchronous rectifiers within any power supply or power converter.

Figure 24:
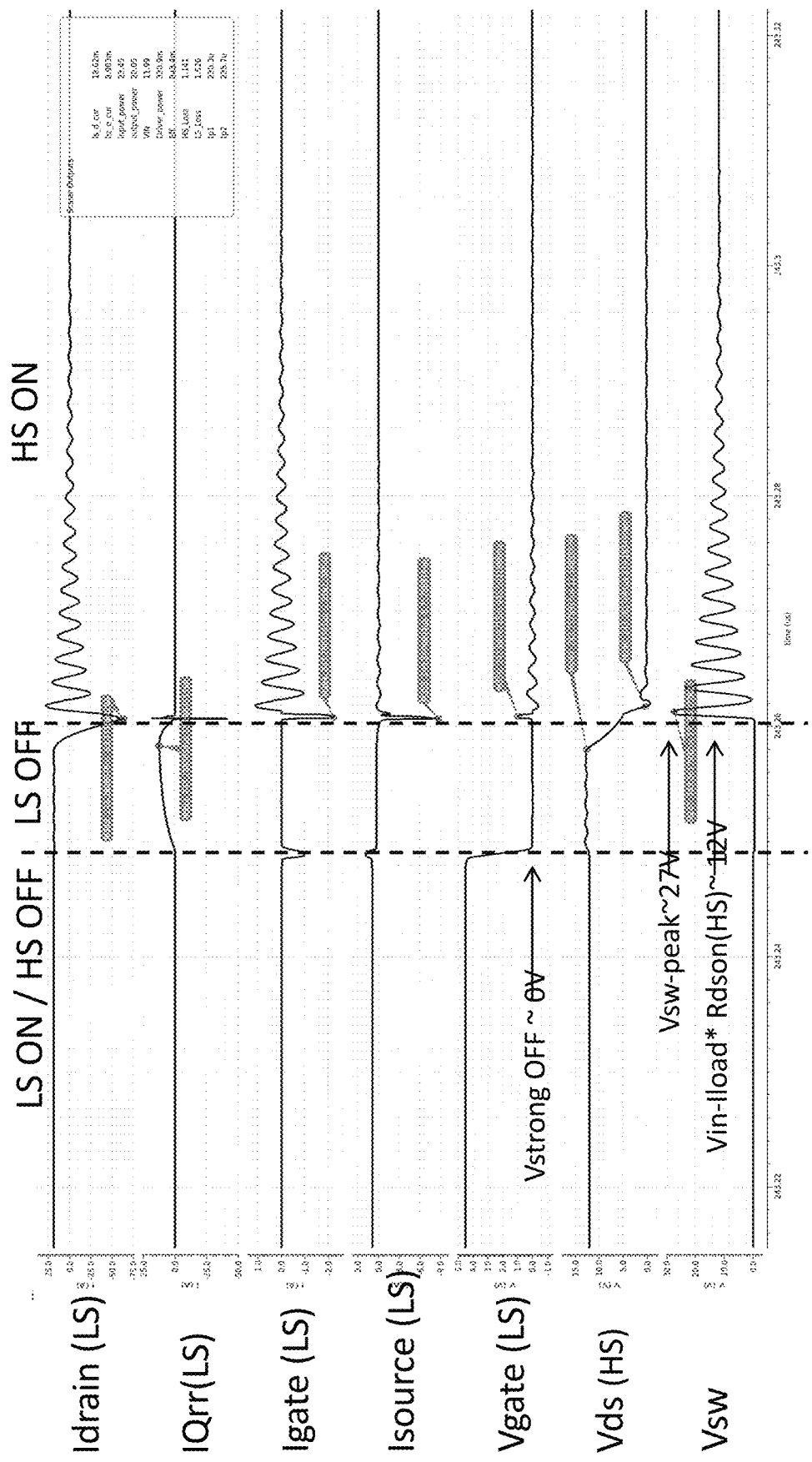
FIG. 24 depicts signal diagrams of a buck switching regulator in accordance with the prior art.
Figure 25:
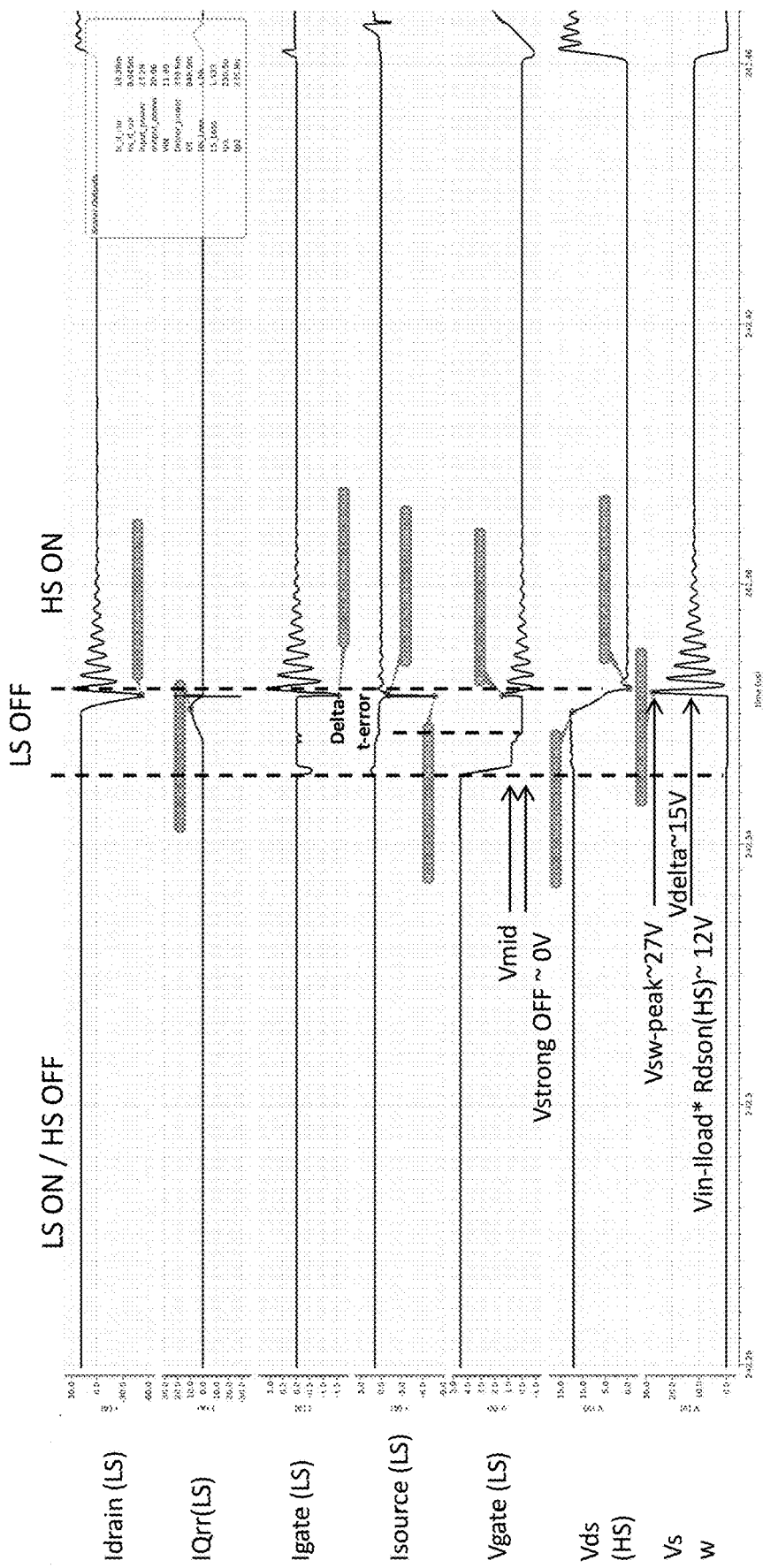
FIG. 25 depicts signal diagrams of a buck switching regulator in accordance with the prior art.
Figure 26:
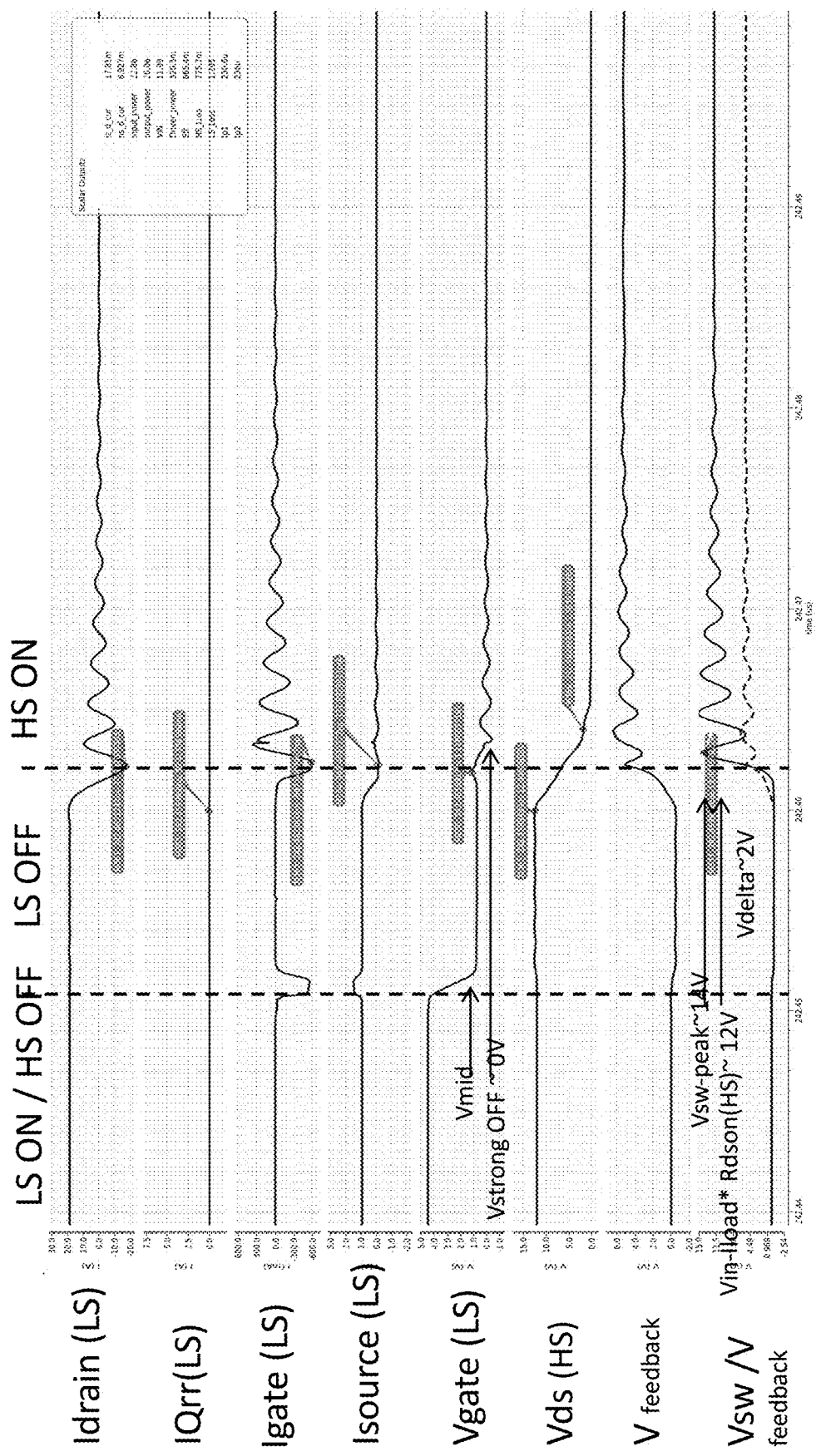
FIG. 26 depicts signal diagrams of a buck switching regulator in accordance with the present invention using an active feedback circuit.

FIGS. 24-26 depict various non-limiting signal diagrams of a buck switching regulator. In each simulation, a Vin of 12V, Vout of 1V, Iload of 20A and a switching frequency of 1 Mhz was run. The mode of operation that is depicted in the waveforms is where the output requires charging therefore, the low side needs to turn off and the high-side turn on. The three phases of this are: (1) low-side ON/high-side OFF then low-side goes from ON to OFF; (2) low-side OFF; and finally (3) high-side ON. To maintain high efficiency, phase 2 is a very short period, typically ranging from 2 ns to 10 ns.

FIG. 24 depicts signal diagrams of a buck switching regulator in accordance with the prior art. FIG. 24 shows that during phase 2 the Vgate (LS) goes immediately from ON to strong OFF. Once this happens it will cause a build-up of charge in the low-side body diode, as depicted in $Q_{rr}$(LS). Due to inherent parasitics in the power lines the switch voltage translates this larger current spike into a large voltage spike on the switch pin, as depicted on $V_{sw}$ waveform, which is noted as Vdelta and in this case is 15V. In this example, the breakdown voltage of the low-side has been met. In order to avoid this, it would require a low-side switch to have a breakdown voltage in excess of 27V. A larger breakdown voltage low side will translate to inefficiencies in conduction loss or die area penalty.

FIG. 25 depicts signal diagrams of a buck switching regulator in accordance with the prior art. FIG. 25 shows that during phase 2 for Vgate (LS), vmid voltage and Strong OFF (0V) are used. However, this case shows that there is error time (delta t-error). This error is time delay error associated from going from Vmid to Strong OFF vs turning the HS from OFF to ON. Any error time will cause a build-up of charge in the low-side body diode, as depicted in $Q_{rr}$ (LS). This $Q_{rr}$ buildup translates into a larger current spike seen on Idrain (LS) and Isource (LS). Due to inherent parasitics in the power lines the switch voltage translates this larger current spike into a large voltage spike on the switch pin, as depicted on $V_{sw}$ waveform, which is noted as Vdelta and in this case is 15V. In this example, the breakdown voltage of the low-side has been met. In order to avoid this, it would require a low-side switch to have a breakdown voltage in excess of 27V. A larger breakdown voltage low side will translate to inefficiencies in conduction loss or die area penalty.

FIG. 26 depicts signal diagrams of a buck switching regulator in accordance with the present invention using an active feedback circuit. FIG. 26 shows that during phase 2 for Vgate (LS), Vmid voltage and Strong OFF (0V) are used. However, a feedback mechanism is used (Vfeedback). It is observing the voltage of the switch pin. This is shown in the waveform where both the switch pin and the feedback pin are super-imposed. ($V_{sw}$/Vfeeback). This feedback causes the gate voltage is transitioned to Strong OFF, which provides accurate timing turn-off of the low-side when the high-side is turning on. As result of this it can be observed that no appreciable charge build is observed on the low-side body diode, $Q_{rr}$ (LS). In addition, the current transients of the drain and source currents are significantly reduced. This finally translates into the voltage transients observed on the switch pin to show a delta voltage increase of only 2V. In the example the low side device requires a much lower breakdown voltage and allows for use of a more efficient device which can have much lower conduction losses as well as overall higher power efficiency when compared to prior art schemes.

The approach taught herein can also be used in any combination of configurations, such as high-side drive, low-side drive, high- and low-side, or one or more FETs in any combination.

The approach taught herein can also be used in any combination of current or voltage switching or current and voltage switching, such as power regulation, one or more switches for line termination, DC motor drivers, induction motor drivers, transducer drivers, solid-state fuse switches, battery management, AC-to-DC power conversion, DC-to-AC power conversion, or power correction.

Any combination of bias voltage and threshold voltage can be set either positive or negative in value that meets the requirements of off-state in the forward direction and on-state in the negative direction.

Any combination of transitions from on voltage to bias voltage that meets the requirements of on- to off-state in the forward direction and on-state in the negative direction is included in the present invention. The transitions can also be either step functions, linear graded, or non-linear graded transitions.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of." As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step, or a limitation) or group of integers (e.g., feature(s), element(s), characteristic(s), property(ies), method/process(s) steps, or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about," "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

As used herein, the term "connected" refers to devices or components that are directly or indirectly connected or coupled together. One or more other devices or components can be disposed between the connected devices or components.

All of the devices and/or methods disclosed and claimed herein can be made and executed without undue experimentation in light of the present disclosure. While the devices and/or methods of this invention have been described in terms of particular embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope, and concept of the invention as defined by the appended claims.

Furthermore, no limitations are intended to the details of construction or design herein shown, other than as described in the claims below. It is therefore evident that the particular embodiments disclosed above may be altered or modified and all such variations are considered within the scope and spirit of the disclosure. Accordingly, the protection sought herein is as set forth in the claims below.

Modifications, additions, or omissions may be made to the systems and apparatuses described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order.

To aid the Patent Office, and any readers of any patent issued on this application in interpreting the claims appended hereto, applicants wish to note that they do not intend any of the appended claims to invoke 35 U.S.C. § 112(f) as it exists on the date of filing hereof unless the words "means for" or "step for" are explicitly used in the particular claim.

What is claimed is:

1. A method for controlling a synchronous rectifier comprising:
    turning the synchronous rectifier OFF by driving a gate of the synchronous rectifier to one or more first voltages that are non-zero;
    monitoring one or more values of a drain or a source of the synchronous rectifier;
    driving the gate of the synchronous rectifier to a second voltage that is less than the one or more first voltages whenever the one or more values of the drain or the source of the synchronous rectifier pass above or below a threshold value comprising zero; and
    adjusting the threshold value or a delay in driving the gate of the synchronous rectifier to the second voltage using a predictive feedback process.

2. The method of claim 1, wherein:
    a switching circuit comprises the synchronous rectifier connected to a switching transistor; and
    reducing or eliminating current or voltage transients in the switching circuit.

3. The method of claim 1, wherein:
    the one or more first voltages are less than a threshold voltage of the synchronous rectifier; or
    the one or more first voltages comprise a set of descending stair-step values, or a set of descending values forming a ramp or a curve; or
    the one or more values comprise a voltage, a change in the voltage, a current, a change in the current, or a combination of the voltage, the change in the voltage, the current or the change in the current of the drain or the source of the synchronous rectifier.

4. The method of claim 1, wherein the predictive feedback process:
    samples and stores the one or more values of the gate, the drain or the source of the synchronous rectifier; and
    uses the stored values of the gate, the drain or the source of the synchronous rectifier to adjust the threshold value.

5. The method of claim 1, wherein the predictive feedback process: samples and stores the one or more values of the gate, the drain or the source of the synchronous rectifier and a switching transistor connected to the synchronous rectifier; and uses the stored values of the gate, the drain or the source of the synchronous rectifier and the switching transistor to adjust the threshold value.

6. The method of claim 1, wherein the second voltage is less than or equal to zero volts.

7. The method of claim 1, wherein the synchronous rectifier is controlled using a synchronous rectifier driver circuit comprising:
    a first transistor having a drain connected to the gate of the synchronous rectifier;
    a second transistor having a drain connected to the gate of the synchronous rectifier;
    a one-way current switch connected between a source of the second transistor and a reference ground;
    a third transistor having a drain connected to the gate of the synchronous rectifier and a source connected to the reference ground;
    a fourth transistor having a drain connected to the drain or the source of the synchronous rectifier and a source connected to a gate of the third transistor;
    a fifth transistor having a drain connected to the gate of the third transistor and a source connected to the reference ground; and a control circuit connected to a gate of the first transistor, a gate of the second transistor, a gate of the fourth transistor and a gate of the fifth transistor.

8. The method of claim 7, wherein the synchronous rectifier driver circuit drives the gate of the synchronous rectifier to the one or more first voltages by:
turning the first transistor from ON to OFF;
turning the second transistor from OFF to ON;
turning the fourth transistor from OFF to ON; and
turning the fifth transistor from ON to OFF.

9. The method of claim 7, wherein the synchronous rectifier driver circuit drives the gate of the synchronous rectifier to the second voltage by turning the third transistor from OFF to ON.

10. The method of claim 1, wherein the synchronous rectifier is controlled using a synchronous rectifier driver circuit comprising:
a first transistor having a drain connected to the gate of the synchronous rectifier;
a second transistor having a drain connected to the gate of the synchronous rectifier and a body connected to a reference ground;
a third transistor having a drain connected to a source of the second transistor, and a body and a drain connected to the reference ground;
a fourth transistor having a drain connected to the gate of the synchronous rectifier, a gate connected to a source of the second transistor and a source connected to the reference ground;
a fifth transistor having a drain connected to the gate of the synchronous rectifier and a source connected to the reference ground;
a sixth transistor having a body diode, a drain connected to the drain or the source of the synchronous rectifier and a source connected to the gate of the fifth transistor;
a seventh transistor having a drain connected to the gate of the fifth transistor and a source connected to the reference ground;
an inverter having an output connected to the gates of the first transistor, the second transistor and the sixth transistor; and
a control signal connected to an input of the inverter and the gates of the third transistor and seventh transistor.

11. The method of claim 1, wherein the synchronous rectifier is controlled using a synchronous rectifier driver circuit comprising:
a first transistor having a drain connected to the gate of the synchronous rectifier;
a second transistor having a drain connected to the gate of the synchronous rectifier;
a one-way current switch connecting a source of the second transistor to a reference ground;
a third transistor having a drain connected to the gate of the synchronous rectifier and a source connected to the reference ground;
a fourth transistor having a body diode and a drain connected to the drain or the source of the synchronous rectifier;
an amplifier having a positive terminal connected to the source of the fourth transistor, a negative terminal connected to a voltage, and an output connected to the gate of the third transistor;
a fifth transistor having a drain connected to the gate of the third transistor and a source connected to the reference ground;
an inverter having an output connected to the gates of the first transistor, the second transistor, an enable terminal of the amplifier and the fourth transistor; and
a control signal connected to an input of the inverter and the gate of the fifth transistor.

12. The method of claim 1, wherein the synchronous rectifier is controlled using a synchronous rectifier driver circuit comprising:
a first transistor having a drain connected to the gate of the synchronous rectifier;
a second transistor having a drain connected to the gate of the synchronous rectifier;
a first one-way current switch connected to a source of the second transistor;
a fourth transistor having a drain connected to the gate of the synchronous rectifier, a gate connected to the first one-way current switch and a source connected to a reference ground;
a second one-way current switch connected between a voltage and the gate of the fourth transistor;
a fifth transistor having a drain connected to the gate of the fourth transistor and a source connected to the reference ground;
a sixth transistor having a drain connected to the gate of the synchronous rectifier and a source connected to the reference ground;
a seventh transistor having a body diode and a drain connected to the drain or the source of the synchronous rectifier;
an inverter having an output connected to the gates of the first transistor, the second transistor and the seventh transistor; and
a control signal connected to an input of the inverter and the gate of the fifth transistor, the gate of the sixth transistor and the source of the seventh transistor.

13. The method of claim 1, wherein the synchronous rectifier is controlled using a synchronous rectifier driver circuit comprising:
a first transistor having a drain connected to the gate of the synchronous rectifier;
a second transistor having a drain connected to the gate of the synchronous rectifier;
a one-way current switch connecting a source of the second transistor to a reference ground;
a third transistor having a drain connected to the gate of the synchronous rectifier and a source connected to the reference ground;
a fourth transistor having a body diode and a drain connected to the drain or the source of the synchronous rectifier;
a fifth transistor having a drain connected to the gate of the third transistor and a source connected to the reference ground;
a sixth transistor having a drain connected to the source of the first transistor, a gate connected to the source of the fourth transistor and a source connected to a gate of the third transistor;
an inverter having an output connected to the gates of the first transistor, the second transistor, and the fourth transistor; and
a control signal connected to an input of the inverter and the gate of the fifth transistor.

14. The method of claim 1, wherein the synchronous rectifier is controlled using a synchronous rectifier driver circuit comprising:
a first transistor having a drain connected to the gate of the synchronous rectifier;

a second transistor having a drain connected to the gate of the synchronous rectifier;
a one-way current switch connecting a source of the second transistor to a reference ground;
a third transistor having a body diode, a drain connected to the gate of the synchronous rectifier and a source connected to the reference ground;
a fourth transistor having a drain connected to the drain or the source of the synchronous rectifier and a source connected to the gate of the third transistor;
a fifth transistor having a drain connected to the gate of the third transistor and a source connected to the reference ground;
an inverter having an output connected to the gates of the first transistor, the second transistor, an enable terminal of the amplifier and the fourth transistor; and
a control signal connected to an input of the inverter and the gate of the fifth transistor.

15. A circuit comprising:
a synchronous rectifier driver circuit configured to:
turn a synchronous rectifier OFF by driving a gate of the synchronous rectifier to one or more first voltages that are non-zero,
monitor one or more values of a drain or a source of the synchronous rectifier, and
drive the gate of the synchronous rectifier to a second voltage that is less than the one or more first voltages whenever the one or more values of the drain or the source of the synchronous rectifier pass above or below a threshold value comprising zero; and
adjust the threshold value or a delay in driving the gate of the synchronous rectifier to the second voltage using a predictive feedback process.

16. The circuit of claim 15, wherein:
the one or more first voltages are less than a threshold voltage of the synchronous rectifier; or
the one or more first voltages comprise a set of descending stair-step values, or a set of descending values forming a ramp or a curve; or
the one or more values comprise a voltage, a change in the voltage, a current, a change in the current, or a combination of the voltage, the change in the voltage, the current or the change in the current of the drain or the source of the synchronous rectifier.

17. The circuit of claim 15, wherein the predictive feedback process is configured to:
sample and store the one or more values of the gate, the drain or the source of the synchronous rectifier; and
use the stored values of the gate, the drain or the source of the synchronous rectifier to adjust the delay in driving the gate of the synchronous rectifier to the second voltage.

18. The circuit of claim 15, wherein the predictive feedback process is configured to: sample and store the one or more values of the gate, the drain or the source of the synchronous rectifier and a switching transistor connected to the synchronous rectifier; and use the stored values of the gate, the drain or the source of the synchronous rectifier and the switching transistor to adjust the delay in driving the gate of the synchronous rectifier to the second voltage.

19. The circuit of claim 15, wherein the second voltage is equal to or less than zero volts.

20. The circuit of claim 15, wherein the synchronous rectifier driver circuit comprises:
a driver circuit connected to the gate of the synchronous rectifier;
a parallel clamping circuit connected to the gate of the synchronous rectifier;
a monitoring circuit connected to the drain or the source of the synchronous rectifier and the parallel clamping circuit; and
a control circuit connected to the driver circuit and the monitoring circuit.

21. The circuit of claim 15, wherein the synchronous rectifier driver circuit comprises:
a first transistor having a drain connected to the gate of the synchronous rectifier;
a second transistor having a drain connected to the gate of the synchronous rectifier;
a one-way current switch connected between a source of the second transistor and a reference ground;
a third transistor having a drain connected to the gate of the synchronous rectifier and a source connected to the reference ground;
a fourth transistor having a drain connected to the drain or the source of the synchronous rectifier and a source connected to a gate of the third transistor;
a fifth transistor having a drain connected to the gate of the third transistor and a source connected to the reference ground; and
a control circuit connected to a gate of the first transistor, a gate of the second transistor, a gate of the fourth transistor and a gate of the fifth transistor.

22. The circuit of claim 15, wherein the synchronous rectifier driver circuit comprises:
a first transistor having a drain connected to the gate of the synchronous rectifier;
a second transistor having a drain connected to the gate of the synchronous rectifier and a body connected to a reference ground;
a third transistor having a drain connected to a source of the second transistor, and a body and a drain connected to the reference ground;
a fourth transistor having a drain connected to the gate of the synchronous rectifier, a gate connected to a source of the second transistor and a source connected to the reference ground;
a fifth transistor having a drain connected to the gate of the synchronous rectifier and a source connected to the reference ground;
a sixth transistor having a drain connected to the drain or the source of the synchronous rectifier and a source connected to the gate of the fifth transistor;
a one-way current switch connected from a source to the drain of the sixth transistor;
a seventh transistor having a drain connected to the gate of the fifth transistor and a source connected to the reference ground;
an inverter having an output connected to the gates of the first transistor, the second transistor and the sixth transistor; and
a control signal connected to an input of the inverter and the gates of the third transistor and seventh transistor.

23. The circuit of claim 15, wherein the synchronous rectifier driver circuit comprises:
a first transistor having a drain connected to the gate of the synchronous rectifier;
a second transistor having a drain connected to the gate of the synchronous rectifier;
a first one-way current switch connecting a source of the second transistor to a reference ground;

a third transistor having a drain connected to the gate of the synchronous rectifier and a source connected to the reference ground;

a fourth transistor having a drain connected to the drain or the source of the synchronous rectifier;

a second one-way current switch connected from a source to the drain of the fourth transistor;

an amplifier having a positive terminal connected to the source of the fourth transistor, a negative terminal connected to a voltage, and an output connected to the gate of the third transistor;

a fifth transistor having a drain connected to the gate of the third transistor and a source connected to the reference ground;

an inverter having an output connected to the gates of the first transistor, the second transistor, an enable terminal of the amplifier and the fourth transistor; and a control signal connected to an input of the inverter and the gate of the fifth transistor.

24. The circuit of claim 15, wherein the synchronous rectifier driver circuit comprises:

a first transistor having a drain connected to the gate of the synchronous rectifier;

a second transistor having a drain connected to the gate of the synchronous rectifier;

a first one-way current switch connected to a source of the second transistor;

a fourth transistor having a drain connected to the gate of the synchronous rectifier, a gate connected to the first one-way current switch and a source connected to a reference ground;

a second one-way current switch connected between a voltage and the gate of the fourth transistor;

a fifth transistor having a drain connected to the gate of the fourth transistor and a source connected to the reference ground;

a sixth transistor having a drain connected to the gate of the synchronous rectifier and a source connected to the reference ground;

a seventh transistor having a drain connected to the drain or the source of the synchronous rectifier;

a third one-way current switch connected from a source to the drain of the seventh transistor;

an inverter having an output connected to the gates of the first transistor, the second transistor and the seventh transistor; and a control signal connected to an input of the inverter and the gate of the fifth transistor, the gate of the sixth transistor and the source of the seventh transistor.

25. The circuit of claim 15, wherein the synchronous rectifier driver circuit comprises:

a first transistor having a drain connected to the gate of the synchronous rectifier;

a second transistor having a drain connected to the gate of the synchronous rectifier;

a first one-way current switch connecting a source of the second transistor to a reference ground;

a third transistor having a drain connected to the gate of the synchronous rectifier and a source connected to the reference ground;

a fourth transistor having a drain connected to the drain or the source of the synchronous rectifier;

a second one-way current switch connected from a source to the drain of the fourth transistor;

a fifth transistor having a drain connected to the gate of the third transistor and a source connected to the reference ground;

a sixth transistor having a drain connected to the source of the first transistor, a gate connected to the source of the fourth transistor and a source connected to a gate of the third transistor;

an inverter having an output connected to the gates of the first transistor, the second transistor, and the fourth transistor; and a control signal connected to an input of the inverter and the gate of the fifth transistor.

26. The circuit of claim 15, wherein the synchronous rectifier is controlled using a synchronous rectifier driver circuit comprising:

a first transistor having a drain connected to the gate of the synchronous rectifier;

a second transistor having a drain connected to the gate of the synchronous rectifier;

a one-way current switch connecting a source of the second transistor to a reference ground;

a third transistor having a body diode, a drain connected to the gate of the synchronous rectifier and a source connected to the reference ground;

a fourth transistor having a drain connected to the drain or the source of the synchronous rectifier and a source connected to the gate of the third transistor;

a fifth transistor having a drain connected to the gate of the third transistor and a source connected to the reference ground;

an inverter having an output connected to the gates of the first transistor, the second transistor, an enable terminal of the amplifier and the fourth transistor; and a control signal connected to an input of the inverter and the gate of the fifth transistor.

27. The circuit of claim 15, wherein the synchronous rectifier driver circuit is formed in or on silicon, silicon carbide, gallium nitride, gallium oxide, or gallium arsenide.

28. A power converter comprising:

a switching transistor;

a switching transistor driver circuit connected to a gate of the switching transistor;

a synchronous rectifier connected the switching transistor; and a synchronous rectifier driver circuit connected to a gate of the synchronous rectifier and a drain or a source of the synchronous rectifier, wherein the synchronous rectifier driver circuit is configured to:

turn a synchronous rectifier OFF by driving a gate of the synchronous rectifier to one or more first voltages that are non-zero, monitor one or more values of a drain or a source of the synchronous rectifier, and drive the gate of the synchronous rectifier to a second voltage that is less than the one or more first voltages whenever the one or more values of the drain or the source of the synchronous rectifier pass above or below a threshold value comprising zero, and adjust the threshold value or a delay in driving the gate of the synchronous rectifier to the second voltage using a predictive feedback process.

* * * * *